US008970820B2

(12) United States Patent
Shibazaki

(10) Patent No.: US 8,970,820 B2
(45) Date of Patent: Mar. 3, 2015

(54) OBJECT EXCHANGE METHOD, EXPOSURE METHOD, CARRIER SYSTEM, EXPOSURE APPARATUS, AND DEVICE MANUFACTURING METHOD

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 472 days.

(21) Appl. No.: 12/782,222

(22) Filed: May 18, 2010

(65) Prior Publication Data

US 2010/0297562 A1 Nov. 25, 2010

Related U.S. Application Data

(60) Provisional application No. 61/179,914, filed on May 20, 2009, provisional application No. 61/213,329, filed on May 29, 2009, provisional application No. 61/213,330, filed on May 29, 2009.

(30) Foreign Application Priority Data

May 20, 2009 (JP) ................................. 2009-122387
May 20, 2009 (JP) ................................. 2009-122407

(51) Int. Cl.
*G03F 7/20* (2006.01)
*H01L 21/67* (2006.01)
(Continued)

(52) U.S. Cl.
CPC ........ *G03F 7/70775* (2013.01); *G03F 7/70691* (2013.01); *G03F 7/707* (2013.01);
(Continued)

(58) Field of Classification Search
CPC . G03F 7/70691; G03F 7/707; G03F 7/70733; G03F 7/7075; G03F 7/70775; H01L 21/6838

USPC ........ 355/53, 72, 75, 77; 414/749.1, 935, 941
See application file for complete search history.

(56) References Cited

U.S. PATENT DOCUMENTS 4,780,617 A 10/1988 Umatate et al.
5,080,549 A * 1/1992 Goodwin et al. .......... 414/744.8
(Continued)

FOREIGN PATENT DOCUMENTS

EP 1 655 765 A1 5/2006
JP A-07-257751 10/1995
(Continued)

OTHER PUBLICATIONS

International Search Report issued in Application No. PCT/JP2010/058946 dated Jul. 7, 2011.
(Continued)

*Primary Examiner* — Steven H Whitesell Gordon
(74) *Attorney, Agent, or Firm* — Oliff PLC

(57) ABSTRACT

A carrier apparatus positions a chuck member above a wafer mounted on a fine movement stage, relatively moves the chuck member and the fine movement stage in a vertical direction, makes the chuck member approach a position which is a predetermined distance away from the upper surface of the wafer, makes the chuck member hold the wafer from above in a non-contact manner, and makes the chuck member holding the wafer and the fine movement stage move apart within a predetermined plane after making the chuck member holding the wafer and the fine movement stage move apart in the vertical direction. Further, the carrier apparatus loads the wafer held in a non-contact manner from above by the chuck member on the fine movement stage.

27 Claims, 71 Drawing Sheets

(51) Int. Cl.
*H01L 21/677* (2006.01)
*H01L 21/683* (2006.01)

(52) U.S. Cl.
CPC ...... *G03F 7/70733* (2013.01); *H01L 21/67225* (2013.01); *H01L 21/67748* (2013.01); *H01L 21/6838* (2013.01)
USPC .................................. 355/72; 355/53; 355/77

(56) References Cited

U.S. PATENT DOCUMENTS

| | | | |
|---|---|---|---|
| 5,196,745 A | 3/1993 | Trumper | |
| 5,448,332 A | 9/1995 | Sakakibara et al. | |
| 5,610,715 A | 3/1997 | Yoshii et al. | |
| 5,646,413 A | 7/1997 | Nishi | |
| 5,789,843 A | 8/1998 | Higuchi et al. | |
| 5,969,441 A | 10/1999 | Loopstra et al. | |
| 6,160,338 A * | 12/2000 | Ono | 310/309 |
| 6,208,407 B1 | 3/2001 | Loopstra | |
| RE37,391 E | 9/2001 | Nishi | |
| 6,379,103 B1 | 4/2002 | Okugi | |
| 6,509,957 B1 | 1/2003 | Tanaka | |
| 6,577,382 B2 * | 6/2003 | Kida et al. | 355/77 |
| 6,590,634 B1 | 7/2003 | Nishi et al. | |
| 6,611,316 B2 | 8/2003 | Sewell | |
| 6,624,433 B2 | 9/2003 | Okumura et al. | |
| 6,748,293 B1 | 6/2004 | Larsen | |
| 6,778,257 B2 | 8/2004 | Bleeker et al. | |
| 7,023,610 B2 | 4/2006 | Ohtsuki et al. | |
| 7,238,931 B2 | 7/2007 | Nabeshima et al. | |
| 7,561,280 B2 | 7/2009 | Schluchter et al. | |
| 2002/0041377 A1 | 4/2002 | Hagiwara et al. | |
| 2003/0025890 A1 | 2/2003 | Nishinaga | |
| 2006/0114445 A1 | 6/2006 | Ebihara | |
| 2006/0187431 A1 | 8/2006 | Shibazaki | |
| 2007/0127006 A1 | 6/2007 | Shibazaki | |
| 2007/0263191 A1 | 11/2007 | Shibazaki | |
| 2007/0288121 A1 | 12/2007 | Shibazaki | |
| 2008/0013089 A1 * | 1/2008 | Ishii et al. | 356/400 |
| 2008/0043212 A1 | 2/2008 | Shibazaki | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094594 A1 * | 4/2008 | Shibazaki | 355/53 |
| 2008/0094604 A1 | 4/2008 | Shibazaki | |
| 2008/0106722 A1 | 5/2008 | Shibazaki | |
| 2008/0212047 A1 | 9/2008 | Sugimoto | |
| 2008/0218713 A1 | 9/2008 | Shibazaki | |
| 2009/0033906 A1 | 2/2009 | Kumazaki | |
| 2009/0233234 A1 | 9/2009 | Shibazaki | |
| 2009/0251679 A1 | 10/2009 | Shibazaki | |
| 2009/0284724 A1 | 11/2009 | Kanaya | |
| 2010/0045961 A1 | 2/2010 | Li et al. | |
| 2010/0073661 A1 | 3/2010 | Shibazaki | |
| 2010/0157275 A1 | 6/2010 | Shibazaki | |
| 2010/0177295 A1 | 7/2010 | Shibazaki | |
| 2010/0321666 A1 | 12/2010 | Shibazaki | |

FOREIGN PATENT DOCUMENTS

| | | |
|---|---|---|
| JP | A-2000-025948 | 1/2000 |
| JP | A-2008-004581 | 1/2008 |
| JP | A-2008-166811 | 7/2008 |
| JP | A-2009-088304 | 4/2009 |
| WO | WO 01/35168 A1 | 5/2001 |
| WO | WO 2004/090577 A2 | 10/2004 |
| WO | WO 2006/038952 A2 | 4/2006 |
| WO | WO 2008/037131 A1 | 4/2008 |
| WO | WO 2008/038752 A1 | 4/2008 |
| WO | WO 2008/056735 A1 | 5/2008 |
| WO | WO 2010/071239 A1 | 6/2010 |

OTHER PUBLICATIONS

Written Opinion of the International Searching Authority issued in Application No. PCT/JP2010/058946 dated Jul. 7, 2011.
Dec. 13, 2013 Office Action issued in Japanese Patent Application No. 2010-115948 (with translation).
Aug. 7, 2014 Office Action issued in Japanese Patent Application No. 2010-115948 (with English translation).

* cited by examiner

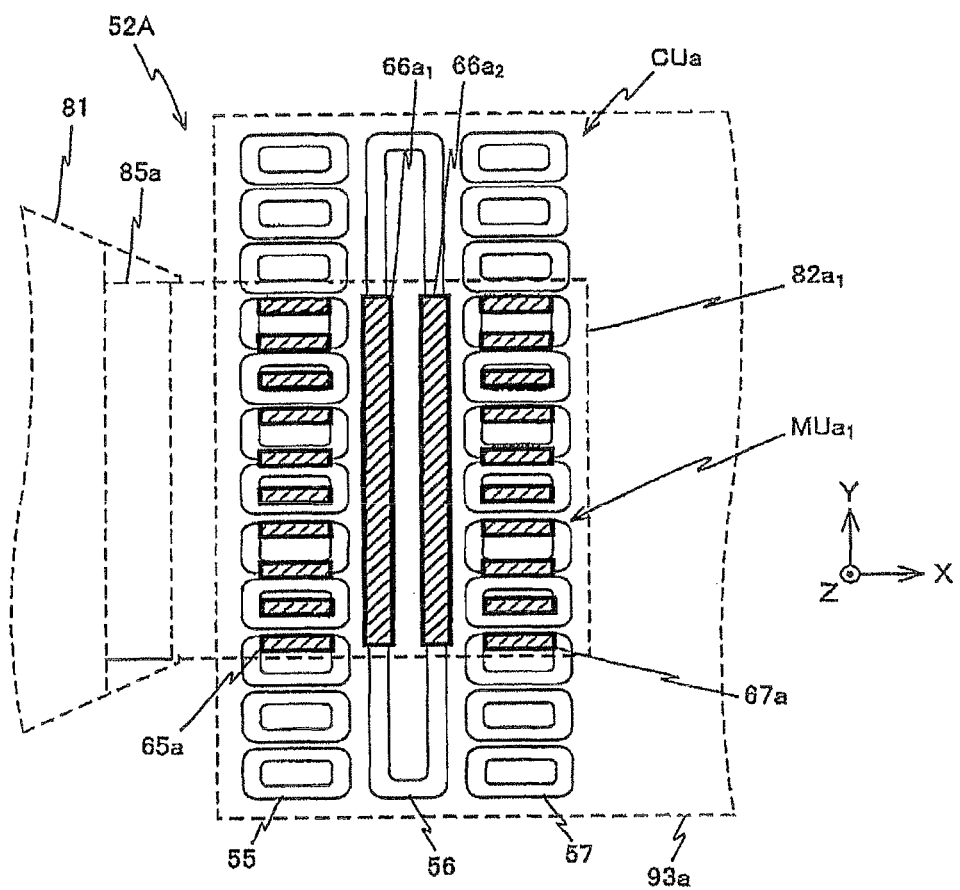

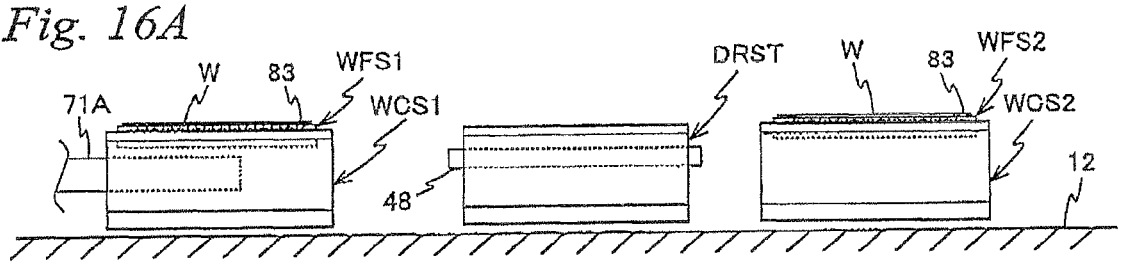
Fig. 16A
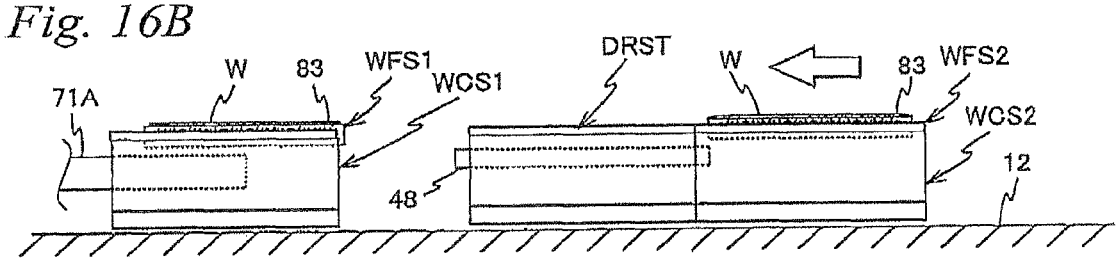
Fig. 16B
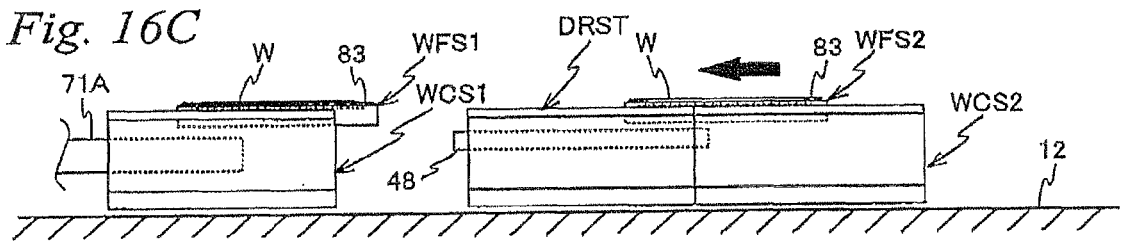
Fig. 16C
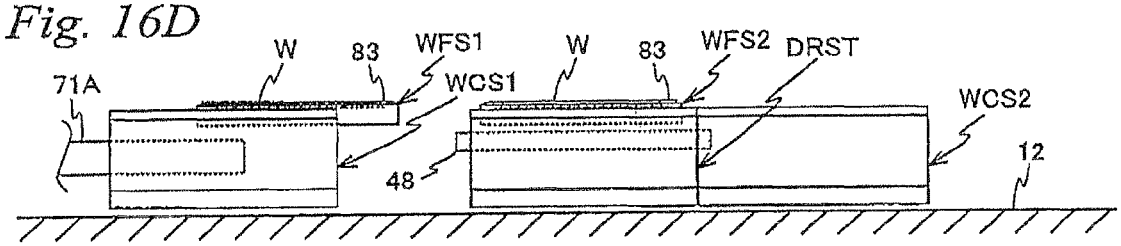
Fig. 16D
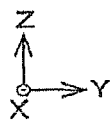

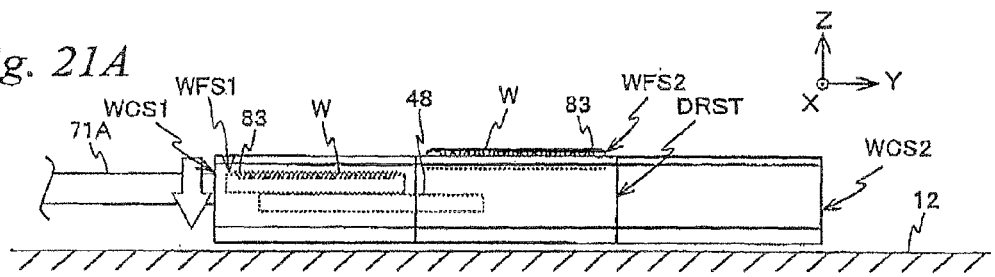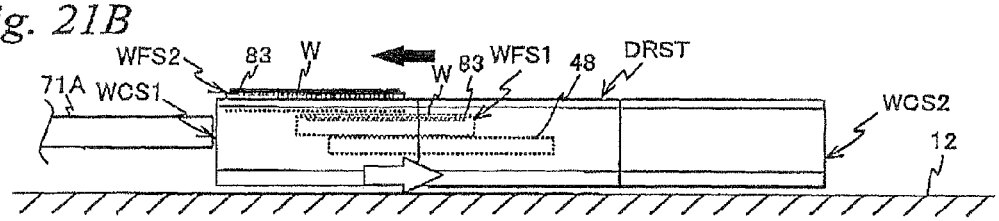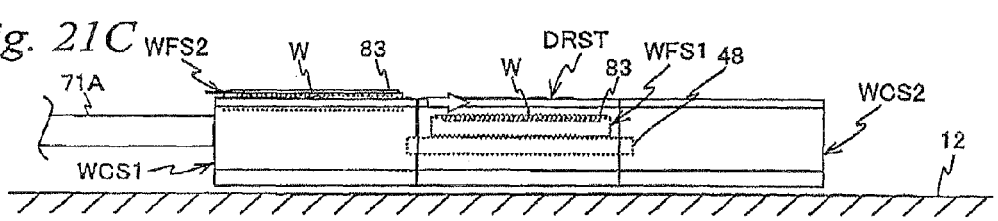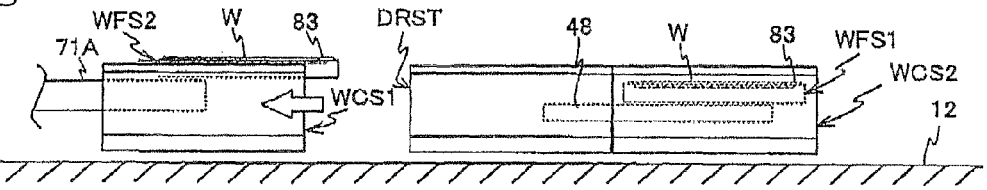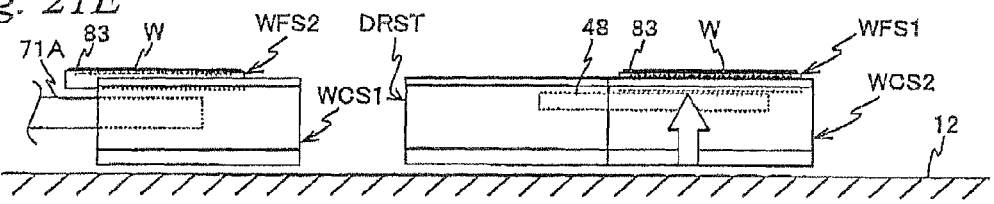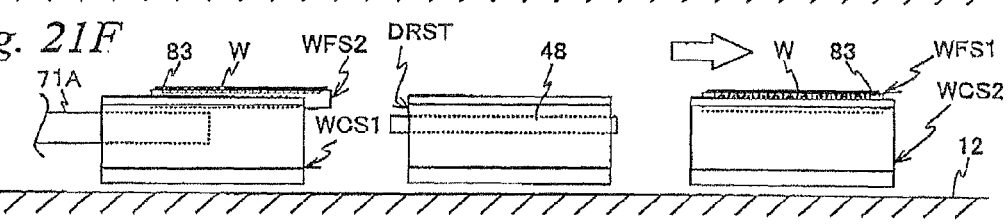

OBJECT EXCHANGE METHOD, EXPOSURE METHOD, CARRIER SYSTEM, EXPOSURE APPARATUS, AND DEVICE MANUFACTURING METHOD

CROSS-REFERENCE TO RELATED APPLICATIONS

This non-provisional application claims the benefit of Provisional Application No. 61/179,914 filed May 20, 2009, Provisional Application No. 61/213,329 filed May 29, 2009, and Provisional Application No. 61/213,330 filed May 29, 2009, the disclosures of which are hereby incorporated herein by reference in its entirety.

BACKGROUND OF THE INVENTION

1. Field of the Invention

The present invention relates to object exchange methods, exposure methods, carrier systems, exposure apparatuses, and device manufacturing methods, and more particularly, to an exchange method in which a thin plate-shaped object is exchanged on a holding member, an exposure method using the exchange method, a carrier system which carries a thin plate-shaped object, an exposure apparatus which is equipped with the carrier system, and a device manufacturing method which uses the exposure method or the exposure apparatus.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

Substrates such as a wafer, a glass plate or the like subject to exposure which are used in these types of exposure apparatuses are gradually (for example, in the case of a wafer, in every ten years) becoming larger. Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more the number of chips from the current 300 mm wafer, which contributes to reducing the cost. In addition, it is expected that through efficient use of energy, water, and other resources, cost of all resource use will be reduced.

However, because the thickness of the wafer does not increase in proportion to the size of the wafer, intensity of the 450 mm wafer is much weaker when compared to the 300 mm wafer. Accordingly, even when addressing an issue such as wafer carriage, is expected that putting it into practice would be difficult in the same ways and means as in the current 300 mm wafer.

Further, when the size of the wafer becomes as large as 450 mm, while the number of dies (chips) output from a single wafer increases, the probability becomes high of throughput deceasing due to an increase in the time required to perform an exposure process on a single wafer. Therefore, as a method of suppressing the decrease in throughput as much as possible, employing a twin stage method (for example, refer to U.S. Pat. No. 6,590,634, U.S. Pat. No. 5,969,441, or U.S. Pat. No. 6,208,407 and the like) can be considered where an exposure process on a wafer is performed on one wafer stage, and processing such as wafer exchange, alignment or the like is performed concurrently on another wafer stage. However, in the conventional exposure apparatus of the twin stage method, because the relation between the exposure position, alignment position, and wafer exchange position was not considered in particular, in the case when a 450 mm wafer was subject to processing, time was required until wafer exchange begins after exposure has been completed, which caused the risk of not being able to sufficiently improve the throughput.

Accordingly, appearance of a new system that can deal with the 450 mm wafer is expected.

SUMMARY OF THE INVENTION

According to a first aspect of the present invention, there is provided an object exchange method in which a thin plate-shaped object is exchanged on a holding member, the method comprising: positioning an unload member above the object which is mounted on the holding member; relatively moving the unload member and the holding member in a vertical direction, and making the unload member approach a position which is a predetermined distance away from an upper surface of the object; and making the unload member hold the object from above in a non-contact manner, and making the unload member holding the object and the holding member move apart.

According to this method, it becomes possible to hold an object from above in a non-contact manner by a unload member, and to unload the object from the holding member. Therefore, it is not necessary to form a notch in the holding member to house an arm and the like used for unloading to unload the object from the holding member, and is also not necessary to provide a vertical movement member used in the delivery of the object in the holding member.

According to a second aspect of the present invention, there is provided a first exposure method, comprising; exchanging a thin plate-shaped object on the holding member by the object exchange method of the present invention; and exposing the object held by the holding member with an energy beam after the object has been exchanged, and forming a pattern on the object.

According to a third aspect of the present invention, there is provided a second exposure method in which an object is exposed with an energy beam, and a pattern is formed on the object, the method comprising: positioning an unload member above the object which is mounted on the holding member; relatively moving the unload member and the holding member in a vertical direction, and making the unload member approach a position which is a predetermined distance away from an upper surface of the object; and making the unload member hold the object from above in a non-contact manner, and making the unload member holding the object and the holding member move apart.

According to the first and second exposure methods, it becomes possible to hold the object in a uniform manner across the entire surface by the holding member. Therefore, by exposing the object with an energy beam in a state where the degree of flatness of the object is maintained favorably across the entire surface, it becomes possible to form a pattern with good precision across the entire surface of the object.

According to a fourth aspect of the present invention, there is provided a third exposure method in which an object is exposed with an energy beam, the method comprising: supporting each of a plurality of holding members that hold the object relatively movable, by a first movable body which is movable within a first range in a two-dimensional plane including a first axis and a second axis that are orthogonal to each other that includes a first area where an exposure processing of irradiating the energy beam on an object is performed, and a second movable body which is movable within a second range placed at a position a predetermined distance away from the first area on one side of a direction parallel to the first axis and where a measurement processing is performed with respect to an object; and performing an exchange of the object when the holding member is at a place other than on the first and second movable bodies.

According to this method, exchange of the object is performed when the holding member holding the object is at a place other than on the first and second movable bodies. In other words, the exchange of the object is performed, regardless of the operation of the first and second movable bodies. Therefore, it becomes possible to concurrently perform exposure of an object held by a holding member while exchange of an object held by another holding member is being performed in the first area, or also to concurrently perform measurement with respect to an object held by a holding member while exchange of an object held by another holding member is being performed in the second area. In this case, when there are three holding members, for example, in parallel with exposure of an object held by a first holding member in the first area and measurement with respect to an object held by a second holding member in the second area, exchange of an object held by a third holding member can also be performed.

According to a fifth aspect of the present invention, there is provided a device manufacturing method, including exposing an object by the exposure method according to one of the first to third exposure methods of the present invention; and developing the object which has been exposed.

According to a sixth aspect of the present invention, there is provided a carrier system which carries a thin plate-shaped object, the system comprising: a carrier apparatus which has a holding section that can hold an object from above in a non-contact manner, and relatively drives the holding member holding the object and the holding section within a predetermined plane parallel to a horizontal plane, positions the holding section above the object mounted on the holding member, relatively moves the holding section and the holding member in a vertical direction, makes the holding section approach a position which is a predetermined distance away from an upper surface of the object, makes the holding section hold the object on the holding member from above in a non-contact manner, and makes the holding section and the holding member move apart within a predetermined plane after making the holding section holding the object and the holding member move apart in a vertical direction.

According to this system, the carrier apparatus relatively drives the holding member which holds the object and the holding section within a predetermined plane parallel to the horizontal plane, positions the holding section at a position above the object mounted on the holding member, makes the holding section approach a position by a predetermined distance from the upper surface of the object, makes the holding section hold the object on the holding member in a non-contact manner, and then moves apart the holding section holding the object and the holding member after moving apart the holding section holding the object and the holding member in the vertical direction. Therefore, it is not necessary to form a notch in the holding member to house an arm and the like used for unloading to unload the object from the holding member, and is also not necessary to provide a vertical movement member used in the delivery of the object in the holding number.

According to a seventh aspect of the present invention, there is provided a first exposure apparatus that exposes a thin plate-shaped object with an energy beam and forms a pattern on the object, the apparatus comprising: a carrier system of the present invention; a movable body which holds a holding member in which a measurement plane is provided on a plane substantially parallel to the predetermined plane relatively movable along the predetermined plane, and is movable along the predetermined plane; a first measurement system which irradiates at least one first measurement beam on the measurement plane from below, and receives light of the first measurement beam from the measurement plane and measures positional information at least within the predetermined plane of the holding member; and a drive system which drives the holding member in one of an individual and integral manner with the movable body, based on the positional information measured by the first measurement system.

According to this apparatus, along with holding an object, a measurement plane is provided on a plane substantially parallel to a predetermined plane of the holding member. This holding member is held relatively movable along a predetermined plane by a movable body. And, a first measurement system irradiates at least one first measurement beam on the measurement plane of the holding member, and receives light of the first measurement beam from the measurement plane and measures positional information of the holding member at least within the predetermined plane. In other words, the first measurement system irradiates the first measurement beam on the measurement plane of the holding member, which allows the positional information of the holding member within the predetermined plane to be measured with good precision by the so-called back surface measurement. And, the holding member is driven by the drive system individually or integrally with the movable body, based on the positional information measured by the first measurement system.

According to an eighth aspect of the present invention, there is provided a second exposure apparatus that exposes a thin plate-shaped object with an energy beam and forms a pattern on the object, the apparatus comprising: a carrier system which is equipped with a carrier device which has a holding section that can hold an object from above in a non-contact manner, and relatively drives the holding member holding the object and the holding section within a predetermined plane parallel to a horizontal plane, positions the holding section above the object mounted on the holding member, relatively moves the holding section and the holding member in a vertical direction, makes the holding section approach a position which is a predetermined distance away from an upper surface of the object, makes the holding section hold the object on the holding member from above in a non-contact manner, and makes the holding section and the holding member move apart within a predetermined plane after making the holding section holding the object and the holding member move apart in a vertical direction.

According to this apparatus, it is not necessary to form a notch in the holding member to house an arm and the like used for unloading to unload the object from the holding member, and is also not necessary to provide a vertical movement member used in the delivery of the object in the holding member.

According to a ninth aspect of the present invention, there is provided a third exposure apparatus that exposes an object with an energy beam, the apparatus comprising: an exposure processing section in which exposure processing of irradiating the energy beam onto an object held by a holding member is performed; a measurement processing section which is placed away from the exposure processing section on one side in a direction parallel to a first axis and in which measurement processing with respect to an object held by a holding member is performed; and an object exchange system which performs an exchange of the object when the holding member is at a place other than on a movable body which is placed in each of the exposure processing section and the measurement processing section.

According to this apparatus, exchange of the object by the object exchange system is performed when the holding member holding the object is at a place other than on the first and second movable bodies placed at the exposure processing section and the measurement processing section. In other words, the exchange of the object is performed, regardless of the exposure processing and measurement processing. Therefore, it becomes possible to concurrently perform exposure of an object held by a holding member while exchange of an object held by another holding member is being performed in the exposure processing section, or also to concurrently perform measurement with respect to an object held by a holding member while exchange of an object held by another holding member is being performed in the measurement processing section. In this case, when there are three holding members, for example, in parallel with exposure of an object held by a first holding member in the exposure processing section and measurement with respect to an object held by a second holding member in the measurement processing section, exchange of an object held by a third holding member can also be performed.

In the description, exposure processing section, when exposing an object (a wafer) by irradiating an energy beam, refers to a movement range of a holding member which holds the object and a part of an exposure apparatus in the vicinity of the range, and measurement processing section, refers to a movement range of a holding member which holds an object and a part of an exposure apparatus in the vicinity of the range when a predetermined measurement with respect to the object such as alignment measurement, focus measurement and the like is performed.

According to a tenth aspect of the present invention, there is provided a device manufacturing method, including exposing an object using one of the first to third exposure apparatuses of the present invention; and developing the object which has been exposed.

BRIEF DESCRIPTION OF THE DRAWINGS

In the accompanying drawings;

FIG. 5 is a view used to explain a movable blade which the exposure apparatus in FIG. 1 is equipped with;

FIG. 7 is a planar view showing a placement of a magnet unit and a coil unit that structure a fine movement stage drive system;

FIGS. 16A to 16D are views used to explain a parallel processing performed using fine movement stages WFS1 and WFS2 (No. 1) in the exposure apparatus of the first embodiment;

FIG. 19 is a view used to explain a delivery of a liquid immersion space area (liquid Lq) performed between a fine movement stage and a movable blade (No. 3);

FIGS. 21A to 21F are views used to explain a parallel processing performed using fine movement stages WFS1 and WFS2 (No. 2) in the exposure apparatus of the first embodiment;

DESCRIPTION OF THE EMBODIMENTS

A First Embodiment

A first embodiment of the present invention will be described below, with reference to FIGS. 1 to 22C.

Figure 1:
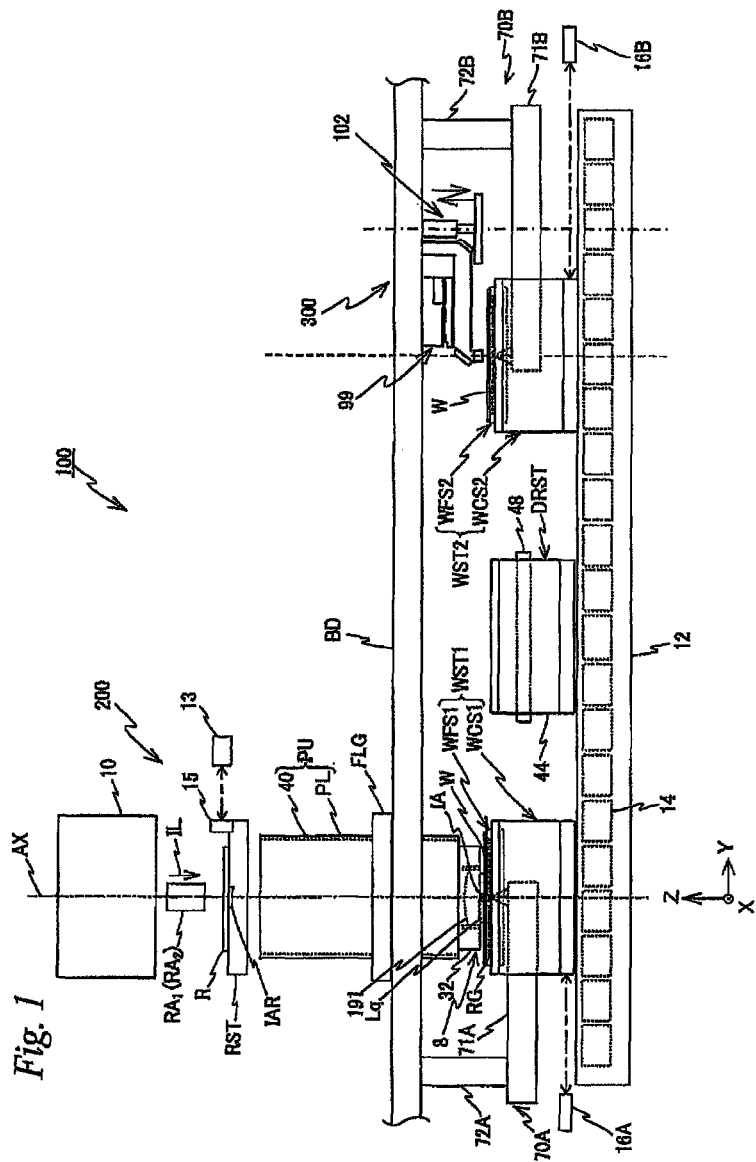
FIG. 1 is a view that schematically shows a configuration of an exposure apparatus of a first embodiment.

FIG. 1 schematically shows a configuration of an exposure apparatus 100 in the first embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of this projection optical system PL will be described as the Z-axis direction, a direction within a plane orthogonal to the Z-axis direction in which a reticle and a wafer are relatively scanned will be described as the Y-axis direction, a direction orthogonal to the Z-axis direction and the Y-axis direction will be described as the X-axis direction, and rotational (inclination) directions around the X-axis, the Y-axis, and the Z-axis will be described as $\theta x$, $\theta y$, and $\theta z$ directions, respectively. The same is true also for a second, a third, and a fourth embodiment and the like, which will be described later on.

As shown in FIG. 1, exposure apparatus 100 is equipped with an exposure station 200 placed close to the end on the −Y side of a base board 12, a measurement station 300 placed close to the end on the +Y side of base board 12, two wafer stages WST1 and WST2, a relay stage DRST, and a control system and the like for these parts. Now, base board 12 is supported on the floor surface almost horizontally (parallel to the XY plane) by a vibration isolation mechanism (omitted in drawings). Base board 12 is made of a tabular member, and the degree of flatness of the upper surface is extremely high and serves as a guide surface when the three stages WST1, WST2, and DRST described above move.

Exposure station 200 comprises an illumination system 10, a reticle stage RST, a projection unit PU, a local liquid immersion device 8 and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area TAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive system 11 (not shown in FIG. 1, refer to FIG. 13) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the $\theta z$ direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 13). Incidentally, the positional information of reticle stage RST can be measured by an encoder system as is disclosed in, for example, U.S. Patent Application Publication 2007/0288121 and the like.

Projection unit PU is placed below reticle stage RST (on the −Z side) in FIG. 1. Projection unit PU is supported via a flange portion FLG provided in the outer periphery of the projection unit, by a main frame (also called a metrology frame) BD supported horizontally by a support member (not shown). Projection unit PU includes a barrel 40, and a projection optical system PL consisting of a plurality of optical elements held by barrel 40. As projection optical system PL, for example, a both-side telecentric dioptric system that has a predetermined projection magnification (such as one-quarter, one-fifth, or one-eighth times) is used. Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on a wafer W whose surface is coated with a resist (a sensitive agent) and is placed on a second surface (image plane surface) side of projection optical system PL, on an area (hereinafter also referred to as an exposure area) IA conjugate with illumination area IAR. And by reticle stage RST and fine movement stage (also referred to as a table) WFS1 (or WFS2) being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W. Now, projection unit PU is held by a main frame BD, and in the embodiment, main frame BD is supported almost horizontally by a plurality of (e.g., three or four) support members which are each placed on an installation surface (floor surface) via a vibration isolation mechanism. Incidentally, the vibration isolation mechanism can be placed between each of the support members and main frame BD. Further, as is disclosed in, for example, PCT International Publication 2006/038952, main frame BD (projection unit PU) can be supported by suspension with respect to a mainframe member (not shown) placed above projection unit PU or with respect to a reticle base.

Local liquid immersion device 8 includes a liquid supply device 5, a liquid recovery device 6 (both of which are not shown in FIG. 1, refer to FIG. 13), a nozzle unit 32 and the like. As shown in FIG. 1, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 13), and supplies a liquid Lq (refer to FIG. 1) between tip lens 191 and wafer W, as well as control liquid recovery device 6 (refer to FIG. 13), and recovers the liquid from between tip lens 191 and wafer W. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as liquid Lq above, pure water that transmits the ArF excimer laser beam (light with a wavelength of 193 nm) is to be used.

Besides this, in exposure station 200, a fine movement stage position measurement system 70A is provided, including a measurement arm 71A supported almost in a cantilevered state (supported in the vicinity of one end) by main frame BD via a support member 72A. However, fine movement stage position measurement system 70A will be described after describing the fine movement stage, which will be described later, for convenience of the explanation.

Measurement station 300 is equipped with an aligner 99 fixed in a suspended state to main frame BD, a chuck unit 102, and a fine movement stage position measurement system 70B including a measurement arm 71B supported in a cantilevered state (supported in the vicinity of one end) by main frazzle BD via a support member 72B. Fine movement stage position measurement system 70B faces an opposite direction but has a configuration similar to fine movement stage position measurement system 70A previously described.

Figure 2:
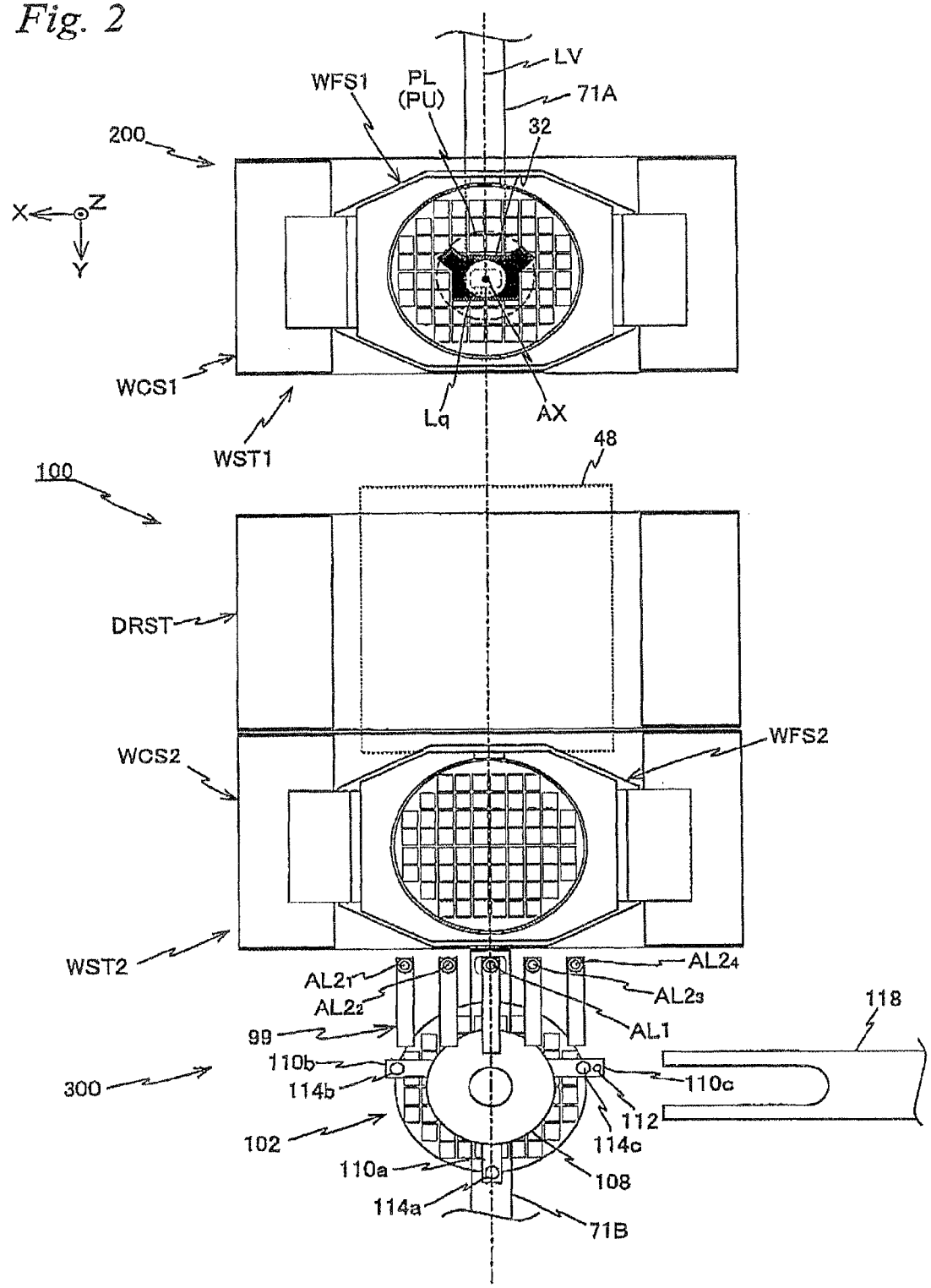
FIG. 2 is a planar view of the exposure apparatus in FIG. 1 which is partially omitted.

Aligner 99 includes five alignment systems AL1, and $AL2_1$ to $AL2_4$ shown in FIG. 2, as is disclosed in, for example, U.S. Patent Application Publication No. 2008/0088843 and the like. To be more specific, as shown in FIG. 2, a primary alignment system AL1 is placed on a straight line (hereinafter, referred to as a reference axis) LV, which passes through the center of projection unit PU (optical axis AX of projection optical system PL, which also coincides with the center of exposure area IA previously described in the embodiment) and is also parallel to the Y-axis, in a state where the detection center is located at a position that is spaced apart from optical axis AX at a predetermined distance on the +Y side. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis LV are severally arranged. That is, five alignment systems AL1 and $AL2_1$ to $AL2_4$ are placed so that their detection centers are placed along the X-axis direction. Secondary alignment systems $AL2_1$, $AL2_2$, $AL2_3$, and $AL2_4$ are held within the XY plane by a movable holding device (a slider). As each of alignment systems AL1, and $AL2_1$ to $AL2_4$, are FIA (Field Image Alignment) system by an image processing method is used. The imaging signals from alignment systems AL1, and $AL2_1$ to $AL2_4$ are supplied to main controller 20 (refer to FIG. 13). Incidentally, in FIG. 1, the five alignment systems AL1 and $AL2_1$ to $AL2_4$ are shown as an aligner 99, including the holding apparatus (sliders) which hold these systems. Incidentally, the detailed configuration of aligner 99 is disclosed in, for example, PCT International Publication No. 2008/056735 (and the corresponding U.S. Patent Application Publication No. 2009/0233234) and the like.

Figure 3:
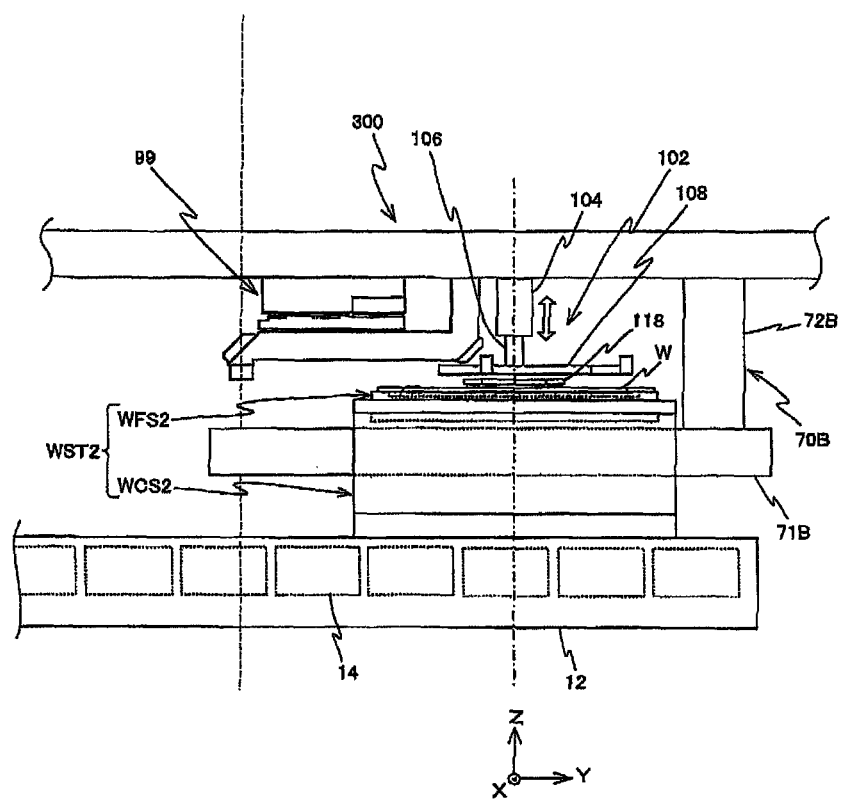
FIG. 3 is an enlarged view showing an area around the measurement station in FIG. 1.

As shown in FIG. 3, chuck unit 102 is equipped with a drive section 104 fixed to the lower surface of main frame BD, a shaft 106 driven in a vertical direction (the Z-axis direction) by drive section 104, and a holding section fixed to the lower end of shaft 106, such as, for example, a disc-shaped Bernoulli chuck (also referred to as a float chuck) 108.

As shown in a planar view in FIG. 2, at three places on the outer periphery of Bernoulli chuck 108, extended portions 110a, 110b, and 110c are provided. At the tip of extended portion 110c, a gap sensor 112 is installed, and inside gap sensor 112, for example, an imaging device 114c such as a CCD is installed. Further, in the vicinity of the tip of extended portions 110a and 110b, imaging devices 114a and 114b are attached, such as a CCD, respectively.

As is known, the Bernoulli chuck is a chuck that utilizes the Bernoulli effect and fixes (suctions) the object in a non-contact manner by locally increasing the flow velocity of a blown out fluid (e.g., air). The Bernoulli effect, here, refers to an effect that the Bernoulli's theorem (principle) in which an increase in the speed of the fluid occurs simultaneously with a decrease in pressure has on fluid machinery. In the Bernoulli chuck, the holding state (suction/floating state) is decided, according to the weight of the object to be suctioned (fixed), and the flow rate of the fluid which is blown, out from the chuck. More specifically, in the case the size of the object is known, the dimension of the gap between the chuck and the object to be held upon holding is decided, depending on the flow rate of the fluid which is blown out from the chuck. In the embodiment, the Bernoulli chuck is used to suction (fix/hold) wafer W.

As gap sensor 112, for example, a capacitive sensor is used, which measures the distance between fine movement stage WFS2 (or WFS1) and a plate (a liquid repellent plate) that will be described later on in the periphery of wafer W, mainly at the time of unloading wafer W. The output of gap sensor 112 is supplied to main controller 20 (refer to FIG. 13).

Extended portion 110a extends in the −X direction, when viewed from the center of Bernoulli chuck 108. In extended portion 110a, imaging device 114a is attached to a position opposed to a notch (a V-shaped notch, not shown) of wafer W, in a state where the center of wafer W substantially coincides with the center of Bernoulli chuck 108. Further, the remaining imaging devices 114b and 114c are attached to positions on extended portions 110b and 110c which are opposed to a part of the periphery of wafer W, respectively, in a state where the center of wafer W substantially coincides with the center of Bernoulli chuck 108.

The imaging signals of imaging devices 114a to 114c are sent to a signal processing system 116 (refer to FIG. 13), where signal processing system 116 detects a cut-out (such as a notch) of the wafer and the periphery section besides the cut-out and obtains a positional shift and a rotational (a θz rotation) error of the wafer in the X-axis direction and the Y-axis direction, by a method disclosed in, for example, U.S. Pat. No. 6,624,433 and the like. Then, information on such positional shift and rotational error is supplied to main controller 20 (refer to FIG. 13).

Figure 13:
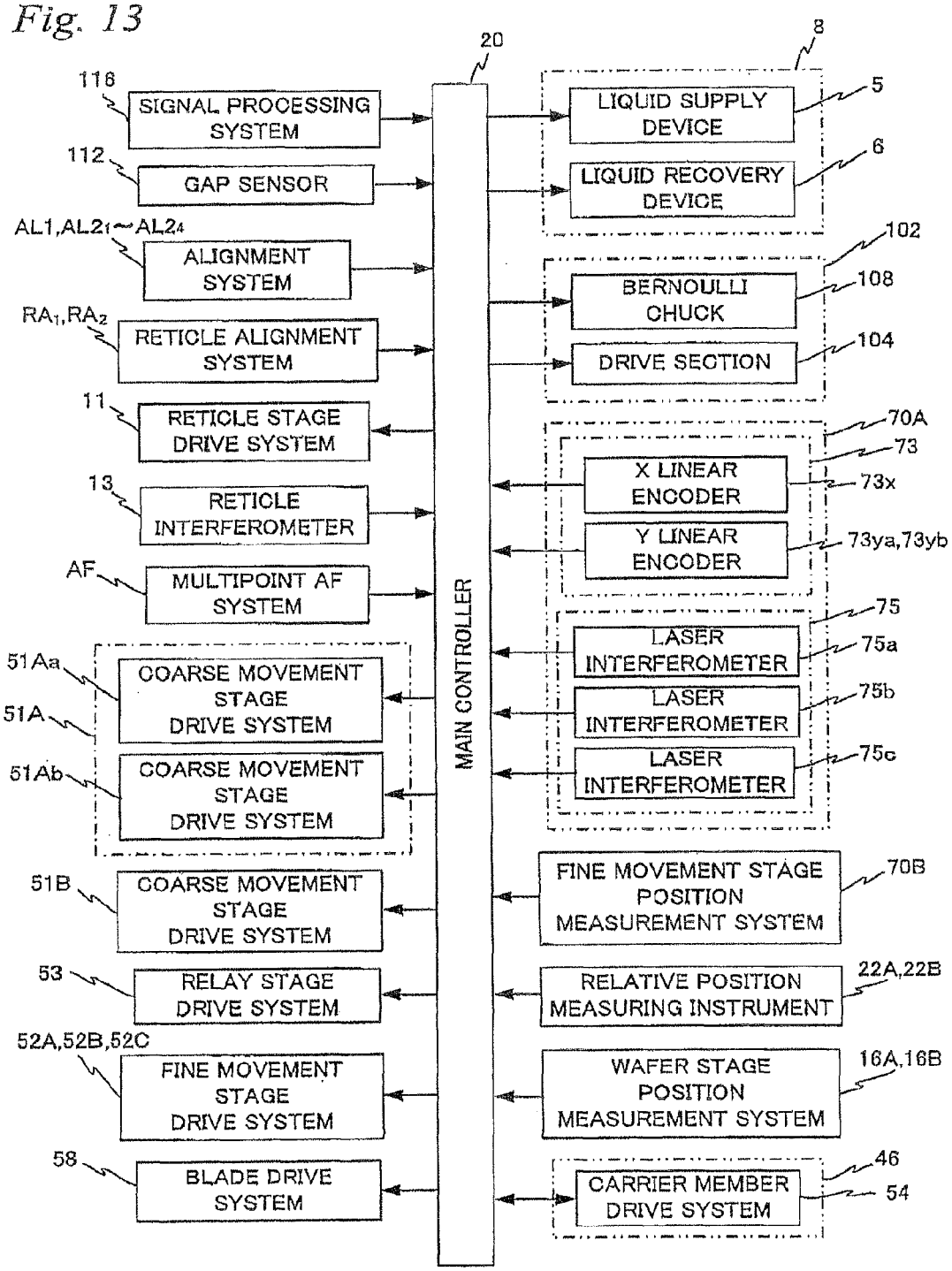
FIG. 13 is a block diagram showing a configuration of a control system of the exposure apparatus in FIG. 1.

Drive section 104 of chuck unit 102 and Bernoulli chuck 108 are controlled by main controller 20 (refer to FIG. 13).

Furthermore, exposure apparatus 100 is equipped with a wafer carrier arm 118 which is movable within an area including a position of chuck unit 102, and a wafer delivery position (e.g., a wafer delivery position (unloading side and loading side) of a wafer between a coater developer which is connected in-line to exposure apparatus 100) away from the position of chuck unit 102, for example, in the +X direction.

As it can be seen from FIGS. 1, 4A and the like, wafer stage WST1 has a wafer coarse movement stage (hereinafter, shortly referred to as a coarse movement stage) WCS1, which is supported by levitation above base board 12 by a plurality of non-contact bearings, such as, for example, air bearings, provided on its bottom surface and is driven in an XY two-dimensional direction by a coarse movement stage drive system 51A (refer to FIG. 13), and a wafer fine movement stage (hereinafter, shortly referred to as a fine movement stage) WFS1, which is supported in a non-contact manner by coarse movement stage WCS1 and is relatively movable with respect to coarse movement stage WCS1. Fine movement stage WFS1 is driven by a fine movement stage drive system 52A (refer to FIG. 13) with respect to coarse movement stage WCS1 in the X-axis direction, the Y-axis direction, the Z-axis direction, the θx direction, the θy direction, and the θz direction (hereinafter expressed as directions of six degrees of freedom, or directions of six degrees of freedom (X, Y, Z, θx, θy, θz)).

Positional information (also including rotation information in the θz direction) in the XY plane of wafer stage WST1 (coarse movement stage WCS1) is measured by a wafer stage position measurement system 16A. Further, positional information in directions of six degrees of freedom (X, Y, Z, θx, θy, and θz) of fine movement stage WFS1 (or fine movement stage WFS2 which will be described later on) supported by coarse movement stage WCS1 in exposure station 200 is measured by fine movement stage position measurement system 70A. Measurement results of wafer stage position measurement system 16A and fine movement stage position measurement system 70A are supplied to main controller 20 (refer to FIG. 13) for position control of coarse movement stage WCS1 and fine movement stage WFS1 (or WFS2).

Similar to wafer stage WST1, wafer stage WST2 has a wafer coarse movement stage WCS2, which is supported by levitation above base board 12 by a plurality of non-contact bearings (e.g., air bearings (omitted in drawings)) provided on its bottom surface and is driven in the XY two-dimensional direction by a coarse movement stage drive system 51B (refer to FIG. 13), and a wafer fine movement stage WFS2, which is supported in a non-contact manner by coarse movement stage WCS2 and is relatively movable with respect to coarse movement stage WCS2. Fine movement stage WFS2 is driven by a fine movement stage drive system 52B (refer to FIG. 13) with respect to coarse movement stage WCS2 in directions of six degrees of freedom (X, Y, Z, θx, θy, θz).

Positional information (also including rotation information in the θz direction) in the XY plane of wafer stage WST2 (coarse movement stage WCS2) is measured by a wafer stage position measurement system 16B. Further, positional information in directions of six degrees of freedom (X, Y, Z, θx, θy, and θz) of fine movement stage WFS2 (or fine movement stage WFS1) supported by coarse movement stage WCS2 in measurement station 300 is measured by fine movement stage position measurement system 70B. Measurement results of wafer stage position measurement system 16B and fine movement stage position measurement system 70B are supplied to main controller 20 (refer to FIG. 13) for position control of coarse movement stage WCS2 and fine movement stage WFS2 (or WFS1).

When fine movement stage WFS1 (or WFS2) is supported by coarse movement stage WCS1, relative positional information of fine movement stage WFS1 (or WFS2) and coarse movement stage WCS1 in directions of three degrees of freedom, which are X, Y, and θz, can be measured by a relative position measuring instrument 22A (refer to FIG. 13) provided in between coarse movement stage WCS1 and fine movement stage WFS1 (or WFS2).

Similarly, when fine movement stage WFS2 (or WFS1) is supported by coarse movement stage WCS2, relative positional information of fine movement stage WFS2 (or WFS1), and coarse movement stage WCS2 in directions of three degrees of freedom, which are X, Y, and θz, can be measured by a relative position measuring instrument 22B (refer to FIG. 13) provided in between coarse movement stage WCS2 and fine movement stage WFS2 (or WFS1).

As relative position measuring instruments 22A and 22B, for example, an encoder can be used which includes at least two heads arranged at coarse movement stages WCS1 and WCS2, respectively, whose area subject to measurement are gratings provided on fine movement stages WFS1 and WFS2, and measures a position of fine movement stages WFS1 and WFS2 in the X-axis direction, the Y-axis direction, and the θz direction, based on an output of the heads. Measurement results of relative position measuring instruments 22A and 22B are supplied to main controller 20 (refer to FIG. 13).

Like coarse movement stage WCS1 and WCS2, relay stage DRST is supported by levitation above base board 12 by a plurality of non-contact bearings (e.g., air bearings (omitted in drawings)) provided on its bottom surface, and is drivable in the XY two-dimensional direction by a relay stage drive system 53 (refer to FIG. 13).

Positional information (also including rotation information in the θz direction) in the XY plane of relay stage DRST is measured by a position measurement system (not shown) including, for example, an interferometer and/or an encoder and the like. The measurement results of the position measurement system is supplied to main controller 20 (refer to FIG. 13) for position control of relay stage DRST.

Configuration and the like of each of the parts configuring the stage system including the various measurement systems described above will be explained in detail, later on.

Figure 5:
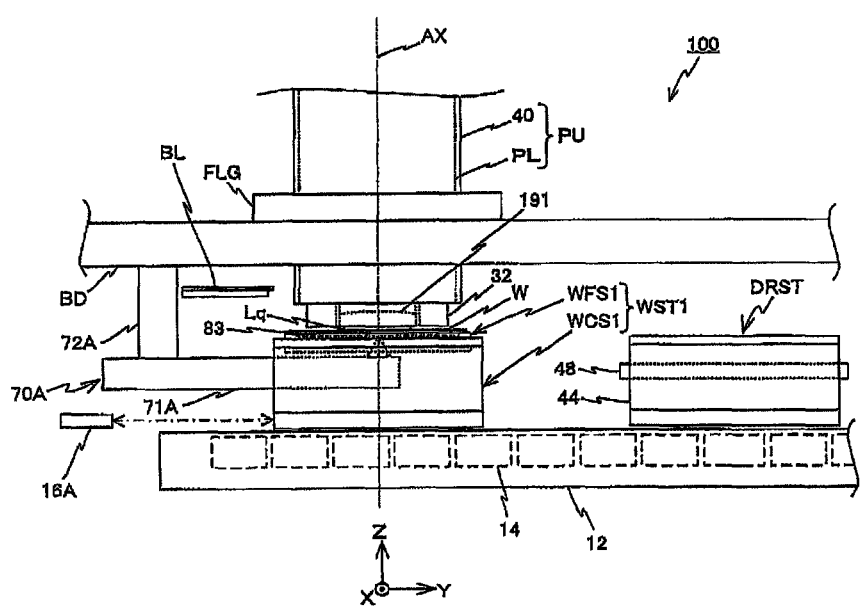

Furthermore, as shown in FIG. 5, in exposure apparatus 100 of the embodiment, a movable blade BL is provided in the vicinity of projection unit PU. Movable blade BL can be driven in the Z-axis direction and the Y-axis direction by a blade drive system 58 (not shown in FIG. 5, refer to FIG. 13). Movable blade BL is a moveable member having a flat surface as an upper surface to hold liquid Lq, and in the embodiment, is made of a tabular member, which has a projecting portion formed on the upper end on the +Y side that projects out more than the other portions.

In the embodiment, the upper surface of movable blade BL has liquid repellency to liquid Lq. In the embodiment, movable blade BL includes a metal base material such as stainless steel and the like, and a film of a liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, the whole movable blade BL can be formed of at least one of the PFA, PTFE, Teflon (a registered trademark), acrylic-based resin, and silicone-based resin. In the embodiment, the contact angle of the upper surface of movable blade BL to liquid Lq is, for example, 90 degrees or more. Incidentally, the upper surface of movable blade BL can be non-liquid repellent (lyophilic), besides being liquid repellent.

Movable blade BL engages with fine movement stage WFS1 (or WFS2), which is supported by coarse movement stage WCS1, from the −Y side, and a surface appearing to be completely flat (for example, refer to FIG. 18) is formed in the engaged state with the upper surface of fine movement stage WFS1 (or WFS2). Movable blade BL is driven by main controller 20 via blade drive system 58, and performs delivery of a liquid immersion space area (liquid Lq) with fine movement stage WFS1 (or WFS2). Incidentally, the delivery of the liquid immersion space area (liquid Lq) between movable blade BL and fine movement stage WFS1 (or WFS2) will be described further later on.

Besides this, in exposure apparatus 100 of the embodiment, a multiple point focal point position detection system (hereinafter shortly referred to as a multipoint AF system) AF (not shown in FIG. 2, refer to FIG. 12) having a similar configuration as the one disclosed in, for example, U.S. Pat. No. 5,448,332 and the like, is arranged in the vicinity of projection unit PC. Detection signals of multipoint AF system AF are supplied to main controller 20 (refer to FIG. 12) via an AF signal processing system (not shown), Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of alignment systems AL1 and AL2$_1$ to AL2$_4$, and at the time of exposure, the so-called focus leveling control of wafer W can be performed, using the surface position information and measurement values of a laser interferometer system 75 (refer to FIG. 12) configuring a part of fine movement stage position measurement system 70A which will be described later on. In this case, multipoint AF system does not have to be provided in the vicinity of projection unit PU. Incidentally, measurement values of an encoder system configuring fine movement stage position measurement system 70A can also be used, rather than laser interferometer system 75 in focus leveling control.

Further, in exposure apparatus 100 of the embodiment, as is disclosed in detail in, for example, U.S. Pat. No. 5,646,413 and the like, a pair of reticle alignment systems RA$_1$ and RA$_2$ (reticle alignment system RA$_2$ is hidden behind reticle alignment system RA$_1$ in the depth of the page surface in FIG. 1.) of an image processing method that has an imaging device such as a CCD and the like and uses a light (in the embodiment, illumination light IL) of the exposure wavelength as an illumination light for alignment is placed above reticle stage RST. The pair of reticle alignment systems RA$_1$ and RA$_2$ is used, in a state where a measurement plate to be described later on fine movement stage WFS1 (or WFS2) is positioned directly below projection optical system PL with main controller 20 detecting a projection image of a pair of reticle alignment marks (omitted in drawings) formed on reticle R and a corresponding pair of first fiducial marks on the measurement plate via projection optical system PL, to detect a detection center of a projection area of a pattern of reticle R and a reference position on the measurement plate using projection optical system PL, namely to detect a positional relation with a center of the pair of first fiducial marks. Detection signals of reticle alignment detection systems RA$_1$ and RA$_2$ are supplied to main controller 20 (refer to FIG. 13) via a signal processing system (not shown). Incidentally, reticle alignment systems RA$_1$ and RA$_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Now, a configuration and the like of each part of the stage systems will be described in detail. First of all, wafer stages WST1 and WST2 will be described. In the embodiment, wafer stage WST1 and wafer stage WST2 are configured identically, including the drive system, the position measurement system and the like. Accordingly, in the following description, wafer stage WST1 will be taken up and described, representatively.

Figure 4A:
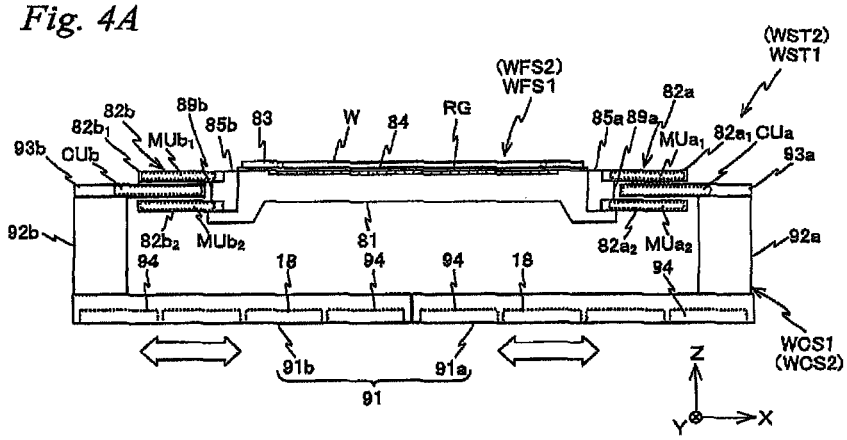
FIG. 4A shows a side view of a wafer stage which the exposure apparatus in FIG. 1 is equipped with when viewed from a −Y direction.
Figure 4B:
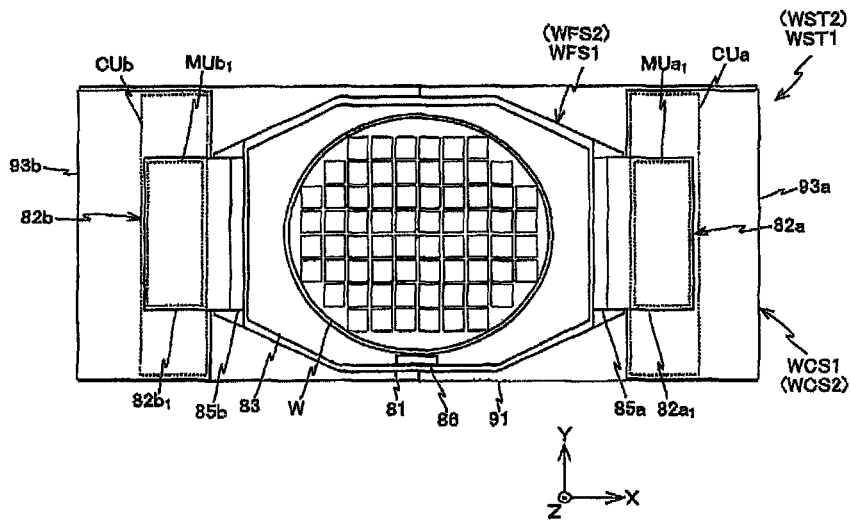
FIG. 4B is a planar view showing the wafer stage.

As shown in FIGS. 4A and 4B, coarse movement stage WCS1 is equipped with a rectangular plate shaped coarse movement slider section 91 whose longitudinal direction is in the X-axis direction in a planar view (when viewing from the direction), a pair of side wall sections 92a and 92b which are each fixed on the upper surface of coarse movement slider section 91 on one end and the other end in the longitudinal direction, and a pair of rectangular plate-shaped stator sections 93a and 93b that are fixed on each of the upper surfaces of side wall sections 92a and 92b and whose longitudinal direction is in the Y-axis direction. As a whole, coarse movement stage WCS1 has a box like shape having a low height whose upper surface in a center in the X-axis direction and surfaces on both sides in the Y-axis direction are open. More specifically, in coarse movement stage WCS1, a space is formed inside penetrating in the Y-axis direction.

Figure 6:
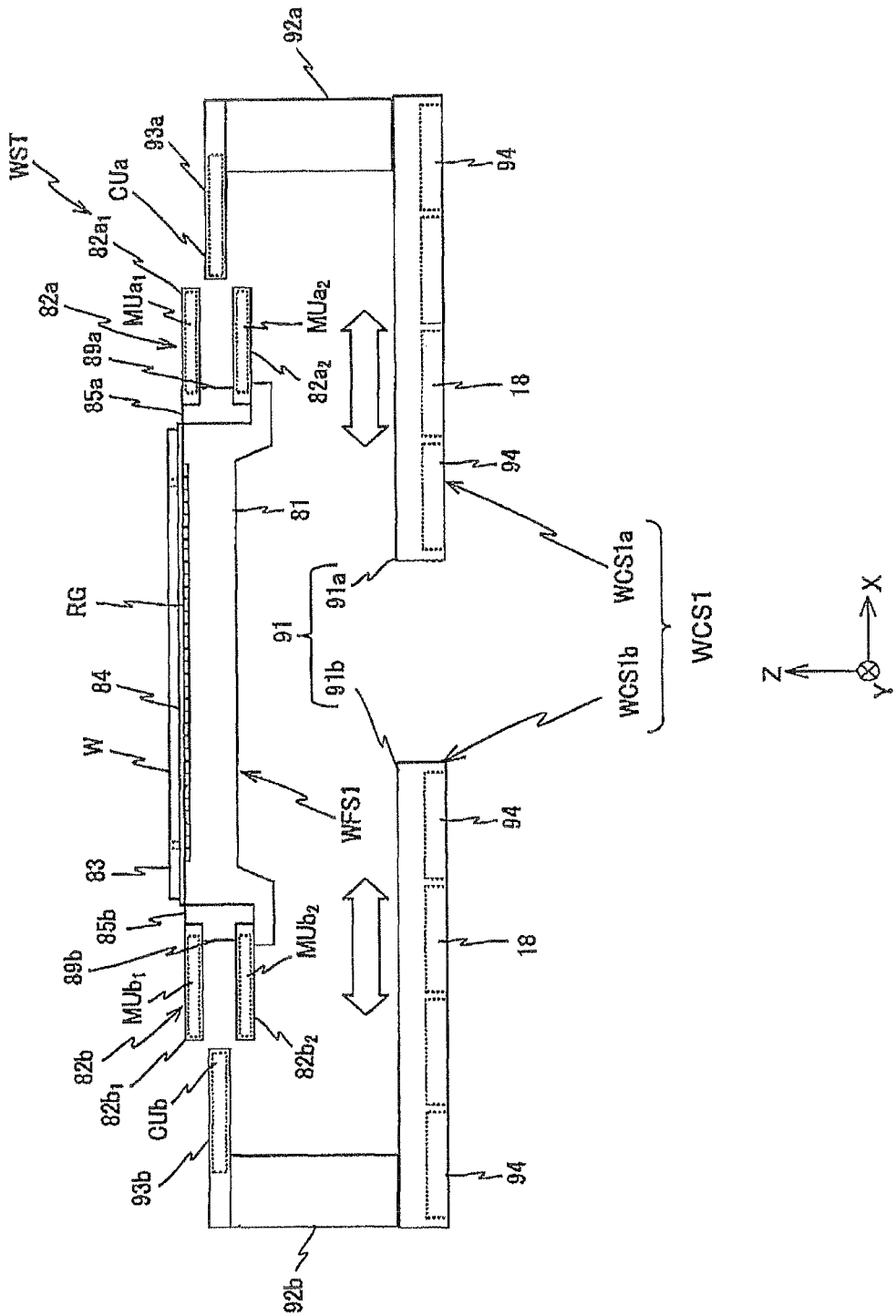
FIG. 6 is a view used to explain a separation structure of a coarse movement stage.

As shown in FIG. 6, coarse movement stage WSC1 is configured separable into two sections, which are a first section WCS1a and a second section TtCS1b, with a separation line in the center in the longitudinal direction of coarse movement slider section 91 serving as a boundary. Accordingly, coarse movement slider section 91 is configured of a first slider section 91a which structures a part of the first section WCS1a, and a second slider section 91b which structures a part of the second section WCS1b.

On the bottom surface of coarse movement stage WCS1, or more specifically, on the bottom surface of the first slider section 91a and the second slider section 91b, a magnet unit is fixed consisting of a plurality of permanent magnets 18 placed in the shape of a matrix, as shown in FIG. 4A. In correspondence with the magnet unit, inside base 12, a coil unit is housed, including a plurality of coils 14 placed in the shape of a matrix with the XY two-dimensional direction serving as a row direction and a column direction, as shown in FIG. 1. The magnet unit configures coarse movement stage drive systems 51Aa and 51Ab (refer to FIG. 13), consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 13).

On the bottom surface of each of the first slider section 91a and the second slider section 91b, a plurality of air bearings 94 is fixed around the magnet unit described above. The first section WCS1a and the second section WCS1b of coarse movement stage WCS1 are each supported by levitation on base board 12 by a predetermined clearance, such as around several μm, by air bearings 94, and are driven in the X-axis direction, the Y-axis direction, and the θz direction by coarse movement stage drive systems 51Aa and 51Ab.

The first section WCS1a and the second section WCS1b are normally locked integrally, via a lock mechanism (not shown). More specifically, the first section WCS1a and the second section WCS1b normally operate integrally. Therefore, in the following description, a drive system consisting of a planar motor that drives coarse movement stage WCS1, which is made so that the first section WCS1a and the second section WCS1b are integrally formed, will be referred to as a coarse movement stage drive system 51A (refer to FIG. 13).

Incidentally, as coarse movement stage drive system 51A, the drive method is not limited to the planar motor using the Lorentz electromagnetic force drive method, and for example, a planar motor by a variable reluctance drive system can also be used. Incidentally, the electromagnetic force in the electromagnetic force drive method is not limited to the Lorentz force. Besides this, coarse movement stage drive system 51A can be configured by a planar motor of a magnetic levitation type. In this case, the air bearings will not have to be arranged on the bottom surface of coarse movement slider section 91.

As shown in FIGS. 4A and 4S, the pair of stator sections 93a and 93b is each made of a member with a tabular outer shape, and in the inside, coil units CUa and CUb are housed consisting of a plurality of coils to drive fine movement stage WFS1 (or WFS2). While fine movement stage WFS1 and fine movement stage WFS2 are configured identically, and are supported and driven similarly in a non-contact manner by coarse movement stage WCS1 in this case, in the following description, fine movement stage WFS1 will be taken up and described, representatively.

Stator section 93a has an end on the +X side fixed to the upper surface of side wall section 92a, and stator section 93b has an end on the −X side fixed to the upper surface of side wall section 92b.

As shown in FIGS. 4A and 4B, fine movement stage WFS1 is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, math body section 81 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later) of fine movement stage WFS1, a wafer holder WH (not shown in FIGS. 4A and 4S, refer to FIG. 22A and the like) is arranged which holds wafer W by vacuum suction or the like. In the embodiment, for example, a wafer holder of a so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS1, or can be fixed to main body section 81, for example, via an electrostatic chuck mechanism, a clamping mechanism, or by adhesion and the like. In the former case, grating RG is to be provided on a back surface side of fine movement stage WFS1.

Furthermore, on the upper surface of main body section 81 on the outer side of the wafer holder (mounting area of wafer W), as shown in FIGS. 4A and 4S, a plate (a liquid repellent plate) 83 is attached that has a circular opening one size larger than wafer W (the wafer holder) formed in the center, and also has an octagonal outer shape (contour) corresponding to main body section 81. In other words, on the surface of plate 83, a film of a liquid-repellent material is formed. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, plate 83 can be formed of at least one of the PFA, PTFE, Teflon (a registered trademark), acrylic-based resin, and silicone-based resin. The contact angle of the surface of plate 83 to liquid Lq is, for example, 90 degrees or more. A liquid repellent treatment against liquid Lq is applied to the surface of plate 83 (a liquid repellent surface is formed). Plate 83 is fixed to the upper surface of main body section 81, so that its entire surface (or a part of its surface) becomes substantially flush with the surface of wafer W. Further, on the −Y side end of plate 83, as shown in FIG. 4B, a measurement plate 86, which has a narrow rectangular shape in the X-axis direction, is set in a state where its surface is substantially flush with the surface of plate 83, or more specifically, the surface of wafer W. On the surface of measurement plate 86, at least the pair of first fiducial marks previously described, and a second fiducial mark detected by primary alignment system AL1 are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86)) surrounding the wafer holder.

As shown in FIG. 4A, on the upper surface of main body section 81, a two-dimensional grating (hereinafter merely referred to as a grating) RG is placed horizontally (parallel to the wafer W surface). Grating RG is fixed (or formed) on the upper surface of main body section 81 consisting of a transparent material. Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where the two-dimensional grating is fixed or formed, as an example, is in a circular shape which is one size larger than wafer W.

Grating RG is covered and protected with a protective member, such as, for example, a cover glass 84. In the embodiment, on the upper surface of cover glass 84, the holding mechanism previously described (the electrostatic chuck mechanism and the like) to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal or ceramics. Further, although a plate shaped protective member is desirable because a sufficient thickness is required to protect grating RG, a thin film protective member can also be used depending on the material.

Incidentally, of the forming area of grating RG, on a surface of cover glass 84 corresponding to an area where the forming area spreads to the periphery of the wafer holder, it is desirable, for example, to provide a reflection member (e.g., a thin film and the like) which covers the forming area, so that the measurement beam of the encoder system irradiated on grating RG does not pass through cover glass 84, or more specifically, so that the intensity of the measurement beam does not change greatly in the inside and the outside of the area on the rear surface of the wafer holder.

As it can also be seen from FIG. 4A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is formed in a plate shape whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 4A and 4B, mover section 82a includes two plate-like members $82a_1$ and $82a_2$ having a rectangular shape in a planar view whose size (length) in the Y-axis direction and size (width) in the X-axis direction are both shorter than stator section 93a (around half the size). Plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side of main body section 81. In this case, the −X side end of plate-like member $82a_2$ is clamped by spacer 85a and the extending section on the +X side of main body section 81. Between the two plate-like members $82a_1$ and $82a_2$, an end on the −X side of stator section 93a of coarse movement stage WCS1 is inserted in a non-contact manner. Inside plate-like members $82a_1$ and $82a_2$, magnet units $MUa_1$ and $MUa_2$ which will be described later are housed.

Mover section 82b includes two plate-like members $82b_1$ and $82b_2$ maintained at a predetermined distance in the Z-axis direction (vertically), and is configured in a similar manner with mover section 82a, although being symmetrical. Between the two plate-like members $82b_1$ and $82b_2$, an end on the +X side of stator section 93b of coarse movement stage WCS1 is inserted in a non-contact manner. Inside plate-like members $82b_1$ and $82b_2$, magnet units $MUb_2$ and $MUb_2$ are housed, which are configured similar to magnet units $MUa_1$ and $MUa_2$.

Now, as is previously described, because the surface on both sides in the Y-axis direction is open in coarse movement stage WCS1, when attaching fine movement stage WFS1 to coarse movement stage WCS1, the position of fine movement stage WFS1 in the Z-axis direction should be positioned so that stator section 93a, 93b are located between plate-like members $82a_1$ and $82a_2$, and $82b_1$ and $82b_2$, respectively, and then fine movement stage WFS1 can be moved (slid) in the Y-axis direction.

Fine movement stage drive system 52A includes the pair of magnet units $MUa_1$ and $MUa_2$ that mover section 82a previously described has, coil unit CUa that stator section 93a has, the pair of magnet units $MUb_1$ and $MUb_2$ that mover section 82b previously described has, and coil unit CUb that stator section 93b has.

This will be explained further in detail. As it can be seen from FIG. 7, at the end on the −X side inside of stator section 93a, two lines of coil rows, which are a plurality of (in this case, twelve) YZ coils 55 and 57 having a rectangular shape in a planar view that are placed equally spaced apart in the Y-axis direction, and one X coil 56, which is narrow and has a rectangular shape in a planar view and whose longitudinal direction is in the Y-axis direction, are placed spaced equally apart in the X-axis direction. YZ coils 55 and 57 have an upper part winding and a lower part winding in a rectangular shape in a planar view that are disposed such that they overlap in the vertical direction (the Z-axis direction). Coil unit CUa is configured including the two lines of coil rows and X coil 56.

Inside plate-like members $82a_1$ and $82a_2$ configuring a part of mover section 82a of fine movement stage WFS1, as it can be seen referring to FIG. 7, two lines of magnet rows which are a plurality of (in this case, ten) permanent magnets 65a and 67a placed equally spaced in the Y-axis direction, and a pair (two) of permanent magnets $66a_1$ and $66a_2$ whose longitudinal direction is in the Y-axis direction are placed in a placement corresponding to the placement of each of the coils described above.

The plurality of permanent magnets 65a and 67a configuring each magnet row are placed in an arrangement where the magnets have a polarity which is alternately a reverse polarity to each other. Further, the pair of permanent magnets $66a_1$ and $66a_2$ is placed so that the polarity to each other is a reverse polarity. Magnet unit $MUa_1$ and $MUa_2$ are configured by the two lines of magnet rows and the pair of permanent magnets.

Incidentally, inside the other stator section 93b and mover section 82b, coils and permanent magnets are placed in an arrangement similar to coil unit CUa and magnet unit $MUa_1$ and $MUa_2$ inside stator section 93a and mover section 82a, and by these arrangements, coil unit Cub and magnet units $MUb_1$ and $MUb_2$ are configured, respectively.

Because a placement of each of the coils and permanent magnets as in the description above is employed in the embodiment, main controller 20 can drive fine movement stage WFS1 in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS1 in the Y-axis direction, main controller 20 can generate a drive force in the Z-axis direction separately from the drive force in the Y-axis direction and make fine movement stage WFS1 levitate from coarse movement stage WCS1. And, main controller 20 drives fine movement stage WFS1 in the Y-axis direction while maintaining the levitated state of fine movement stage WFS1 with respect to coarse movement stage WCS1, namely a noncontact state, by sequentially switching the coil subject to current supply according to the position of fine movement stage WFS1 in the Y-axis direction. Further, main controller 20 can drive fine movement stage WFS1 in the Y-axis direction in a state where fine movement stage WFS1 is levitated from coarse movement stage WCS1, as well as independently drive the fine movement stage in the X-axis direction.

Figure 8A:
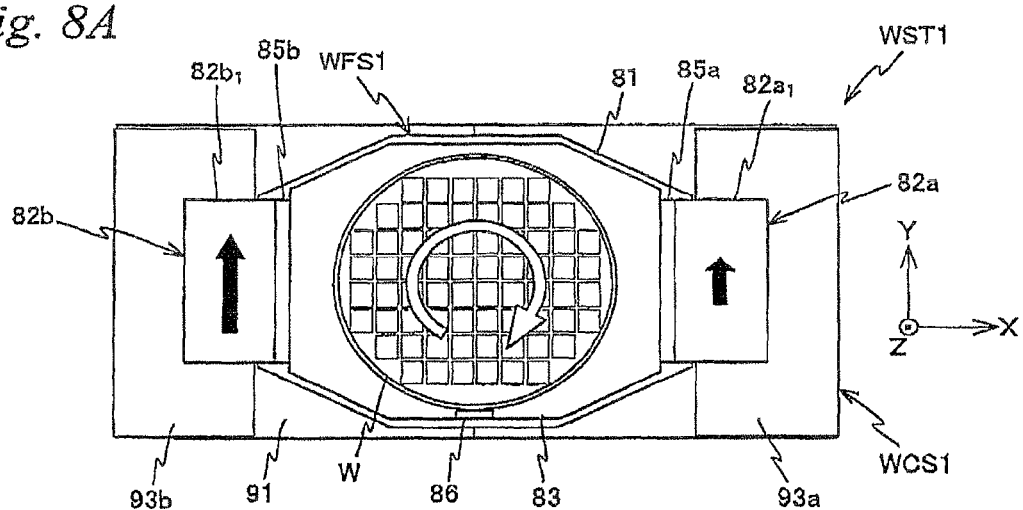
FIG. 8A is a view used to explain an operation when a fine movement stage is rotated around the Z-axis with respect to a coarse movement stage.
Figure 8B:
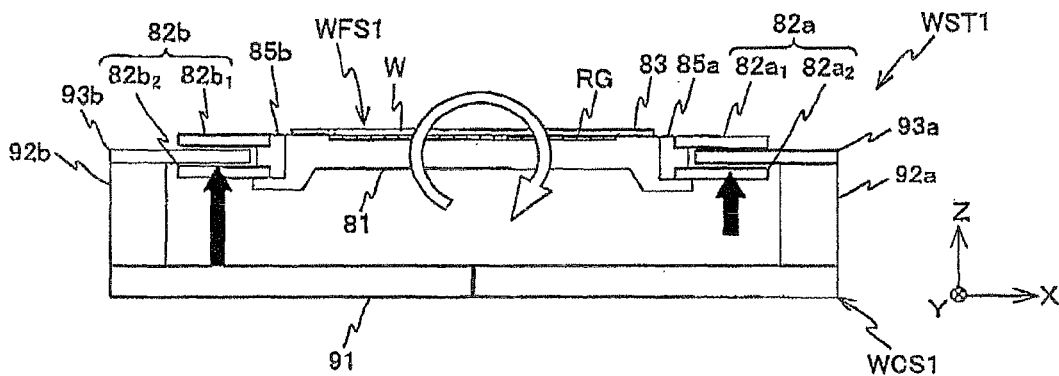
FIG. 8B is a view used to explain an operation when a fine movement stage is rotated around the Y-axis with respect to a coarse movement stage.
Figure 8C:
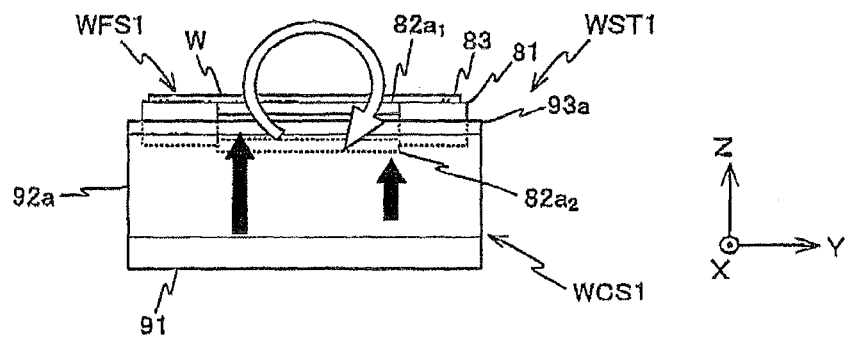
FIG. 8C is a view used to explain an operation when a fine movement stage is rotated around the X-axis with respect to a coarse movement stage.

As it can be seen from the description above, in the embodiment, fine movement stage drive system 52A supports fine movement stage WFS1 by levitation in a non-contact state with respect to coarse movement stage WCS1, and can also drive fine movement stage WFS1 in a non-contact manner in the X-axis direction, the Y-axis direction, and the Z-axis direction with respect to coarse movement stage WCS1. Further, main controller 20 can make fine movement stage WFS1 rotate around the Z-axis ($\theta z$ rotation) (refer to the outlined arrow in FIG. 8A), by applying a drive force (thrust) in the Y-axis direction having a different magnitude to both mover section 82a and mover section 82b (refer to the black arrow in FIG. 8A). Further, main controller 20 can make fine movement stage WFS1 rotate around the Y-axis ($\theta y$ drive) (refer to the outlined arrow in FIG. 8B), by applying a different levitation force (refer to the black arrows in FIG. 8B) to both mover section 82a and mover section 82b. Furthermore, as shown in FIG. 8C, for example, main controller 20 can make fine movement stage WFS1 rotate around the X-axis ($\theta x$ drive) (refer to the outlined arrow in FIG. 8C), by applying a different levitation force to both mover sections 82a and 82b of fine movement stage WFS1 on the + side and, the − side in the Y-axis direction (refer to the black arrow in FIG. 8C).

Figure 9:
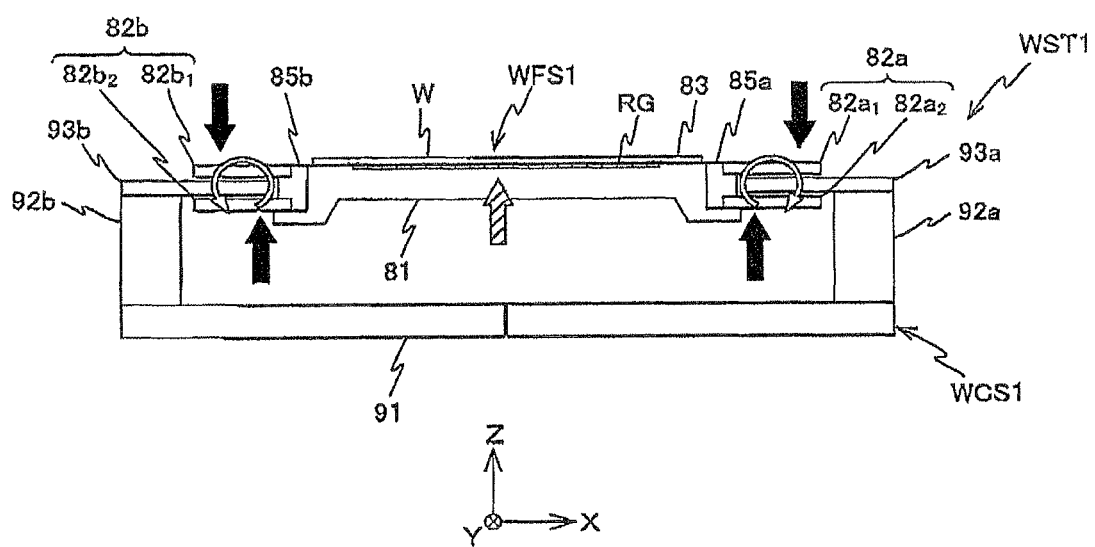
FIG. 9 is a view used to explain an operation when a center section of the fine movement stage is deflected in the +Z direction.

Further, in the embodiment, by supplying electric current to the two lines of coils 55 and 57 (refer to FIG. 7) placed inside stator section 93a in directions opposite to each other when applying the levitation force to fine movement stage WFS1, for example, main controller 20 can apply a rotational force (refer to the outlined arrow in FIG. 9) around the Y-axis simultaneously with the levitation force (refer to the black arrow in FIG. 9) with respect to mover section 82a, as shown in FIG. 9. Similarly, by supplying electric current to the two lines of coils placed inside stator section 93b in directions opposite to each other when applying the levitation force to fine movement stage WFS, for example, main controller 20 can apply a rotational force around the Y-axis simultaneously with the levitation force with respect to mover section 82a.

Further, by applying a rotational force around the Y-axis (a force in the $\theta y$ direction) to each of the pair of mover sections 82a and 82b in directions opposite to each other, main controller 20 can deflect the center of fine movement stage WFS1 in the +Z direction or the −Z direction (refer to the hatched arrow in FIG. 9). Accordingly, as shown in FIG. 9, by bending the center of fine movement stage WFS1 in the +Z direction (in a convex shape), the deflection in the middle part of fine movement stage WFS1 (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS1 also becomes large.

Further, when wafer W is deformed by its own weight and the like, there is a risk that the surface of wafer W mounted on fine movement stage WFS1 will no longer be within the range of the depth of focus of projection optical system PL within the irradiation area (exposure area IA) of illumination light IL. Therefore, similar to the case described above where main controller 20 deflects the center in the X-axis direction of fine movement stage WFS1 to the +Z direction, by applying a rotational force around the Y-axis to each of the pair of mover sections 82a and 82b in directions opposite to each other, wafer W is deformed to be substantially flat, and the surface of wafer W within exposure area IA can fall within the range of the depth of focus of projection optical system PL. Incidentally, while FIG. 9 shows an example where fine movement stage WFS1 is bent in the +Z direction (a convex shape), fine movement stage WFS1 can also be bent in a direction opposite to this (a concave shape) by controlling the direction of the electric current supplied to the coils.

Incidentally, the method of making fine movement stage WFS1 (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA, as is disclosed in, for example, U.S. Reissued Pat. No. RE37,391 and the like.

In exposure apparatus 100 of the embodiment, at the time of exposure operation by the step-and-scan method to wafer W, positional information (including the positional information in the $\theta z$ direction) in the XY plane of fine movement stage WFS1 is measured by main controller 20 using an encoder system 73 (refer to FIG. 13) of fine movement stage position measurement system 70A which will be described later on. The positional information of fine movement stage WFS1 is sent to main controller 20, which controls the position of fine movement stage WFS1 based on the positional information.

On the other hand, when wafer stage WST1 (fine movement stage WFS1) is located outside the measurement area of fine movement stage position measurement system 70A, the positional information of wafer stage WST1 (fine movement stage WFS1) is measured by main controller 20 using wafer stage position measurement system 16A (refer to FIGS. 1 and 13). As shown in FIG. 1, wafer stage position measurement system 16A includes a laser interferometer which irradiates a measurement beam on a reflection surface formed on the coarse movement stage WCS1 side surface by mirror polishing and measures positional information of wafer stage WST1 in the XY plane. Incidentally, the positional information of wafer stage WST1 in the XY plane can be measured using other measurement devices, such as for example, an encoder system, instead of wafer stage position measurement system 16A described above. In this case, for example, a two-dimensional scale can be placed on the upper surface of base board 12, and an encoder head can be attached to the bottom surface of coarse movement stage WCS1.

As is previously described, fine movement stage WFS2 is configured identical to fine movement stage WFS1 described above, and can be supported in a non-contact manner by coarse movement stage WCS1 instead of fine movement stage WFS1. In this case, coarse movement stage WCS1 and fine movement stage WFS2 supported by coarse movement stage WCS1 configure wafer stage WST1, and a pair of mover sections (one pair each of magnet units $MUa_1$ and $MUa_2$, and $MUb_1$ and $MUb_2$) equipped in fine movement stage WFS2 and a pair of stator sections 93a and 93b (coil units CUa and CUb) of coarse movement stage WCS1 configure fine movement stage drive system 52A. And by this fine movement stage drive system 52A, fine movement stage WFS2 is driven in a non-contact manner in directions of six degrees of freedom with respect to coarse movement stage WCS1.

Further, fine movement stages WFS2 and WFS1 can each make coarse movement stage WCS2 support them in a non-contact manner, and coarse movement stage WCS2 and fine movement stage WFS2 or WFS1 supported by coarse movement stage WCS2 configure wafer stage WST2. In this case, a pair of mover sections (one pair each of magnet units $MUa_1$ and $MUa_2$, and $MUb_1$ and $MUb_2$) equipped in fine movement stage WFS2 or WFS1 and a pair of stator sections 93a and 93b (coil units CUa and Cub) of coarse movement stage WCS2 configure fine movement stage drive system 52B (refer to FIG. 13). And by this fine movement stage drive system 52B, fine movement stage WFS2 or WFS1 is driven in a non-contact manner in directions of six degrees of freedom with respect to coarse movement stage WCS2.

Referring back to FIG. 1, relay stage DRST is equipped with a stage main section 44 configured similar to coarse movement stages WCS1 and WCS2 (however, it is not structured so that it can be divided into a first section and a second section), and a carrier apparatus 46 (refer to FIG. 13) provided inside stage main section 44. Accordingly, stage main section 44 can support (hold) fine movement stage WFS1 WFS2 in a non-contact manner as in coarse movement stages WCS1 and WCS2, and the fine movement stage supported by relay stage DRST can be driven in directions of six degrees of freedom (X, Y, Z, θx, θy, and θz) by fine movement stage drive system 52C (refer to FIG. 13) with respect to relay stage DRST. However, the fine movement stage should be slidable at least in the Y-axis direction with respect to relay stage DRST.

Carrier apparatus 46 is equipped with a carrier member main section which is reciprocally movable in the Y-axis direction with a predetermined stroke along both of the side walls in the X-axis direction of stage main section 44 of relay stage DST and is vertically movable also in the Z-axis direction with a predetermined stroke, a carrier member 48 including a movable member which can relatively move in the Y-axis direction with respect to the carrier member main section while holding fine movement stage WFS1 or WFS2, and a carrier member drive system 54 (refer to FIG. 13) which can individually drive the carrier member main section configuring carrier member 48 and the movable member.

Next, a configuration of fine movement stage position measurement system 70A (refer to FIG. 13) used to measure the positional information of fine movement stage WFS1 or WFS2 (configuring wafer stage WST1) which is movably held by coarse movement stage WCS1 in exposure station 200, will be described. In this case, the case will be described where fine movement stage position measurement system 70A measures the positional information of fine movement stage WFS1.

As shown in FIG. 1, fine movement stage position measurement system 70A is equipped with an arm member (a measurement arm 71A) which is inserted in a space inside coarse movement stage WCS1, in a state where wafer stage WST1 is placed below projection optical system PL. Measurement arm 71A is supported cantilevered (supported in the vicinity of one end) from main frame BD via a support member 72A. Incidentally, in the case a configuration is employed where the measurement members do not interfere with the movement of the wafer stage, the configuration is not limited to the cantilever support, and both ends in the longitudinal direction can be supported. Further, the arm member should be located further below (the −Z side) grating RG (the placement plane substantially parallel to the XY plane) previously described, and for example, can be placed lower than the upper surface of base board 12. Furthermore, while the arm member was to be supported by main frame BD, for example, the arm member can be installed on an installation surface (such as a floor surface) via a vibration isolation mechanism. In this case, it is desirable to arrange a measuring device which measures a relative positional relation between main frame BD and the arm member. The arm member can also be referred to as a metrology arm or a measurement member.

Measurement arm 71A is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of a material which is the same that transmits light, such as, for example, a glass member affixed in plurals. Measurement arm 71A is formed solid, except for the portion where the encoder head (an optical system) which will be described later is housed. In the state where wafer stage WST1 is placed below projection optical system PL as previously described, the tip of measurement arm 71A is inserted into the space of coarse movement stage WCS1, and its upper surface faces the lower surface (to be more precise, the lower surface of main body section 81 (not shown in FIG. 1, refer to FIG. 4A) of fine movement stage WFS1 as shown in FIG. 1. The upper surface of measurement arm 71A is placed almost parallel with the lower surface of fine movement stage WFS1, in a state where a predetermined clearance, such as, for example, around several mm, is formed with the lower surface of fine movement stage WFS1. Incidentally, the clearance between the upper surface of measurement arm 71A and the lower surface of fine movement stage WFS1 can be more than or less than several mm.

As shown in FIG. 13, fine movement stage position measurement system 70A is equipped with encoder system 73 and laser interferometer system 75. Encoder system 73 includes an X linear encoder 73x measuring the position of fine movement stage WFS1 in the X-axis direction, and a pair of Y linear encoders 73ya and 73yb measuring the position of fine movement stage WFS1 in the Y-axis direction. In encoder system 73, a head of a diffraction interference type is used that has a configuration similar to an encoder head (hereinafter shortly referred to as a head) disclosed in, for example, U.S. Pat. No. 7,238,931, U.S. Patent Application Publication No. 2007/288121 and the like. However, in the embodiment, a light source and a photodetection system (including a photodetector) of the head are placed external to measurement arm 71A as in the description later on, and only an optical system is placed inside measurement arm 71A, or more specifically, facing grating RG. An optical system placed inside of measurement arm 71A is referred to as a head appropriately as follows.

Encoder system 73 measures the position of fine movement stage WFS1 in the X-axis direction using one X head 77x (refer to FIGS. 10A and 10B), and the position in the Y-axis direction using a pair of Y heads 77ya and 77yb (refer to FIG. 10B), More specifically, X linear encoder 73x previously described is configured by X head 77x which measures the position of fine movement stage WFS1 in the X-axis direction using an X diffraction grating of grating RG, and the pair of Y linear encoders 73ya and 73yb is configured by the pair of Y heads 77ya and 77yb which measures the position of fine movement stage WFS1 in the Y-axis direction using a Y diffraction grating of grating RG.

Figure 10A:
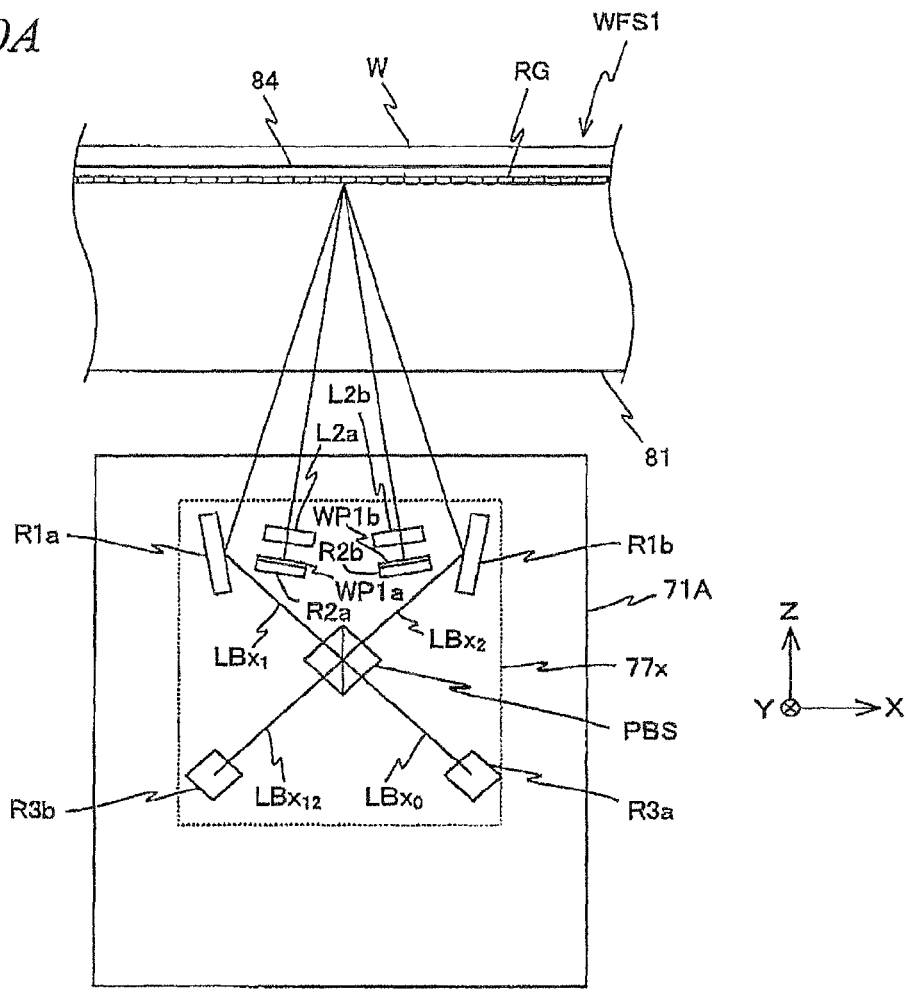
FIG. 10A is a view showing a rough configuration of an X head 77x.

A configuration of three heads 77x, 77ya, and 77yb which configure encoder system 73 will now be described. FIG. 10A representatively shows a rough configuration of X head 77x, which represents three heads 77*x*, 77*ya*, and 77*yb*. Further, FIG. 10B shows a placement of each of the X head 77*x*, and Y heads 77*ya* and 77*yb* within measurement arm 71A.

As shown in FIG. 10A, X head 77*x* is equipped with a polarization beam splitter PBS whose separation plane is parallel to the YZ plane, a pair of reflection mirrors R1*a* and R1*b*, lenses L2*a* and L2*b*, quarter wavelength plates (hereinafter, described as λ/4 plates) WP1*a* and WP1*b*, reflection mirrors R2*a* and R2*b*, and reflection mirrors R1*a* and R3*b* and the like, and these optical elements are placed in a predetermined positional relation. Y heads 77*ya* and 77*yb* also have an optical system with a similar structure. As shown in FIGS. 10A and 10B, X head 77*x*, Y heads 77*ya* and 77*yb* are unitized and each fixed inside of measurement arm 71A.

Figure 10B:
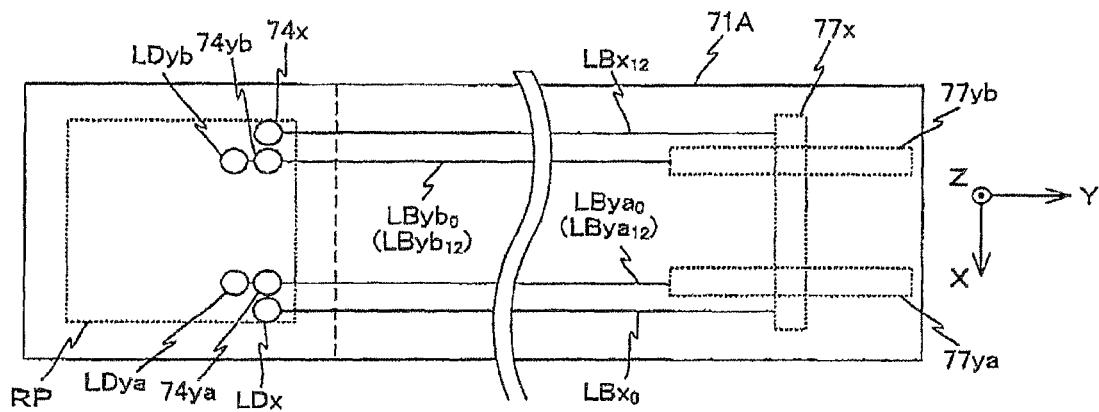
FIG. 10B is a view used to explain a placement of each of the X head 77x, Y heads 77ya and 77yb inside the measurement arm.

As shown in FIG. 10B, in X head 77*x* (X linear encoder 73*x*), a laser beam $LBx_0$ is emitted in the −Z direction from a light source LDx provided on the upper surface (or above) at the end on the −Y side of measurement arm 71A, and its optical path is bent to become parallel with the 1-axis direction via a reflection surface RP which is provided on a part of measurement arm 71A inclined at an angle of 45 degrees with respect to the XY plane. This laser beam $LBx_0$ travels through the solid section inside measurement arm 71A in parallel with the longitudinal direction (the Y-axis direction) of measurement arm 71A, and reaches reflection mirror R3*a* (refer to FIG. 10A). Then, the optical path of laser beam $LBx_0$ is bent by reflection mirror R3*a* and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS1, via reflection mirror R1*a*, and measurement beam $LBx_2$ reflected off polarization beam splitter PBS reaches grating RG via reflection mirror R1*b*. Incidentally, "split by polarization," in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1*a* and WP1*b* via lenses L2*a* and L2*b*, and reflected by reflection mirrors R2*a* and R2*b* and then the beams pass through λ/4 plates WP1*a* and WP1*b* again and reach polarization beam splitter PBS by tracing the same optical path in the reversed direction.

Each of the polarization directions of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. This coaxially synthesizes the first-order diffraction beams of each of the measurement beams $LBx_1$ and $LBx_2$ as a synthetic beam $LBx_{12}$. Synthetic beam. $LBx_{12}$ has its optical path bent by reflection mirror R3*b* so it becomes parallel to the Y-axis, travels inside measurement arm 71A parallel to the Y-axis, and then is sent to an X photodetection system 74*x* provided on the upper surface (or above) at the end on the −Y side of measurement arm 71A shown in FIG. 10B via reflection surface RP previously described.

In X photodetection system 74*x*, the polarization direction of the first-order diffraction beams of beams $LBx_2$, and $LBx_2$ synthesized as synthetic beam $LBx_{12}$ is arranged by a polarizer (analyzer) (not shown) and the beams overlay each other so as to form an interference light, which is detected by the photodetector and is converted into an electric signal in accordance with the intensity of the interference light. When fine movement stage WFS1 moves in the measurement direction (in this case, the X-axis direction) here, a phase difference between the two beams changes, which changes the intensity of the interference light. This change of the intensity of the interference light is supplied to main controller 20 (refer to FIG. 13) as positional information related to the X-axis direction of fine movement stage WFS1.

As shown in FIG. 10B, laser beams $LBya_0$ and $LByb_0$, which are emitted from light sources LDya and LDyb, respectively, and whose optical paths are bent by an angle of 90 degrees so as to become parallel to the Y-axis by reflection surface RP previously described, are incident on Y heads 77*ya* and 77*yb*, and similar to the previous description, from Y heads 77*ya* and 77*yb*, synthetic beams $LBya_{12}$ and $LByb_{12}$ of the first-order diffraction beams by grating RG (Y diffraction grating) of each of the measurement beams split by polarization by the polarization beam splitter are output, respectively, and return to Y photodetection systems 74*ya* and 74*yb*. Now, laser beams $LBya_0$ and $LByb_0$ emitted from light sources LDya and LDyb, and synthetic beams $LBya_{12}$ and $LByb_{12}$ returning to Y photodetection systems 74*ya* and 74*yb*, each pass an optical path which are overlaid in a direction perpendicular to the page surface of FIG. 10B. Further, as described above, in heads 77*ya* and 77*yb*, optical paths are appropriately bent (omitted in drawings) inside so that laser beams $LBya_0$ and $LByb_0$ irradiated from the light source and synthetic beams $LBya_{12}$ and $LByb_{12}$ returning to Y photodetection systems 74*ya* and 74*yb* pass optical paths which are parallel and distanced apart in the Z-axis direction.

Figure 11A:
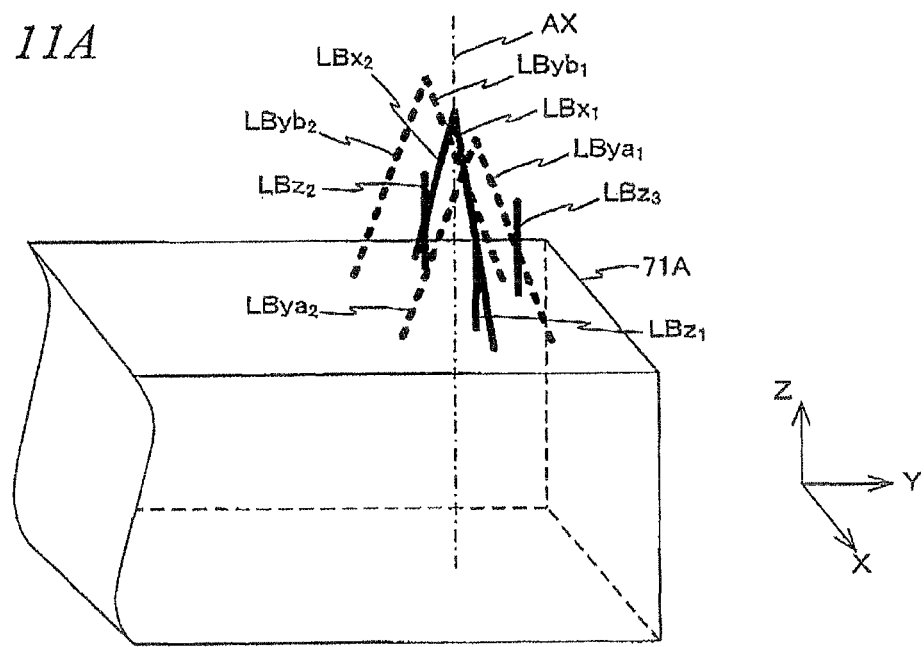
FIG. 11A shows a perspective view of a tip of a measurement arm.
Figure 11B:
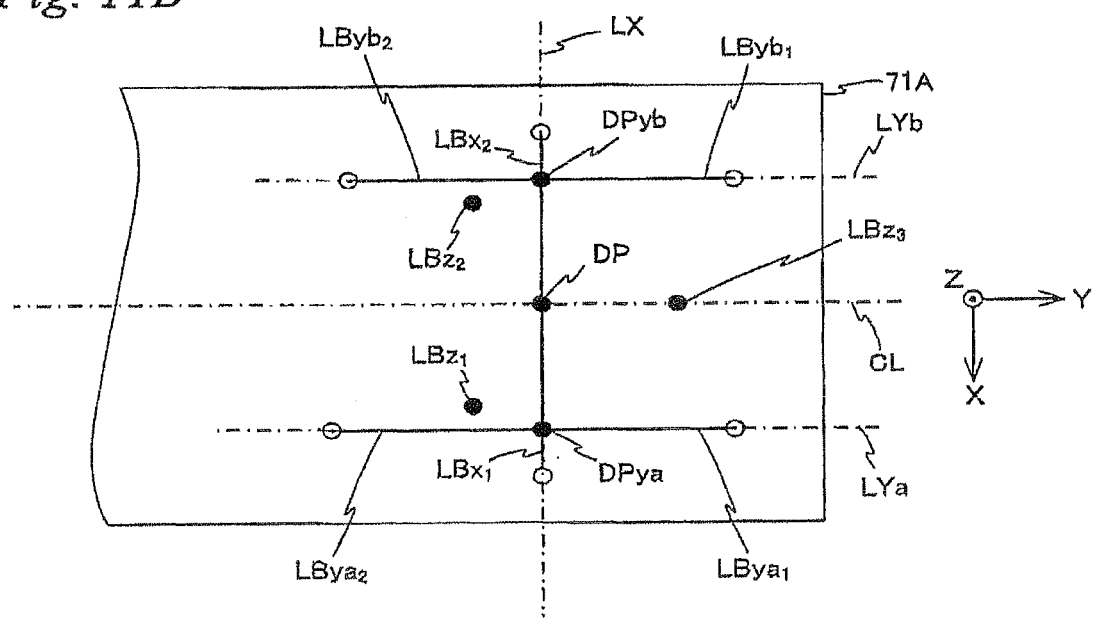
FIG. 11B is a planar view when viewed from the +Z direction of an upper surface of the tip of the measurement arm.

FIG. 11A shows a tip of measurement arm 71A in a perspective view, and FIG. 11B shows an upper surface of the tip of measurement arm 71A in a planar view when viewed from the +Z direction. As shown in FIGS. 11A and 1113, X head 77*x* irradiates measurement beams $LBx_1$ and $LBx_2$ (indicated by a solid line in FIG. 12A) from two points (refer to the white circles in FIG. 12B) on a straight line LX parallel to the X-axis that are at an equal distance from a center line CL of measurement arm 71, on the same irradiation point on grating RG (refer to FIG. 10A). The irradiation point of measurement beams $LBx_1$ and $LBx_2$, that is, a detection point of X head 77*x* (refer to reference code DP in FIG. 11B) coincides with an exposure position which is the center of an irradiation area (exposure area) IA of illumination light IL irradiated on wafer W (refer to FIG. 1). Incidentally, while measurement beams $LBx_1$ and $LBx_2$ are actually refracted at a boundary and the like of main body section 81 and an atmospheric layer, it is shown simplified in FIG. 10A and the like.

As shown in FIG. 10B, each of the pair of Y heads 77*ya* and 77*yb* are placed on the +X side and the −X side of center line CL. As shown in. FIGS. 11A and 11B, Y head 77*ya* irradiates measurement beams $LBya_1$ and $LBya_2$ that are each shown by a broken line in FIG. 11A on a common irradiation point on grating RG from two points (refer to the white circles in FIG. 11B) which are distanced equally from straight line LX on a straight line LYa which is parallel to the Y-axis. The irradiation point of measurement beams $LBya_1$ and $LBya_2$, that is, a detection point of Y head 77*ya* is shown by reference code DPya in FIG. 11B.

Y head 77*yb* irradiates measurement beams $LByb_1$ and $LByb_2$ from two points (refer to the white circles in FIG. 11B) which are symmetrical to the two outgoing points of measurement beams $LBya_1$ and $LBya_2$ with respect to center line CL, on a common irradiation point DPyb on grating RG. As shown in FIG. 11B, detection points DPya and DPyb of Y heads 77ya and 77yb, respectively, are placed on straight line LX which is parallel to the X-axis.

Now, main controller 20 determines the position of fine movement stage WFS1 in the Y-axis direction, based on an average of the measurement values of the two Y heads 77ya and 77yb. Accordingly, in the embodiment, the position of fine movement stage WFS1 in the Y-axis direction is measured with a midpoint DP of detection points DPya and DPyb serving as a substantial measurement point. Midpoint DP coincides with the irradiation point of measurement beams $LBx_1$ and LBX2 on grating RG.

More specifically, in the embodiment, there is a common detection point regarding measurement of positional information of fine movement stage WFS1 in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS1 in the XY plane, directly under (at the back side of fine movement stage WFS1) the exposure position when transferring a pattern of reticle R on a predetermined shot area of wafer W mounted on fine movement stage WFS1. Further, main controller 20 measures a rotational amount of fine movement stage WFS in the θz direction, based on a difference of the measurement values of the pair of Y heads 77ya and 77yb.

As shown in FIG. 11A, laser interferometer system 75 makes three measurement beams $LBz_1$, $LBz_2$, and $LBz_3$ enter the lower surface of fine movement stage WFS1 from the tip of measurement arm 71A. Laser interferometer system 75 is equipped with three laser interferometers 75a to 75c (refer to FIG. 13) that irradiate three measurement beams $LBz_1$, $LBz_2$, and $LBz_3$, respectively.

Figure 12A:
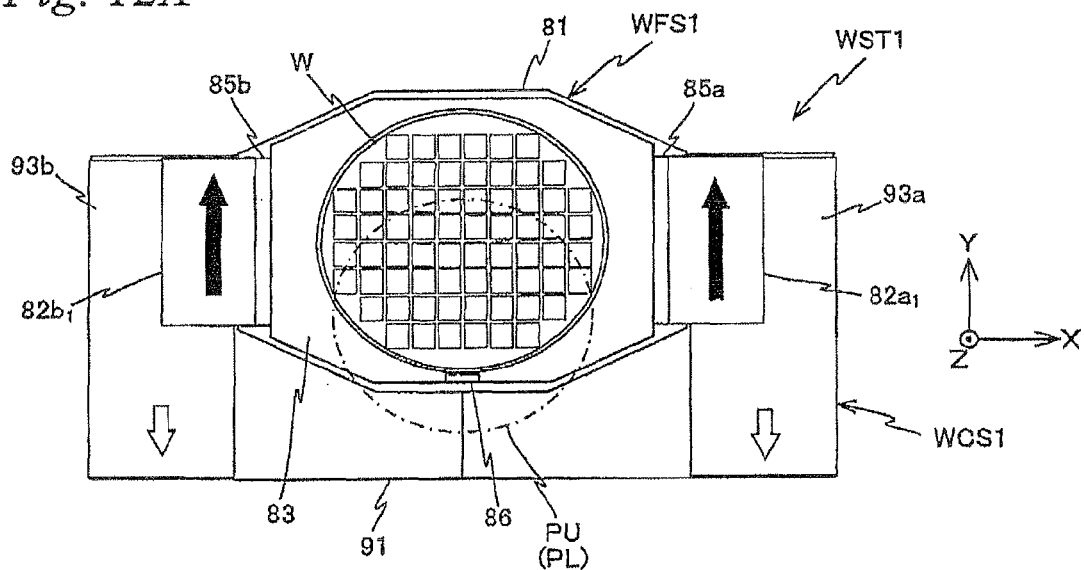
FIG. 12A is a view used to explain a drive method of a wafer at the time of scanning exposure.
Figure 12B:
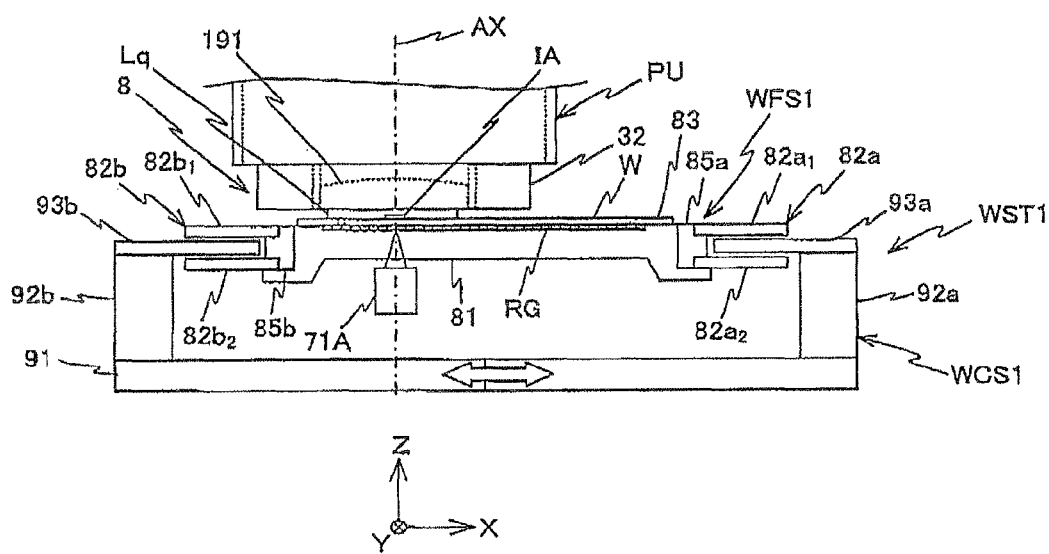
FIG. 12B is a view used to explain a driving method of a wafer at the time of stepping.

In laser interferometer system 75, three measurement beams $LBz_1$, $LBz_2$, and $LBz_3$ are emitted in parallel with the Z-axis from each of the three points that are not collinear on the upper surface of measurement arm 71A, as shown in FIGS. 12A and 12B. Now, as shown in FIG. 11B, three measurement beams $LBz_1$, $LBz_2$, and $LBz_3$ are each irradiated from three points corresponding to the apexes of an isosceles triangle (or an equilateral triangle) whose centroid coincides with the exposure area which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, the rotational amount in the θx direction and the θy direction of fine movement stage WFS1, using laser interferometer system 75. Incidentally, laser interferometers 75a to 75c are provided on the upper surface (or above) at the end on the −Y side of measurement arm 71A. Measurement beams $LBz_1$, $LBz_2$, and $LBz_2$ emitted in the −Z direction from laser interferometers 75a to 75c travel within measurement arm 71A along the Y-axis direction via reflection surface RP1 previously described, and each of their optical paths is bent so that the beams are emitted from the three points described above.

In the embodiment, on the lower surface of fine movement stage WFS1, a wavelength selection filter (omitted in drawings) which transmits each measurement beam from encoder system 73 and blocks the transmission of each measurement beam from laser interferometer system 75 is provided. In this case, the wavelength selection filter also serves as a reflection surface of each of the measurement beams from laser interferometer system 75. As the wavelength selection filter, a thin film and the like having wavelength-selectivity is used and in the embodiment, the wavelength selection filter is provided, for example, on one surface of the transparent plate (main body section 81), and grating RG is placed on the wafer holder side with respect to the one surface.

As it can be seen from the description so far, main controller 20 can measure the position of fine movement stage WFS1 in directions of six degrees of freedom by using encoder system 73 and laser interferometer system 75 of fine movement stage position measurement system 70A. In this case, since the optical path lengths of the measurement beams are extremely short and also are almost equal to each other in encoder system 73, the influence of air fluctuation can mostly be ignored. Accordingly, by encoder system 73, positional information of fine movement stage WFS1 within the XY plane (including the θz direction) can be measured with high accuracy. Further, because the substantial detection points on the grating in the X-axis direction and the Y-axis direction by encoder system 73 and detection points on the lower surface of fine movement stage WFS in the Z-axis direction by laser interferometer system 75 coincide with the center (exposure position) of exposure area IA within the XY plane, respectively, generation of the so-called Abbe error caused by a shift within the XY plane of the detection point and the exposure position is suppressed to a substantially ignorable degree. Accordingly, by using fine movement stage position measurement system 70A, main controller 20 can measure the position of fine movement stage WFS1 in the X-axis direction, the Y-axis direction, and the Z-axis direction with high precision, without any Abbe errors caused by a shift within the XY plane of the detection point and the exposure position. Further, in the case coarse movement stage WCS1 is below projection unit PU and fine movement stage WFS2 is movably supported by coarse movement stage WCS1, by using fine movement stage position measurement system 70A, main controller 20 can measure the position in directions of six degrees of freedom of fine movement stage WFS2 and especially the position of fine movement stage WFS2 in the X-axis direction, the Y-axis direction, and the Z-axis direction can be measured with high precision, without any Abbe errors.

Further, fine movement stage position measurement system 70B which measurement station 300 is equipped with, is configured almost similar to fine movement stage position measurement system 70A, but in a symmetric manner, as shown in FIG. 1. Accordingly, measurement arm 71B which fine movement stage position measurement system 703 is equipped with has a longitudinal direction in the Y-axis direction, and the vicinity of the end on the +Y side is supported almost cantilevered from main frame BD, via support member 72B.

In the case coarse movement stage WCS2 is below aligner 99 and fine movement stage WFS2 or WFS1 is movably supported by coarse movement stage WCS2, by using fine movement stage position measurement system 70B, main controller 20 can measure the position in directions of six degrees of freedom of fine movement stage WFS2 or WFS1 and especially the position of fine movement stage WFS2 or WFS1 in the X-axis direction, the Y-axis direction, and the Z-axis direction can be measured with high precision, without any Abbe errors.

FIG. 13 shows the main configuration of the control system of exposure apparatus 100. The control system is mainly configured of main controller 20. Main controller 20 includes a workstation (or a microcomputer) and the like, and has overall control over each part of exposure apparatus 100, such as local liquid immersion device 8, coarse movement stage drive systems 51A and 51B, fine movement stage drive systems 52A and 52B, and relay stage drive system 53 and the like previously described.

In exposure apparatus 100 of the embodiment structured in the manner described above, when manufacturing a device, exposure by the step-and-scan method is performed on wafer W held by one of the fine movement stages (in this case, WFS1, as an example) held by coarse movement stage WCS1 located in exposure station 200, and a pattern of reticle R is transferred on each of a plurality of shot areas on wafer W. The exposure operation by this step-and scan method is performed by main controller 20, by repeating a movement operation between shots in which wafer stage WST1 is moved to a scanning starting position (an acceleration starting position) for exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks as a reference) that has been performed beforehand, and results of reticle alignment and the like. Incidentally, the exposure operation described above is performed, in a state where liquid Lq is held in a space between tip lens 191 and wafer W, or more specifically, by liquid immersion exposure. Further, exposure is performed in the following order, from the shot area located on the +Y side on wafer W to the shot area located on the −Y side. Incidentally, details on EGA are disclosed in, for example, U.S. Pat. No. 4,780,617 and the like.

In exposure apparatus 100 of the embodiment, during the series of exposure operations described above, main controller 20 measures the position of fine movement stage WFS1 (wafer W) using fine movement stage position measurement system 70A, and the position of wafer W is controlled based on the measurement results.

Incidentally, while wafer W has to be driven with high acceleration in the Y-axis direction at the time of scanning exposure operation described above, in exposure apparatus 100 of the embodiment, main controller 20 scans wafer W in the Y-axis direction by driving (refer to the black arrow in FIG. 12A) only fine movement stage WFS1 in the Y-axis direction (and in directions of the other five degrees of freedom, if necessary), without driving coarse movement stage WCS1 in principle at the time of scanning exposure operation as shown in FIG. 12A. This is because when moving only fine movement stage WFS1, weight of the drive object is lighter when comparing with the case where coarse movement stage WCS1 is driven, which allows an advantage of being able to drive wafer W with high acceleration. Further, because position measuring accuracy of fine movement stage position measurement system 70A is higher than wafer stage position measurement system 16A as previously described, it is advantageous to drive fine movement stage WFS1 at the time of scanning exposure. Incidentally, at the time of this scanning exposure, coarse movement stage WCS1 is driven to the opposite side of fine movement stage WFS1 by an operation of a reaction force (refer to the outlined arrow in FIG. 12A) by the drive of fine movement stage WFS1. More specifically, because coarse movement stage WCS1 functions as a countermass, momentum of the system consisting of the entire wafer stage WST1 is conserved, and centroid shift does not occur, inconveniences such as unbalanced load acting on base board 12 by the scanning drive of fine movement stage WFS1 do not occur.

Meanwhile, when movement (stepping) operation between shots in the X-axis direction is performed, because movement capacity in the X-axis direction of fine movement stage WFS1 is small, main controller 20 moves wafer W in the X-axis direction by driving coarse movement stage WCS1 in the X-axis direction as shown in FIG. 12B.

In parallel with exposure to wafer W on fine movement stage WFS1 described above, wafer exchange, wafer alignment, and the like are performed on the other fine movement stage WFS2. Wafer exchange is performed, by unloading wafer W which has been exposed from above fine movement stage WFS2 by chuck unit 102 and wafer carrier arm 118, as well as loading a new wafer W on fine movement stage WFS2 when coarse movement stage WCS2 supporting fine movement stage WFS2 is at a predetermined wafer exchange position (a position below chuck unit 102 previously described) in the vicinity of measurement station 300.

Now, the wafer exchange will be described in detail. Incidentally, the suction and the release of the suction of the wafer by the wafer holder will be described further in detail later on; therefore, the operation of chuck unit 102 at the time of wafer exchange will be mainly described.

As a premise of beginning the wafer exchange, fine movement stage WFS2 holding wafer W which has been exposed is to be at the wafer exchange position under chuck unit 102, being supported by coarse movement stage WCS2 (refer to FIG. 3).

Figure 14A:
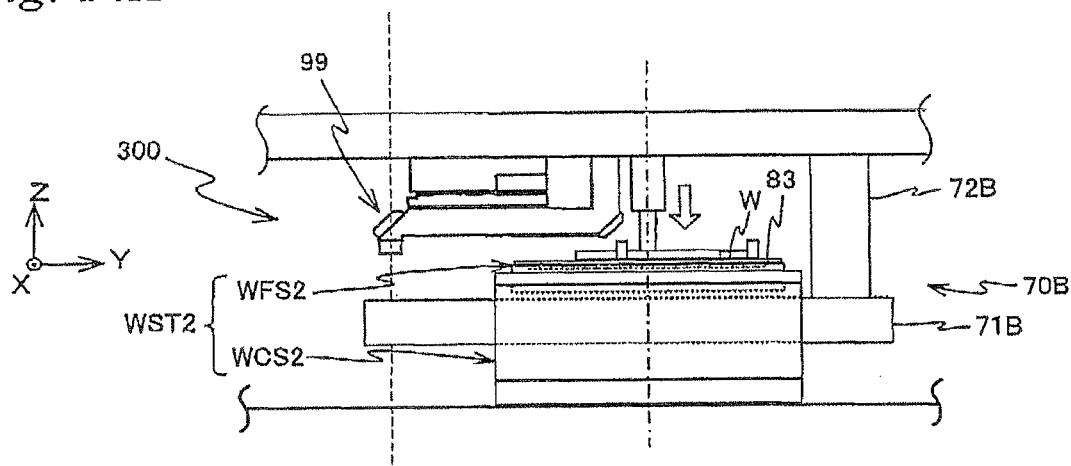
FIGS. 14A to 14C are views used to explain a procedure of unloading a wafer in the exposure apparatus of the first embodiment, and are views showing a state where the vicinity of a chuck unit in the measurement station is viewed from the side.

First of all, main controller 20 controls drive section 104 of chuck unit 102, and drives Bernoulli chuck 108 downward (refer to FIG. 14A). During this drive, main controller 20 monitors the measurement values of gap sensor 112. And when the measurement value of gap sensor 112 reaches a predetermined value, such as, for example, around several μm, main controller 20 stops the downward drive of Bernoulli chuck 108, and adjusts the flow rate of the air the blowing out from Bernoulli chuck 108 so as to maintain the gap of several μm. This allows wafer W to be held by suction in a non-contact manner from above by Bernoulli chuck 108, via a clearance of around several μm (refer to FIG. 15A).

Figure 14B:
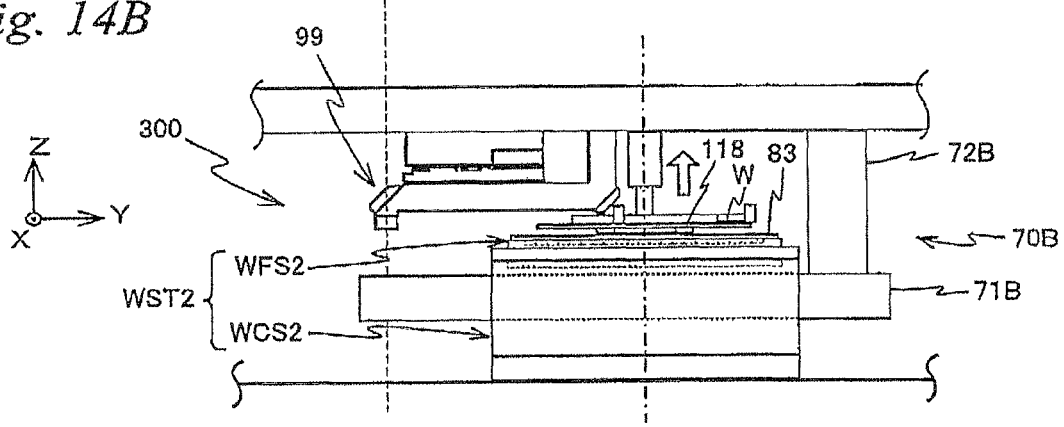

Then, main controller 20 controls drive section 104 and drives Bernoulli chuck 108 upward which holds wafer W by suction in a non-contact manner (refer to FIG. 14B). And then, main controller 20 inserts wafer carrier arm 118 that has been waiting at a waiting position in the vicinity of the wafer exchange position below wafer W held by Bernoulli chuck 108 (refer to FIGS. 14B and 15B), and drives Bernoulli chuck 108 slightly upward, after having released the suction of Bernoulli chuck 108. This allows wafer W to be held by wafer carrier arm 118 from below.

Figure 14C:
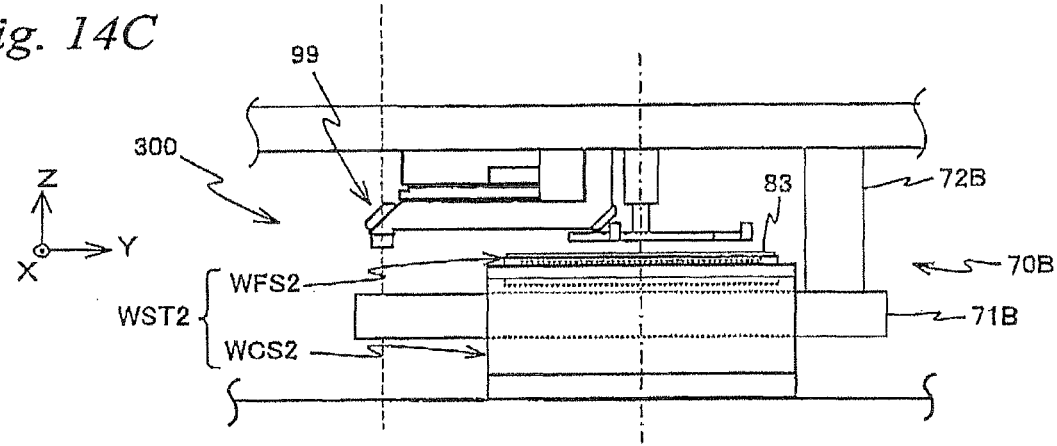
Figure 15A:
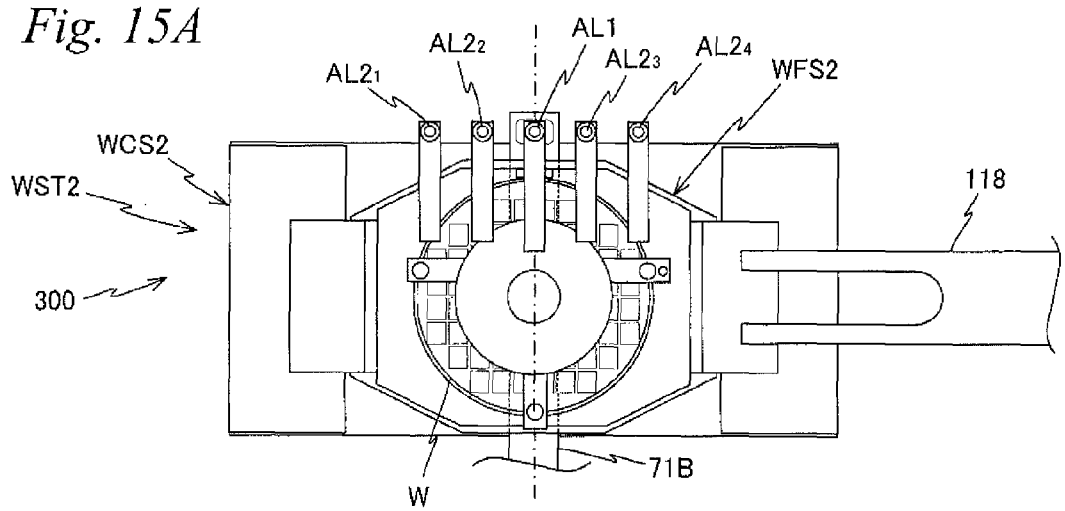
FIGS. 15A to 15C are views used to explain a procedure of unloading a wafer in the exposure apparatus of the first embodiment, and are views showing a state where the vicinity of a chuck unit in the measurement station is viewed from above.
Figure 15B:
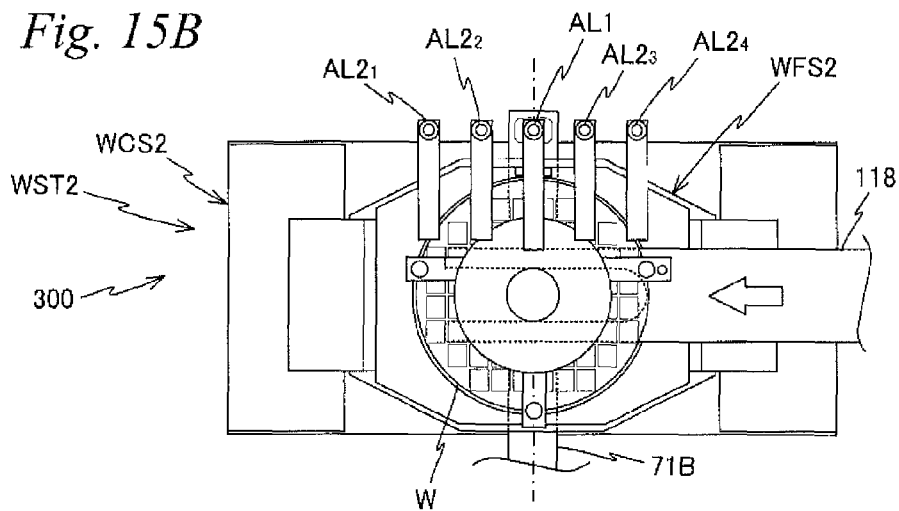
Figure 15C:
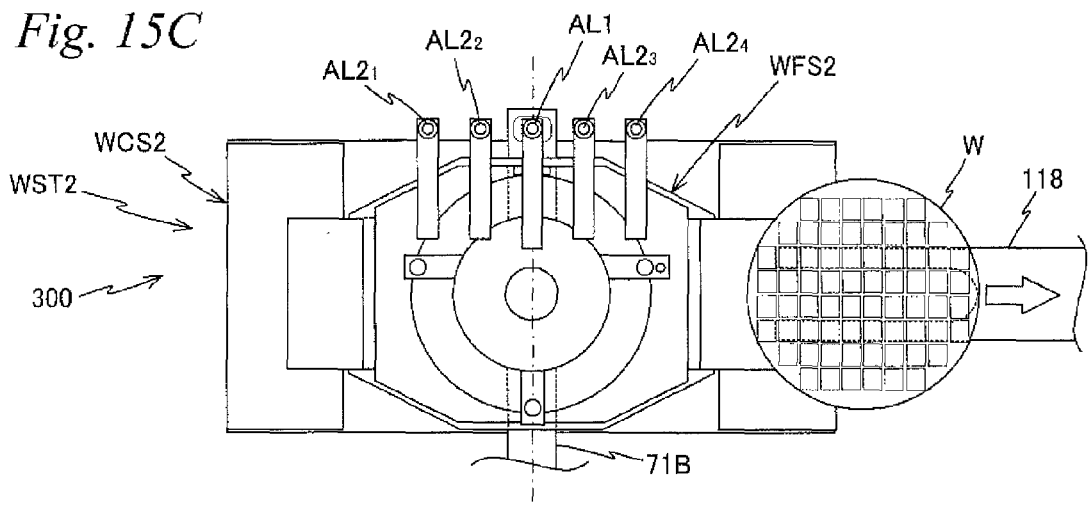

Then, main controller 20 carries wafer W to a wafer unload position (for example, a delivery position (unloading side) of the wafer between a coater developer) which is away in the +X direction from the wafer exchange position from below, via wafer carrier arm 118, and mounts wafer W on the wafer unload position. FIG. 15C shows a state where wafer carrier arm 118 moves away from the wafer exchange position, and FIG. 14C shows a state where wafer carrier arm 118 is distanced away from the wafer exchange position.

Then, loading of a new wafer W (which has not yet been exposed) onto fine movement stage WFS2 is performed by main controller 20 roughly in a reversed procedure of the unloading described above. More specifically, main controller 20 controls wafer carrier arm 118, and carries wafer W which is at the wafer loading position (for example, a delivery position (loading side) of the wafer between the coater developer) to the wafer exchange position under chuck unit 102, using wafer carrier arm 118.

Then, main controller 20 drives Bernoulli chuck 108 slightly downward, and begins the suction of wafer W by Bernoulli chuck 108. And then, main controller 20 drives Bernoulli chuck 108 that has suctioned wafer W slightly upward, and makes wafer carrier arm 118 withdraw to the waiting position previously described.

Then, main controller 20 adjusts the position (including the θz rotation) in the XY plane of fine movement stage WFS2 via fine movement stage drive system 52B (and coarse movement stage drive system 51B), while monitoring the measurement values of relative position measuring instrument 22B and wafer stage position measurement system 16B, so that positional shift and rotational error of wafer W are corrected, based on information on positional shift in the X-axis direction and the Y-axis direction and rotational error of wafer W which is sent from signal processing system 116 previously described.

Then, main controller 20 drives Bernoulli chuck 108 downward to a position until the back surface of wafer W comes in contact with the wafer holder of fine movement stage WFS2, and drives Bernoulli chuck 108 upward by a predetermined amount, after having released the suction of Bernoulli chuck 108. This allows a new wafer W to be loaded on fine movement stage WFS2. Then, alignment is performed with respect to the new wafer W.

On wafer alignment, first of all, main controller 20 drives fine movement stage WFS2 so as to position measurement plate 86 on fine movement stage WFS2 right under primary alignment system AL1, and detects the second fiducial mark using primary alignment system AL1. Then, as disclosed in, for example, U.S. Patent Application Publication No. 2008/0088843 and the like, for example, main controller 20 can move wafer stage WST2 in the −Y direction and position wafer stage WST at a plurality of points on the movement path, and each time the position is set, detects positional information of the alignment marks in the alignment shot area (sample shot area), using at least one of alignment systems AL1, and AL2$_1$ to AL2$_4$. For example, in the case of considering a case where positioning is performed four times, main controller 20, for example, uses primary alignment system AL1 and secondary alignment systems AL2$_2$ and AL2$_3$ at the time of the first positioning to detect alignment marks (hereinafter also referred to as sample marks) in three sample shot areas, uses alignment systems AL1, and AL2$_1$ to AL2$_4$ at the time of the second positioning to detect five sample marks on wafer W, uses alignment systems AL1, and AL2$_1$ to AL2$_4$ at the time of the third positioning to detect five sample marks, and uses primary alignment system AL1, and secondary alignment systems AL2$_2$ and AL2$_3$ at the time of the fourth positioning to detect three sample marks, respectively. Accordingly, positional information of alignment marks in a total of 16 alignment shot areas can be obtained in a remarkably shorter period of time, compared with the case where the 16 alignment marks are sequentially detected with a single alignment system. In this case, each of alignment systems AL1, AL2$_2$ and AL2$_3$ detects a plurality of alignment marks (sample marks) arrayed along the Y-axis direction that are sequentially placed within the detection area (e.g. corresponding to the irradiation area of the detection light), corresponding with the movement operation of wafer stage WST2 described above. Therefore, on the measurement of the alignment marks described above, it is not necessary to move wafer stage WST2 in the X-axis direction.

In the embodiment, main controller 20 performs position measurement including the detection of the second fiducial marks, and in the case of the wafer alignment, performs position measurement of fine movement stage WFS2 in the XY plane supported by coarse movement stage WCS2 at the time of the wafer alignment, using fine movement stage position measurement system 70B including measurement arm 71B. However, besides this, wafer alignment can be performed while measuring the position of wafer W via wafer stage position measurement system 16B previously described, in the case of performing the movement of fine movement stage WFS2 at the time of wafer alignment integrally with coarse movement stage WCS2. Further, because measurement station 300 and exposure station 200 are arranged apart, the position of fine movement stage WFS2 is controlled on different coordinate systems at the time of wafer alignment and at the time of exposure. Therefore, main controller 20 converts array coordinates of each shot area on wafer W acquired from the wafer alignment into array coordinates which are based on the second fiducial marks.

While wafer alignment to wafer W held by fine movement stage WFS2 is completed in the manner described above, exposure of wafer W which is held by fine movement stage WFS1 in exposure station 200 is still being continued. FIG. 16A shows a positional relation of coarse movement stages WCS1, WCS2 and relay stage DRST at the stage when wafer alignment to wafer W has been completed.

Main controller 20 drives wafer stage WST2 by a predetermined distance in the −Y direction via coarse movement stage drive system 51B, as shown in an outlined arrow in FIG. 16B, and makes wafer stage WST2 be in contact or be in proximity by around 500 μm to relay stage DRST which is standing still at a predetermined waiting position (substantially coincides with a center position between an optical axis AX of projection optical system PL and a detection center of primary alignment system AL1).

Next, main controller 20 controls the current flowing in YZ coils of fine movement stage drive systems 52B and 52C so as to drive fine movement stage WFS2 in the −Y direction by an electromagnetic force (a Lorentz force), as is shown by the black arrow in FIG. 16C, and moves fine movement stage WFS2 from coarse movement stage WCS2 onto relay stage DRST. FIG. 16D shows a state where fine movement stage WFS2 has been moved and mounted on relay stage DRST.

Main controller 20 waits for the exposure to wafer W on fine movement stage WFS1 to be completed, in a state where relay stage DRST and coarse movement stage WCS2 are waiting at a position shown in FIG. 16D.

Figure 18:
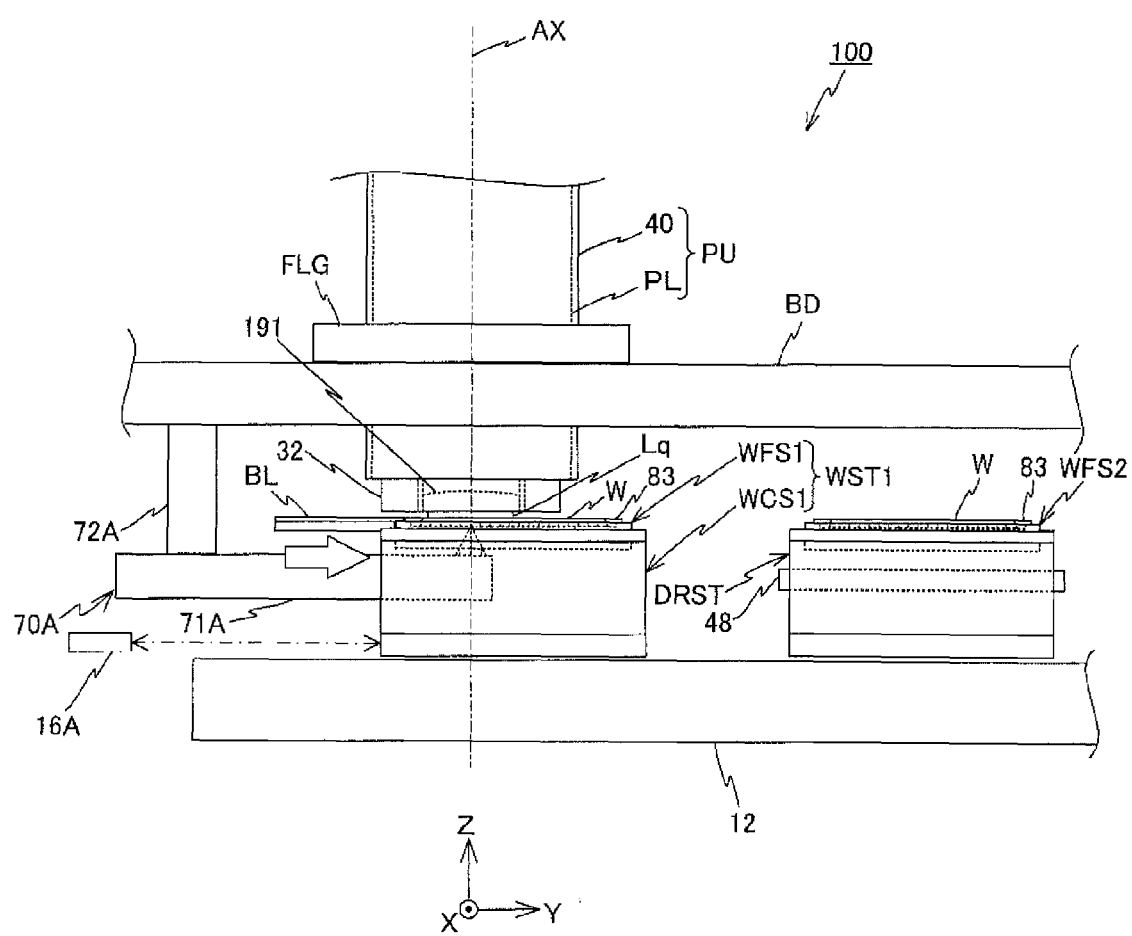

FIG. 18 shows a state of wafer stage WST1 immediately after completing the exposure.

Figure 17:
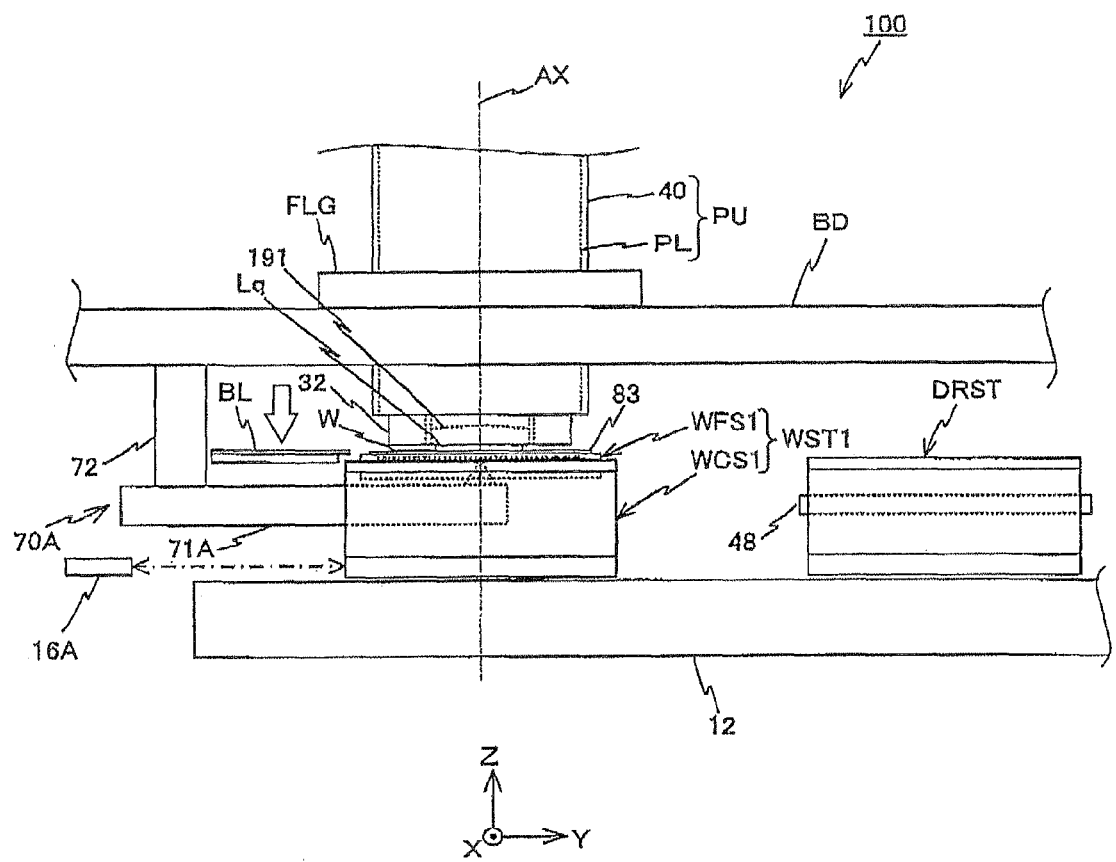
FIG. 17 is a view used to explain a delivery of a liquid immersion space area (liquid Lq) performed between a fine movement stage and a movable blade (No. 1)

Prior to the completion of exposure, main controller 20 drives movable blade BL downward by a predetermined amount from a state shown in FIG. 5 via blade drive system 58 as is shown by an outlined arrow in FIG. 17. By this drive, the upper surface of movable blade BL is positioned to be flush with the upper surface of fine movement stage WFS1 (and wafer W) located below projection optical system PL, as shown in FIG. 17. Then, main controller 20 waits for the exposure to be completed in this state.

Then, when exposure has been completed, main controller 20 drives movable blade BL in the +Y direction by a predetermined amount (refer to the outlined arrow in FIG. 18) via blade drive system 58, so as to make movable blade BL be in contact or in proximity by a clearance of around 300 μm to fine movement stage WFS1. More specifically, main controller 20 sets movable blade SL and fine movement stage WFS1 to a scrum state.

Figure 19:
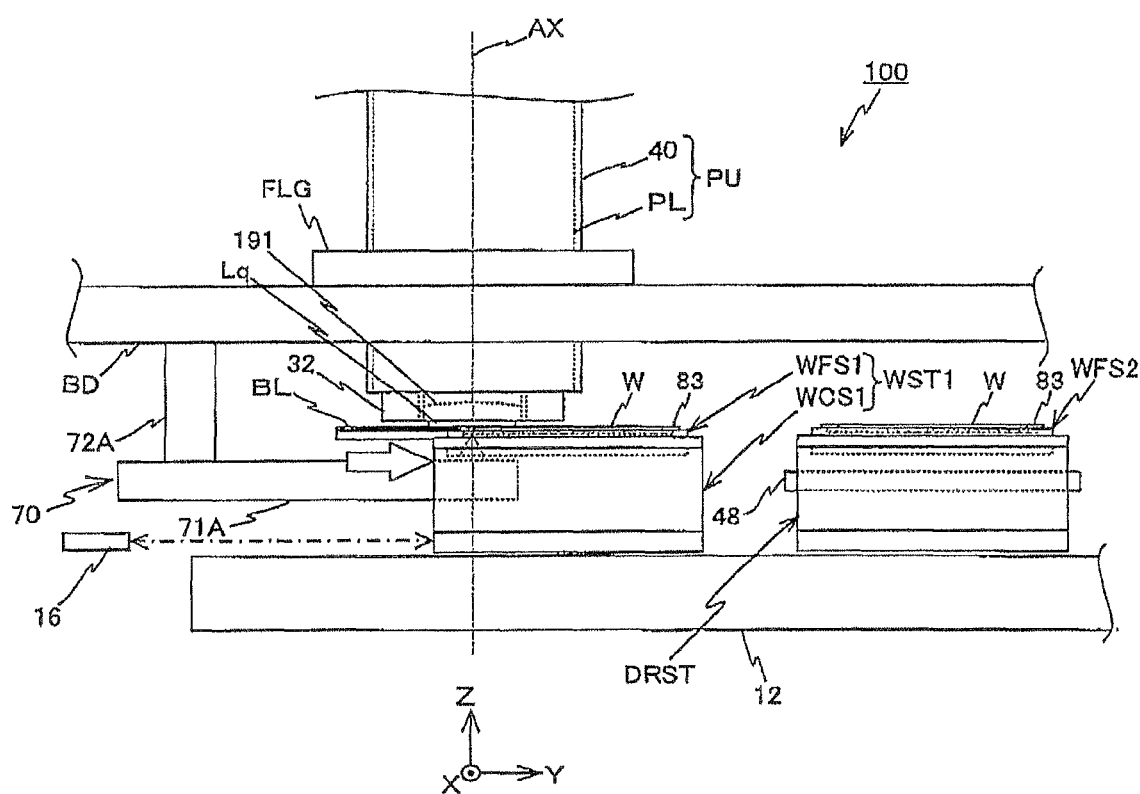
FIG. 19 is a view used to explain a delivery of a liquid immersion space area (liquid Lq) performed between a fine movement stage and a movable blade (No. 2)

Next, as shown in FIG. 19, main controller 20 drives movable blade BL in the +Y direction (refer to the outlined arrow in FIG. 19) integrally with wafer stage WST1, while maintaining a scrum state between movable blade BL and fine movement stage WFS1. By this operation, the liquid immersion space area (liquid Lq), which is formed by liquid Lq held between tip lens 191 and fine movement stage WFS1, is passed from fine movement stage WFS1 to movable blade BL. FIG. 19 shows a state just before the liquid immersion space area formed by liquid Lq is passed from fine movement stage WFS1 to movable blade BL. In the state shown in FIG. 19, liquid Lq is held between tip lens 191, and fine movement stage WFS1 and movable blade BL. Incidentally, in the case of driving movable blade BL and fine movement stage WFS1 in proximity, it is desirable to set a gap (clearance) between movable blade BL and fine movement stage WFS1 so as to prevent or to suppress leakage of liquid Lq.

Figure 20:
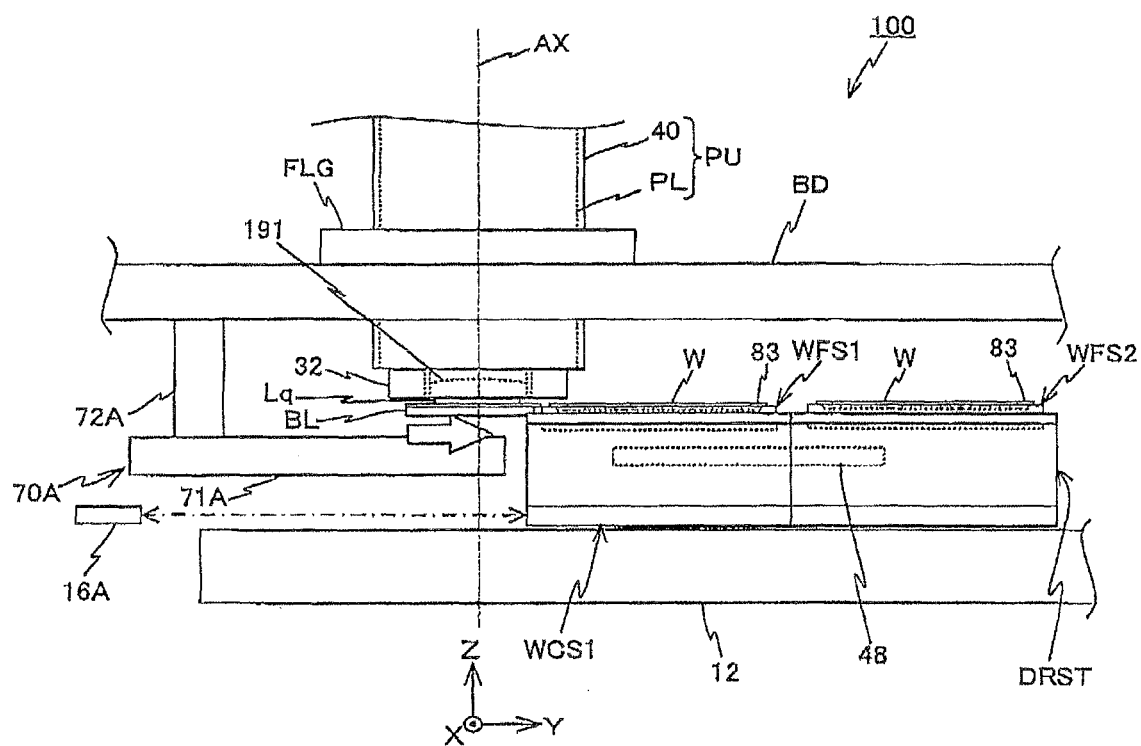
FIG. 20 is a view used to explain a delivery of a liquid immersion space area (liquid Lq) performed between a fine movement stage and a movable blade (No. 4)

Then, when the liquid immersion space area has been passed from fine movement stage WFS1 to movable blade BL, as shown in FIG. 20, coarse movement stage WCS1 holding fine movement stage WFS1 comes into contact or in proximity by a clearance of around 300 μm to relay stage DRST waiting in a proximity state with coarse movement stage WCS2, holding fine movement stage WFS2 at the waiting position previously described. During the stage where coarse movement stage WCS1 holding fine movement stage WFS1 moves in the +Y direction, main controller 20 inserts carrier member 48 of carrier apparatus 46 into the space of coarse movement stage WCS1, via carrier member drive system 54.

And, at the point when coarse movement stage WCS1 holding fine movement stage WFS1 comes into contact or in proximity to relay stage DRST, main controller 20 drives carrier member 48 upward so that fine movement stage WFS1 is supported from below.

And, in this state, main controller 20 releases the lock mechanism (not shown) and separates coarse movement stage WCS1 into the first section WCS1a and the second section WCS1b. By this operation, fine movement stage WFS1 is detachable from coarse movement stage WCS1. Then, main controller 20 drives carrier member 48 supporting fine movement stage WFS1 downward, as is shown by the outlined arrow in FIG. 21A.

And then, main controller 20 locks the lock mechanism (not shown) after the first section WCS1a and the second section WCS1b are joined together. Next, main controller 20 moves carrier member 48 which supports fine movement stage WFS1 from below to the inside of stage main section 44 of relay stage DRST. FIG. 21B shows the state where carrier member 48 is being moved. Further, concurrently with the movement of carrier member 48, main controller 20 controls the current flowing in Y drive coils of fine movement stage drive systems 52C and 52A, and drives fine movement stage WFS2 in the −Y direction as is shown by the black arrow in FIG. 21B by an electromagnetic force (a Lorentz force), and moves (a slide movement) fine movement stage WFS2 from relay stage DRST onto coarse movement stage WCS1.

Further, after housing the carrier member main section of carrier member 48 into the space of relay stage DRST so that fine movement stage WFS1 is completely housed in the space of relay stage DRST, main controller 20 moves the movable member holding fine movement stage WFS1 in the +Y direction on the carrier member main section (refer to the outlined arrow in FIG. 21C).

Next, main controller 20 moves coarse movement stage WCS1 which holds fine movement stage WFS2 in the −Y direction, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade BL previously described.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS2 and the like. FIG. 21D shows fine movement stage WFS2 during reticle alignment, along with coarse movement stage WCS1 holding the fine movement stage. Then, main controller 20 performs exposure operation by the step-and-scan method, based on results of the reticle alignment and the results of the wafer alignment (array coordinates which uses the second fiducial marks of each of the shot areas on wafer W) and transfers the pattern of reticle R on each of the plurality of shot areas on wafer W. As is obvious from FIGS. 21E and 21F, in this exposure, fine movement stage WFS2 is returned to the −X side after reticle alignment, and then exposure is performed in the order from shot areas on the +Y side on wafer W to the shot areas on the −Y side.

Concurrently with the delivery of the liquid immersion space area, reticle alignment, and exposure described above, the following operations are performed.

More specifically, as shown in FIG. 21D, main controller 20 moves carrier member 48 holding fine movement stage WFS1 into the space of coarse movement stage WCS2. At this point, with the movement of carrier member 48, main controller 20 moves the movable member holding fine movement stage WFS1 on the carrier member main section in the +Y direction.

Next, main controller 20 releases the lock mechanism (not shown), and separates coarse movement stage WCS2 into the first section WCS2a and the second section WCS2b, and also drives carrier member 48 holding fine movement stage WFS1 upward as is shown by the outlined arrow in FIG. 21E so that each of the pair of mover sections equipped in fine movement stage WFS1 are positioned at a height where the pair of mover sections are engageable with the pair of stator sections of coarse movement stage WCS2.

And then, main controller 20 brings together the first section WCS2a and the second section WCS2b of coarse movement stage WCS2. By this, fine movement stage WFS1 holding wafer W which has been exposed is supported by coarse movement stage WCS2. Therefore, main controller 20 locks the lock mechanism (not shown).

Next, main controller 20 drives coarse movement stage WCS2 supporting fine movement stage WFS1 in the +Y direction as shown by the outlined arrow in FIG. 21F, and moves coarse movement stage WCS2 to measurement station 300.

Then, by main controller 20, on fine movement stage WFS1, wafer exchange, detection of the second fiducial marks, wafer alignment and the like are performed, in procedures similar to the ones previously described.

Then, main controller 20 converts array coordinates of each shot area on wafer W acquired from the wafer alignment into array coordinates which are based on the second fiducial marks. In this case as well, position measurement of fine movement stage WFS1 on alignment is performed, using fine movement stage position measurement system 70B.

While wafer alignment to wafer W held by fine movement stage WFS1 is completed in the manner described above, exposure of wafer W which is held by fine movement stage WFS2 in exposure station 200 is still being continued.

Then, in a manner similar to the previous description, main controller 20 moves fine movement stage WFS1 to relay stage DRST. Main controller 20 waits for the exposure to wafer W on fine movement stage WFS2 to be completed, in a state where relay stage DRST and coarse movement stage WCS2 are waiting at the waiting position previously described.

Hereinafter, a similar processing is repeatedly performed, alternately using fine movement stages WFS1 and WFS2, and an exposure processing to a plurality of wafer Ws is continuously performed.

Figure 22A:
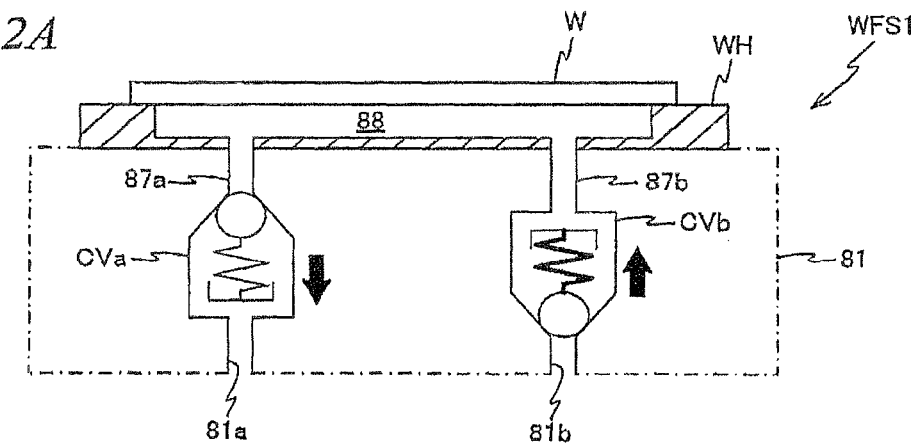
FIGS. 22A to 22C are views used to explain suction of wafer W by a wafer holder and release of the suction.

Next, suction of wafer W by the wafer holder and release of the suction will be described. FIG. 22A schematically shows a configuration of fine movement stage WFS1. Incidentally, although FIGS. 22A to 22C show fine movement stage WFS1, fine movement stage WFS2 is also configured in a similar manner.

As shown in FIG. 22A, a suction opening section 81a is formed in main body section 81 of fine movement stage WFS. The position of suction opening section 81a is not restricted in particular, and can be formed, for example, on the side surface, the lower surface and the like of main body section 81. Further, inside main body section 81, an opening formed at the bottom section of wafer holder WH, and a piping member 87a, which makes an outer space communicate with a decompression chamber 88 formed in between wafer holder WH and the back surface of wafer W via suction opening section 81a, are provided. Along the pipe line of piping member 87a, a check valve CVa is placed. Check valve CVa maintains a decompressed state of decompression chamber 88, by restricting a direction in which the gas flows within piping member 87 to one direction (refer to the black arrows in FIG. 22A), from decompression chamber 88 to the outer space, or more specifically, by keeping gas with higher pressure than the gas within decompression chamber 88 from flowing inside decompression chamber 88 from the outer space.

Figure 22B:
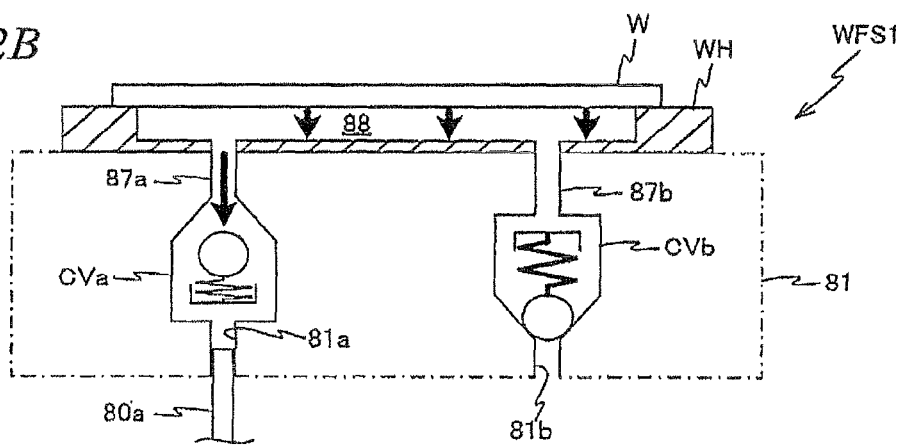
Figure 22C:
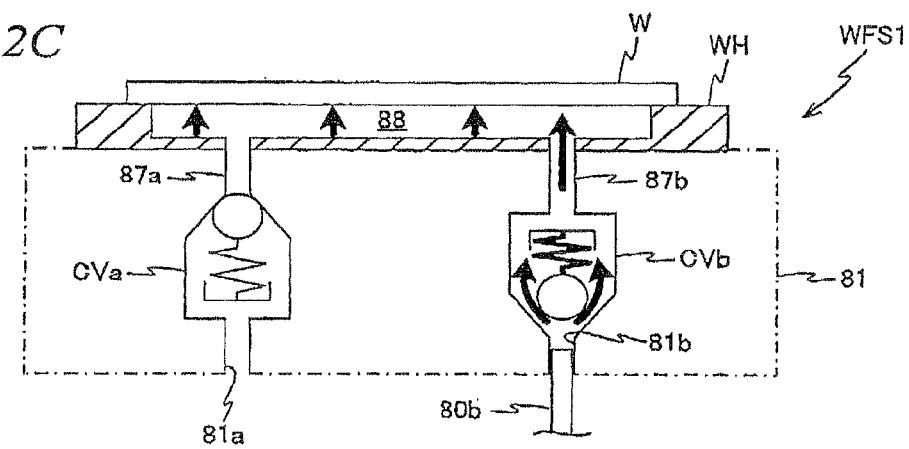

Further, exposure apparatus 100 has a suction piping 80a, which is positioned so that when wafer stage WST1 (or WST2) is positioned at the wafer exchange position shown in FIG. 3 to exchange wafer W using chuck unit 102, one end of suction piping 80a would be inserted into piping member 87a via suction opening section 81a, as shown in FIGS. 22B and 22C. The other end of suction piping 80a is connected to a vacuum pump (not shown). When wafer W is mounted on wafer holder WH, main controller 20 (refer to FIG. 13) controls the vacuum pump and absorbs the gas within decompression chamber 88. Suction piping 80a and piping member 87a are tightly sealed together by an O-ring (not shown) and the like. This makes the pressure in decompression chamber 88 lower than the pressure of the outer space, and wafer W is held by suction by wafer holder WH. Further, when the pressure inside decompression chamber 88 reaches a predetermined pressure, main controller 20 stops the suction of gas of decompression chamber 88 by the vacuum pump. After this, even if wafer stage WST1 (or WST2) moves from the wafer exchange position and suction piping 80a is pulled out from piping member 87a, because the pipe line of piping member 87a is blocked along the line by check valve CVa, the decompressed state of decompression chamber 88 is maintained, and the state where wafer W is held by suction by wafer holder WH is maintained.

Further, because the decompressed state of decompression chamber 88 is maintained by check valve CVa, it is not necessary, for example, to connect a piping neither (e.g., a tube) to fine movement stages WFS1 and WFS2 in order to suction the gas within decompression chamber 88. Accordingly, fine movement stages WFS1 and WFS2 become detachable from coarse movement stages WCS1 and WCS2, and delivery and the like of fine movement stage WFS1 (or WFS2) between the two coarse movement stages WCS1 and WCS2 and relay stage DRST can be performed without any trouble.

Further, because holding wafer W using Bernoulli chuck 108 (refer to FIG. 3) becomes difficult at the time of unloading wafer W when the decompressed state of decompression chamber 88 is constantly maintained, a piping member 87b is provided in main body section 81 as shown in FIG. 22A so that the decompressed state of decompression chamber 88 can be released. Piping member 87b, similar to piping member 87a, has decompression chamber 88 communicate with the outer space, via the opening formed at the bottom section of wafer holder WH and a release opening section 81b formed in main body section 81. The position of release opening section 81b is not restricted in particular, and can be formed, for example, on the side surface, the lower surface and the like of main body section 81. Along the pipe line of piping member 87b, a check valve CVb is placed. Check valve CVb restricts a direction in which the gas flows within piping member 87b to one direction (refer to the black arrow in FIG. 22A), from the outer space to decompression chamber 88. Incidentally, in a spring which energizes a valve member (in FIGS. 22A to 22C, e.g., a ball) of check valve CVb to a closed position, a spring constant is set so that the valve member does not move (so that the check valve is not opened in a state shown in FIG. 22B) to an open position in a state (a state shown in FIG. 22A) where decompression chamber 88 is a decompressed space.

Further, exposure apparatus 100 has a gas supply piping 80b, which is positioned so that when wafer stage WST1 (or WST2) is positioned at the wafer exchange position shown in FIG. 3, one end of gas supply piping 80b would be inserted into piping member 87b from release opening section 81b, as shown in FIGS. 22B and 22C. The other end of gas supply piping 80b is connected to a gas supply device (not shown). On unloading wafer W, main controller 20 controls the gas supply device so that a high pressure gas is blown into piping member 87b. This turns check valve CVb into an open state, which introduces the high pressure gas into decompression chamber 88, which in turn releases the suction of wafer W by wafer holder WH. Further, because the gas introduced into decompression chamber 88 from the gas supply device blows out from below wafer W toward the rear surface of wafer W, the weight of wafer W itself is canceled out. In other words, the gas supply device assists Bernoulli chuck 108 in the holding (lifting) operation of wafer W. Accordingly, the suction holding force of the wafer by the Bernoulli chuck can be small, which allows the size of chuck unit 102 to be reduced. Incidentally, in the case of using a wafer holder that holds the wafer by electrostatic chucking as the wafer holder, a rechargeable battery can be installed in the fine movement stage, and the battery can be recharged along with the wafer exchange at the wafer exchange position shown in FIG. 3. In this case, a receiving terminal can be provided in the fine movement stage, and in the vicinity of the wafer exchange position, a feeding terminal can be placed, which is positioned so that the terminal electrically connects to the receiving terminal described above when the wafer stage is positioned at the wafer exchange position.

As is described in detail above, according to exposure apparatus 100 of the embodiment, when fine movement stage WFS2 (or WFS1) which holds wafer W is located at the wafer exchange position below chuck unit 102, wafer W can be held in a non-contact manner from above by Bernoulli chuck 108 of chuck unit 102, and can be carried from fine movement stage WFS2 (or WFS1). Therefore, a notch to house an arm and the like used when unloading wafer W from fine movement stage WFS2 (or WFS1) does not have to be formed in the wafer holder on fine movement stage WFS2 (or WFS1). Further, wafer W can be held in a non-contact manner from above by Bernoulli chuck 108, and can be loaded onto fine movement stage WFS2 (or WFS1). Therefore, a notch to house an arm and the like used when loading wafer W onto fine movement stage WFS2 (or WFS1) does not have to be formed in the wafer holder on fine movement stage WFS2 (or WFS1). Further, according to exposure apparatus 100 of the embodiment, a vertical movement member (also called a center-up or a center table) for delivering the wafer does not have to be arranged in fine movement stage WFS2 (or WFS1). Accordingly, it becomes possible for the wafer holder on fine movement stage WFS1 (or WFS2) to hold wafer W by suction in a uniform manner across the entire surface including the shot areas in the periphery, which makes it possible to favorably maintain the degree of flatness of wafer W across the entire surface.

Further, according to exposure apparatus 100 of the present embodiment, on a plane substantially parallel to the XY plane of fine movement stages WFS1 and WFS2, a measurement plane on which grating RG is formed is arranged, respectively. Fine movement stage WFS1 (or WFS2) is held relatively movable along the XY plane by coarse movement stage WCS1 (or WCS2). And, fine movement stage position measurement system 70A (or 70B) has X head 77$x$, and Y heads 77$ya$ and 77$yb$ that are placed inside the space of coarse movement stage WCS1 facing the measurement plane on which grating RG is formed and irradiate a pair of measurement beams LBx$_1$ and LBx$_2$, LBya$_1$ and LBya$_2$, and LByb$_1$ and LByb$_2$, respectively, on the measurement plane, and receive lights from the measurement plane of the measurement beams (e.g., synthetic beams LBx$_{12}$, LBya$_{12}$, LByb$_{12}$ of the first-order diffraction beams made by grating RG of each of the measurement beams). Then, by fine movement stage position measurement system 70A (or 70B), positional information (including rotation information in the θz direction) at least within an XY plane of fine movement stage WFS1 (or WFS2) is measured, based on an output of the heads, X head 77$x$, Y heads 77$y$1, and 77$y$2. This allows the positional information in the XY plane of fine movement stage WFS1 (or WFS2) to be measured with good precision by the so-called back surface measurement by irradiating the pair of measurement beams LBx$_1$ and LBx$_2$, LBya$_1$ and LBya$_2$, and LByb$_1$ and LByb$_2$, from X head 77$x$, Y heads 77$y$1 and 77$y$2, respectively, on the measurement plane of fine movement stage WFS1 (or WFS2) on which grating RG is formed. Then, main controller 20 drives fine movement stage WFS1 (or WFS2) alone, or integrally with WCS1 (or WCS2), based on the positional information measured by fine movement stage position measurement system 70A (or 70B) via fine movement stage drive system 52A (or fine movement stage drive system 52A and coarse movement stage drive system 51A), (or via fine movement stage drive system 52B (or fine movement stage drive system 52B and coarse movement stage drive system 51B). Further, because a vertical movement member does not have to be provided on fine movement stage as is described above, no problems occur in particular even when the back surface measurement described above is employed.

Further, in exposure apparatus 100 of the embodiment, in exposure station 200, wafer W mounted on fine movement stage WFS1 (or WFS2) held relatively movable by coarse movement stage WCS1 is exposed with exposure light IL, via reticle R and projection optical system PL. In doing so, positional information in the XY plane of fine movement stage WFS1 (or WFS2) held movable by coarse movement stage WCS1 is measured by main controller 20, using encoder system 73 of fine movement stage position measurement system 70A which has measurement arm 71A which faces grating RG placed at fine movement stage WFS1 (or WFS2). In this case, because space is formed inside coarse movement stage WCS1 and each of the heads of fine movement stage position measurement system 70A are placed in this space, there is only space between fine movement stage WFS1 and each of the heads of fine movement stage position measurement system 70A. Accordingly, each of the heads can be arranged in proximity to fine movement stage WFS1 (or WFS2) (grating RG), which allows a highly precise measurement of the positional information of fine movement stage WFS1 (or WFS2) by fine movement stage position measurement system 70A. Further, as a consequence, a highly precise drive of fine movement stage WFS1 (or WFS2) via coarse movement stage drive system 51A and/or fine movement stage drive system 52A by main controller 20 becomes possible.

Further, in this case, irradiation points of the measurement beams of each of the heads of encoder system 73 and laser interferometer system 75 configuring fine movement stage position measurement system 70A emitted from measurement arm 71A on grating RG coincide with the center (exposure position) of irradiation area (exposure area) IA of exposure light IL irradiated on wafer W. While the irradiation point of all the measurement beams does not always coincide with the exposure center here, the extent of the influence of the Abbe error is suppressible, or negligible. Accordingly, main controller 20 can measure the positional information of fine movement stage WFS1 (or WFS2) with high accuracy, without being affected by so-called Abbe error. Further, because optical path lengths in the atmosphere of the measurement beams of each of the heads of encoder system 73 can be made extremely short by placing measurement arm 71A right under grating RG, the influence of air fluctuation is reduced, and also in this point, the positional information of fine movement stage WFS1 (or WFS2) can be measured with high accuracy.

Further, in the embodiment, fine movement stage position measurement system 70B configured symmetric to fine movement stage position measurement system 70A is provided in measurement station 300. And in measurement station 300, when wafer alignment to wafer W on fine movement stage WFS2 (or WFS1) held by coarse movement stage WCS2 is performed by alignment systems AL1, and AL2$_1$ to AL2$_4$ and the like, positional information in the XY plane of fine movement stage WFS2 (or WFS1) held movable on coarse movement stage WCS2 is measured by fine movement stage position measurement system 70B with high precision. As a consequence, a highly precise drive of fine movement stage WFS2 (or WFS1) via coarse movement stage drive system 51B and/or fine movement stage drive system 52B by main controller 20 becomes possible.

Accordingly, it becomes possible to form a pattern with good accuracy on the entire surface of wafer W, for example, by exposing such wafer W using illumination light IL.

Further, according to the embodiment, the delivery of fine movement stage WFS2 (or WFS1) holding the wafer which has not yet undergone exposure from coarse movement stage WCS2 to relay stage DRST, and the delivery from relay stage DRST to coarse movement stage WCS1 are performed, by making fine movement stage WFS2 (or WFS1) perform a slide movement along an upper surface (a surface (a first surface) parallel to the XY plane including the pair of stator sections 93$a$ and 93$b$) of coarse movement stage WCS2, relay stage DRST, and coarse movement stage WCS1. Further, the delivery of fine movement stage WFS1 (or WFS2) holding the wafer which has been exposed from coarse movement stage WCS1 to relay stage DRST, and the delivery from relay stage DRST to coarse movement stage WCS1 are performed, by making fine movement stage WFS1 (or WFS2) move within the space inside coarse movement stage WCS1, relay stage DRST, and coarse movement stage WCS2, which are positioned on the −Z side of the first surface. Accordingly, the delivery of the wafer between coarse movement stage WCS1 and relay stage DRST, and coarse movement stage WCS2 and relay stage DRST can be realized by suppressing an increase in the footprint of the apparatus as much as possible.

Further, in the embodiment above, although relay stage DRST is configured movable within the XY plane, as is obvious from the description on the series of parallel processing operations previously described, in the actual sequence, relay stage DRST remains waiting at the waiting position previously described. On this point as well, an increase in the footprint of the apparatus is suppressed.

Further, according to exposure apparatus 100 of the embodiment, because fine movement stage WFS1 (or WFS2) can be driven with good precision, it becomes possible to drive wafer W mounted on this fine movement stage WFS1 (or WFS2) in synchronization with reticle stage RST (reticle R) with good precision, and to transfer a pattern of reticle R onto wafer W by scanning exposure. Further, in exposure apparatus 100 of the embodiment, because wafer exchange, alignment measurement and the like of wafer W on fine movement stage WFS2 (or WFS1) can be performed in measurement station 300, concurrently with the exposure operation performed on wafer W mounted on fine movement stage WFS1 (or WFS2) in exposure station 200, throughput can be improved when compared with the case where each processing of wafer exchange, alignment measurement, and exposure is sequentially performed.

Incidentally, in the embodiment above, the case has been described where wafer exchange on fine movement stage WFS1 or WFS2 is performed by chuck unit 102, which is equipped with Bernoulli chuck 108 driven vertically by drive section 104, and wafer carrier arm 118, working together. However, as well as this, for example, the carrier apparatus can be configured by Bernoulli chuck 108 being fixed to the tip of an arm (hereinafter shortened to a robot arm) 120 of a horizontal multijoint robot that can move vertically as in the modified example shown in FIG. 23A.

In the case of the carrier apparatus having the configuration shown in FIG. 23A, wafer exchange is performed in the following procedure.

Figure 23A:
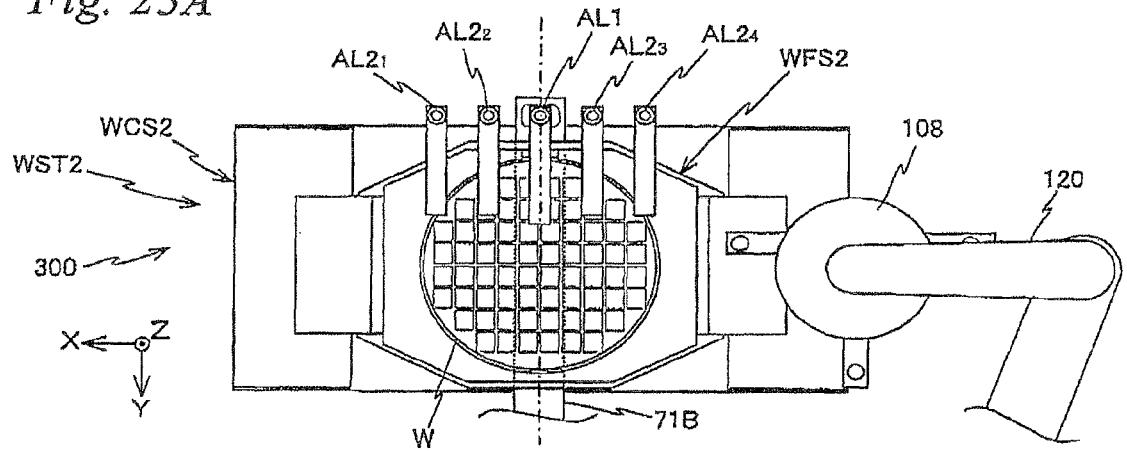
FIGS. 23A to 23C are views used to explain a first modified example of a wafer exchange device.

As a premise of beginning the wafer exchange, fine movement stage WFS2 holding wafer W which has been exposed is to be at the wafer exchange position under chuck unit 102, being supported by coarse movement stage WCS2 (refer to FIG. 23A). Further, Bernoulli chuck 108 is waiting at a predetermined waiting position (refer to FIG. 23A).

Figure 23B:
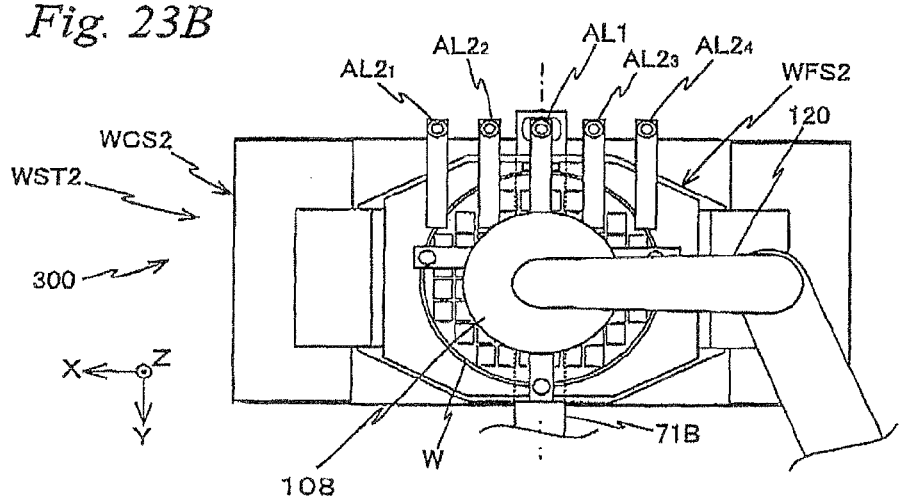

First of all, robot arm 120 is controlled by main controller 20, and Bernoulli chuck 108 is driven downward. During this drive, in a procedure similar to the one previously described, main controller 20 controls robot arm 120 and Bernoulli chuck 108 according to measurement values of a gap sensor. This allows wafer W to be held by suction in a non-contact manner from above by Bernoulli chuck 108, via a clearance of around several μm (refer to FIG. 23B).

Figure 23C:
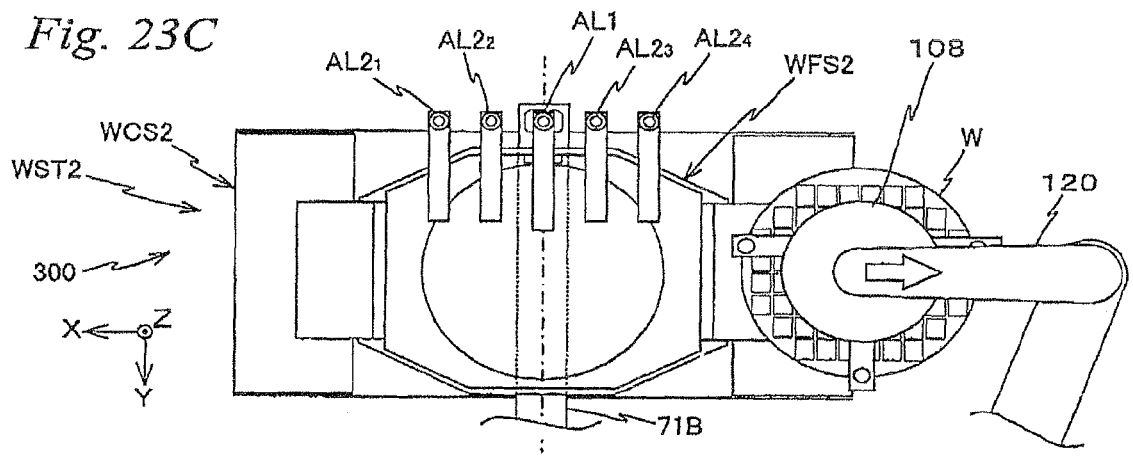

Then, robot arm 120 is controlled by main controller 20, and Bernoulli chuck 108, which holds wafer W by suction in a non-contact manner is driven within a horizontal plane, after being driven upward. This allows wafer W to be carried to a wafer unload position which is spaced apart in the +X direction from the wafer exchange position, and is mounted on the wafer unload position. FIG. 23C shows a state where robot arm 120 moves away from the wafer exchange position.

Then, loading of a new wafer W (which has not yet been exposed) onto fine movement stage WFS2 is performed (details omitted) by main controller 20 roughly in a reversed procedure of the unloading described above. In this case as well, adjustment of the position (including the θz rotation) in the XY plane of fine movement stage WFS2 via fine movement stage drive system 52B (and coarse movement stage drive system 51B) is performed by main controller 20, based on the measurement values of relative position measuring instrument 22B and wafer stage position measurement system 16B, so that positional shift and rotational error of wafer W are corrected, based on information on positional shift in the X-axis direction and the Y-axis direction and rotational error of wafer W which is sent from signal processing system 116 previously described.

Figure 24A:
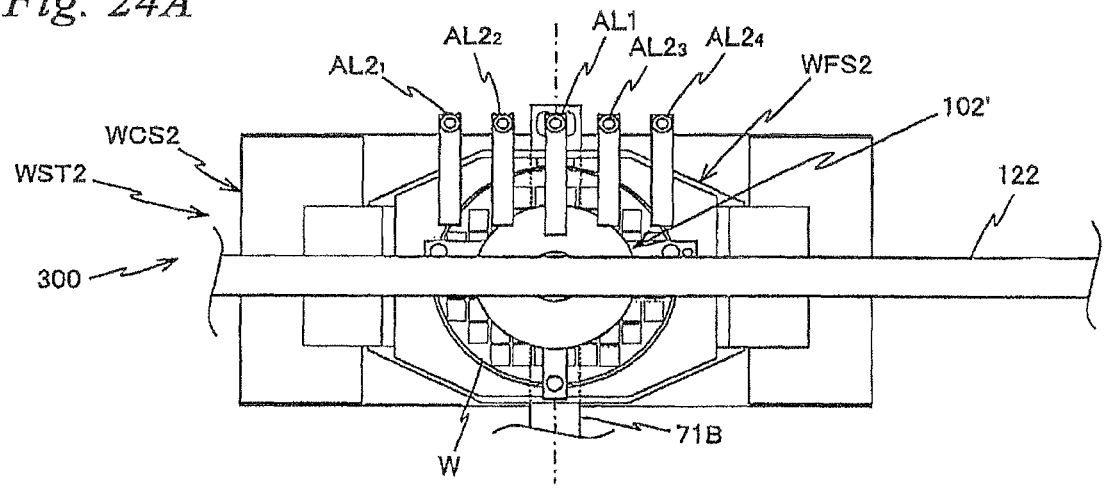
FIGS. 24A and 24B are views used to explain a second modified example of a wafer exchange device.
Figure 24B:
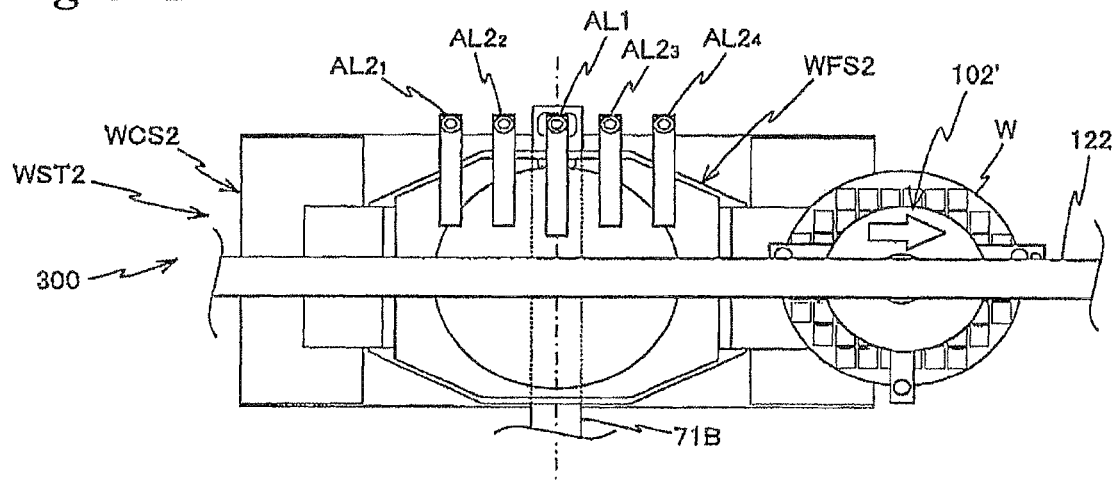

Besides this, as is shown in FIG. 24A, a chuck unit 102' (preferably lighter than chuck unit 102), which has a configuration similar to chuck unit 102, can be structured drivable along a guide 122. In the carrier apparatus related to a modified example in FIG. 24A, wafer W is held by suction (refer to FIG. 24A) in a non-contact manner from above by Bernoulli chuck 108 under the control of main controller 20, in a procedure similar to the described in the embodiment above. Then, after Bernoulli chuck 108 which holds wafer W by suction in a non-contact manner is driven upward by main controller 20, Bernoulli chuck 108 is carried toward the wafer unload position along guide 122 (refer to FIG. 24B).

Then, loading of a new wafer W (which has not yet been exposed) onto fine movement stage WFS2 is performed (details omitted) by main controller 20 roughly in a reversed procedure of the unloading described above. In this case as well, positional shift and rotational error of wafer W are corrected, as is previously described.

Incidentally, in the embodiment above, while the case has been described where three imaging devices 114a to 114c were provided to adjust positional shift and rotational error at the time wafer loading, besides this, a detection system to detect mark (or a pattern) on the wafer, such as, for example, a plurality of microscopes equipped with a CCD and the like, can be provided. In this case, the main controller can compute the positional shift and the rotational error of wafer W by detecting the position of three or more marks using the plurality of microscopes, and performing a predetermined statistical computation using the detection results.

Further, in the first embodiment above, while the case has been described where the apparatus is equipped with relay stage DRST, in addition to coarse movement stages WCS1 and WCS2, relay stage DRST does not necessarily have to be provided (for example, refer to a second and third embodiment which will be described later on). In this case, for example, the fine movement stage can be delivered between coarse movement stage WCS2 and coarse movement stage WCS1 directly, or, for example, the fine movement stage can be delivered to coarse movement stages WCS1 and WCS2, using a robot arm and the like. In the former case, for example, a carrier mechanism, which delivers the fine movement stage to coarse movement stage WCS1 and then receives the fine movement stage and delivers the fine movement stage to an external carrier system (not shown) from coarse movement stage WCS1, can be provided in coarse movement stage WCS2. In this case, the external carrier system can attach the fine movement stage holding the wafer to coarse movement stage WCS2. In the case the relay stage is not arranged, this allows the footprint of the apparatus to be reduced.

In the first embodiment above, in the relay stage DRST and coarse movement stage WCS1 (or WCS2) are made to be in proximity to replace fine movement stages WFS1 and WFS2 between the two coarse movement stages WCS1 and WCS2, relay stage DRST and coarse movement stage WCS1 (or WCS2) do not have to be extremely close. Relay stage DRST and coarse movement stage WCS1 (or WCS2) can be distanced within a range where fine movement stage is not tilted greatly (that is, the stator and the mover of the linear motor do not come into contact) at the time of movement of the fine movement stage between relay stage DRST and coarse movement stage WCS1 (or WCS2).

A Second Embodiment

Hereinafter, a second embodiment of the present invention will be described, with reference to FIGS. 25 to 41C. Here, from a viewpoint of avoiding repetition, the same or similar reference numerals will be used for the same or similar sections as in the first embodiment previously described, and a detailed description thereabout will be simplified or omitted.

Figure 25:
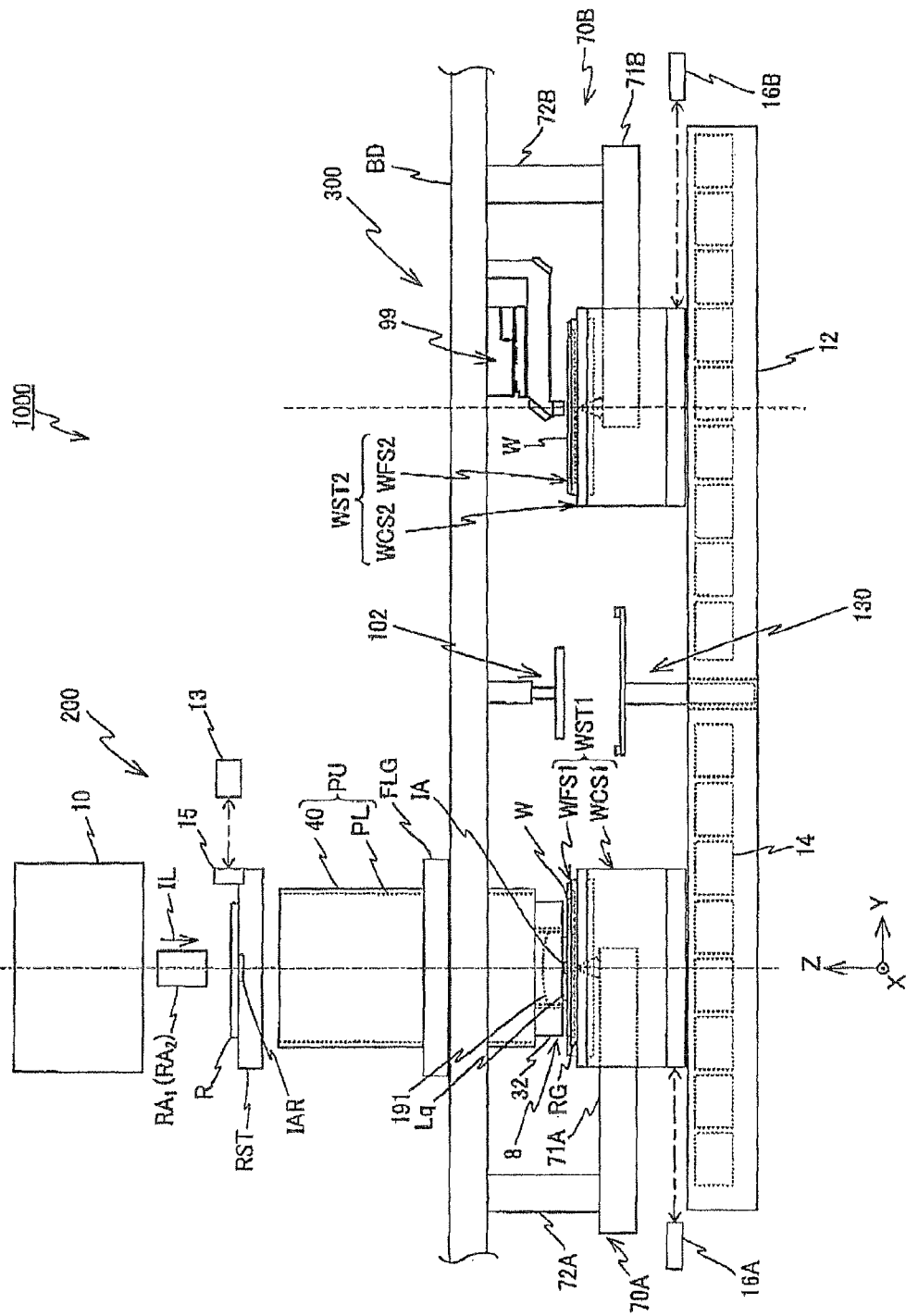
FIG. 25 is a view that schematically shows a configuration of an exposure apparatus of a second embodiment.
Figure 26:
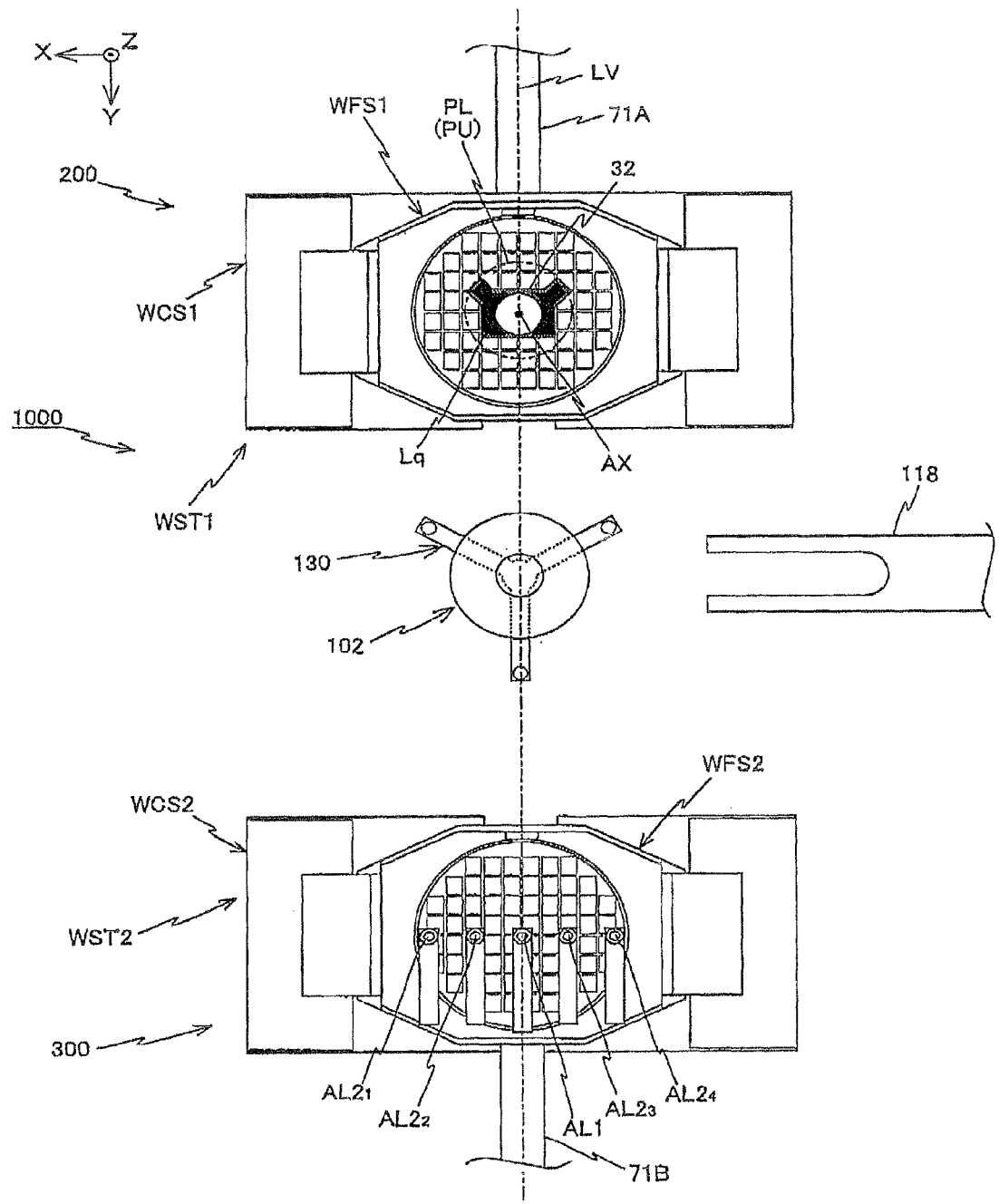
FIG. 26 is a planar view of the exposure apparatus in FIG. 25 which is partially omitted.
Figure 27:
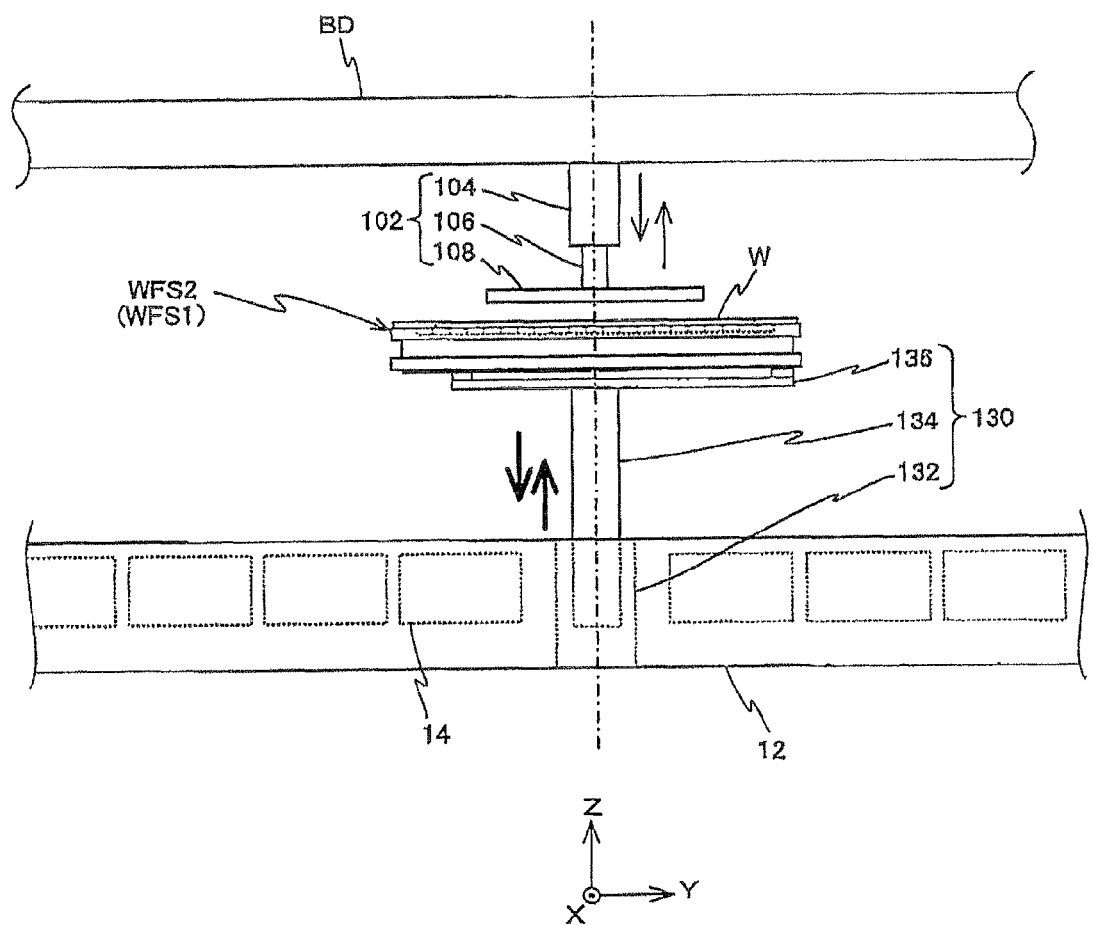
FIG. 27 is an enlarged view showing an area around the center table and the chuck unit in FIG. 25.
Figure 28A:
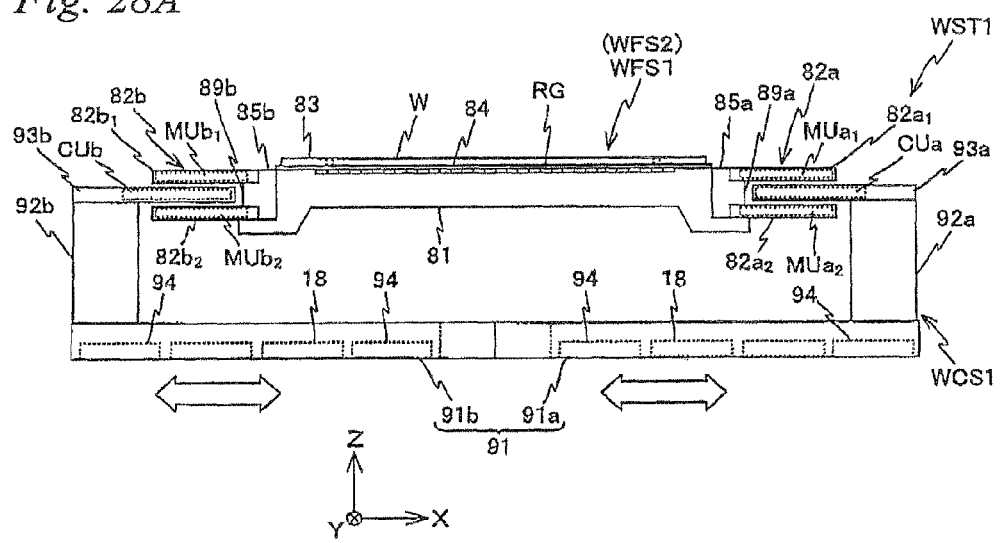
FIG. 28A shows a side view of a wafer stage which the exposure apparatus in FIG. 25 is equipped with when viewed from a −Y direction.
Figure 28B:
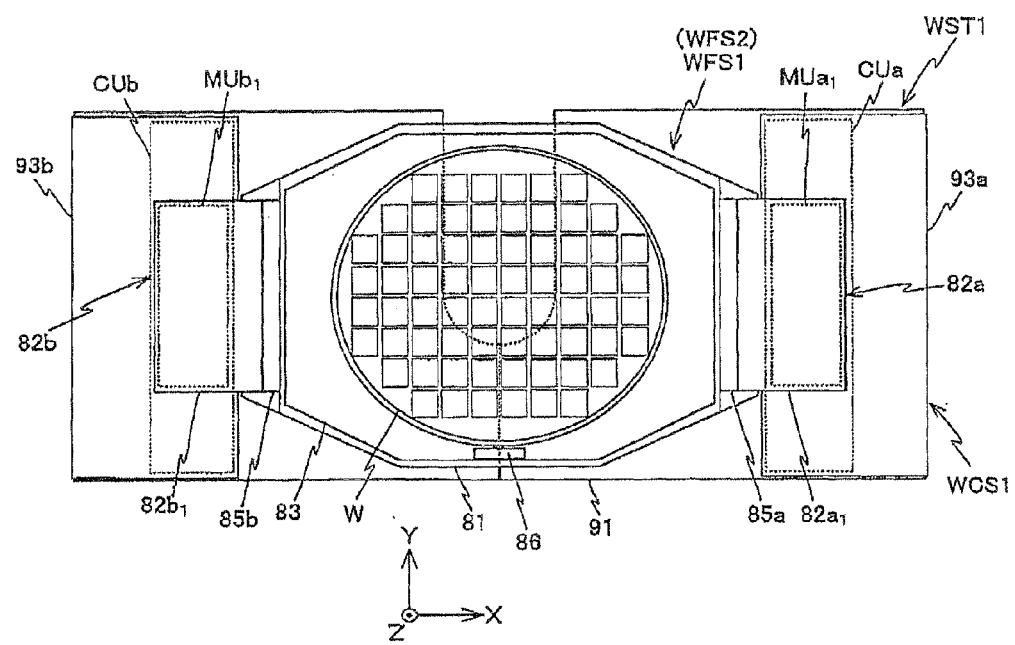
FIG. 28B is the wafer stage shown in a planar view.
Figure 29A:
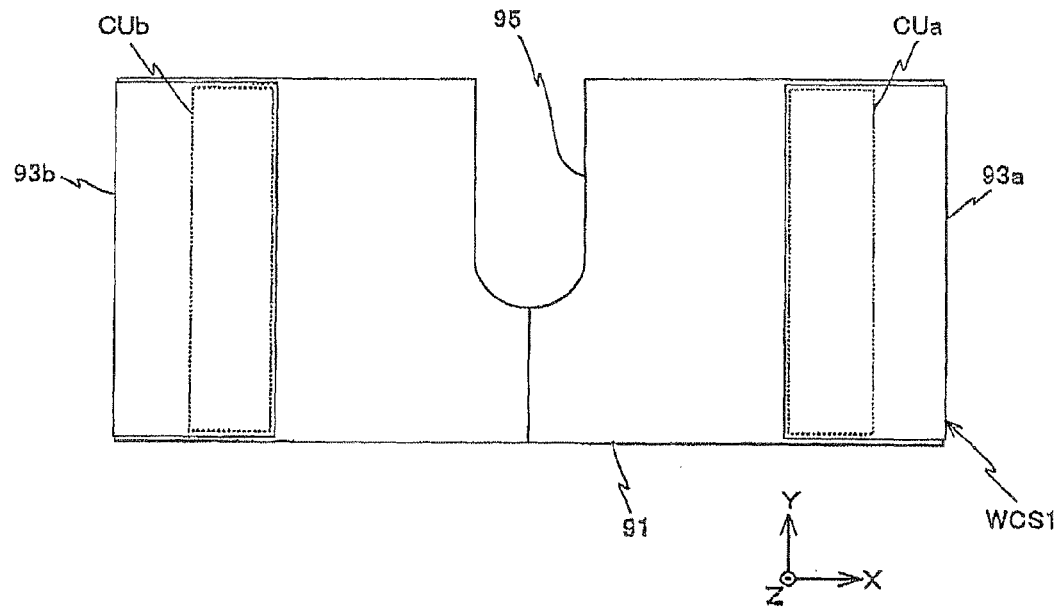
FIG. 29A is an extracted planar view of the coarse movement stage.
Figure 29B:
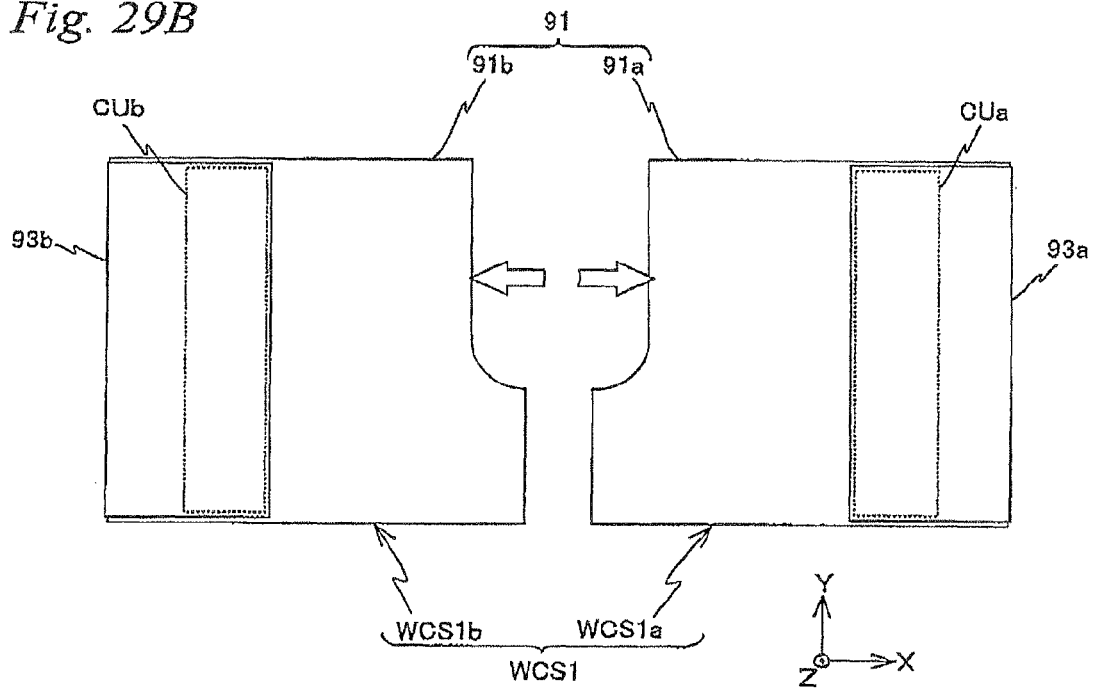
FIG. 29B is a planar view showing a state where the coarse movement stage is separated into two sections.
Figure 30:
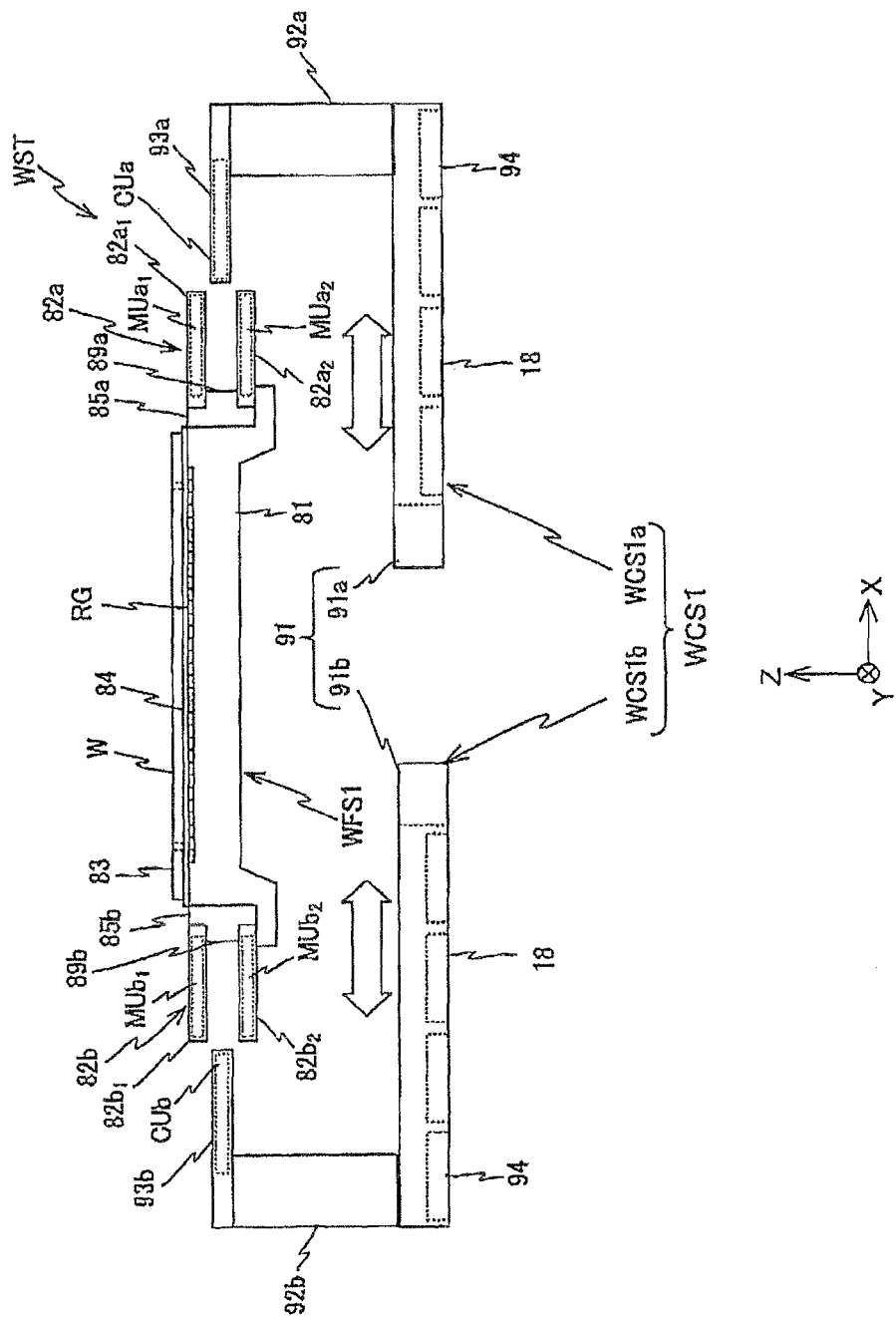
FIG. 30 is a front view of a wafer stage showing a separated state of the coarse movement stage.
Figure 31:
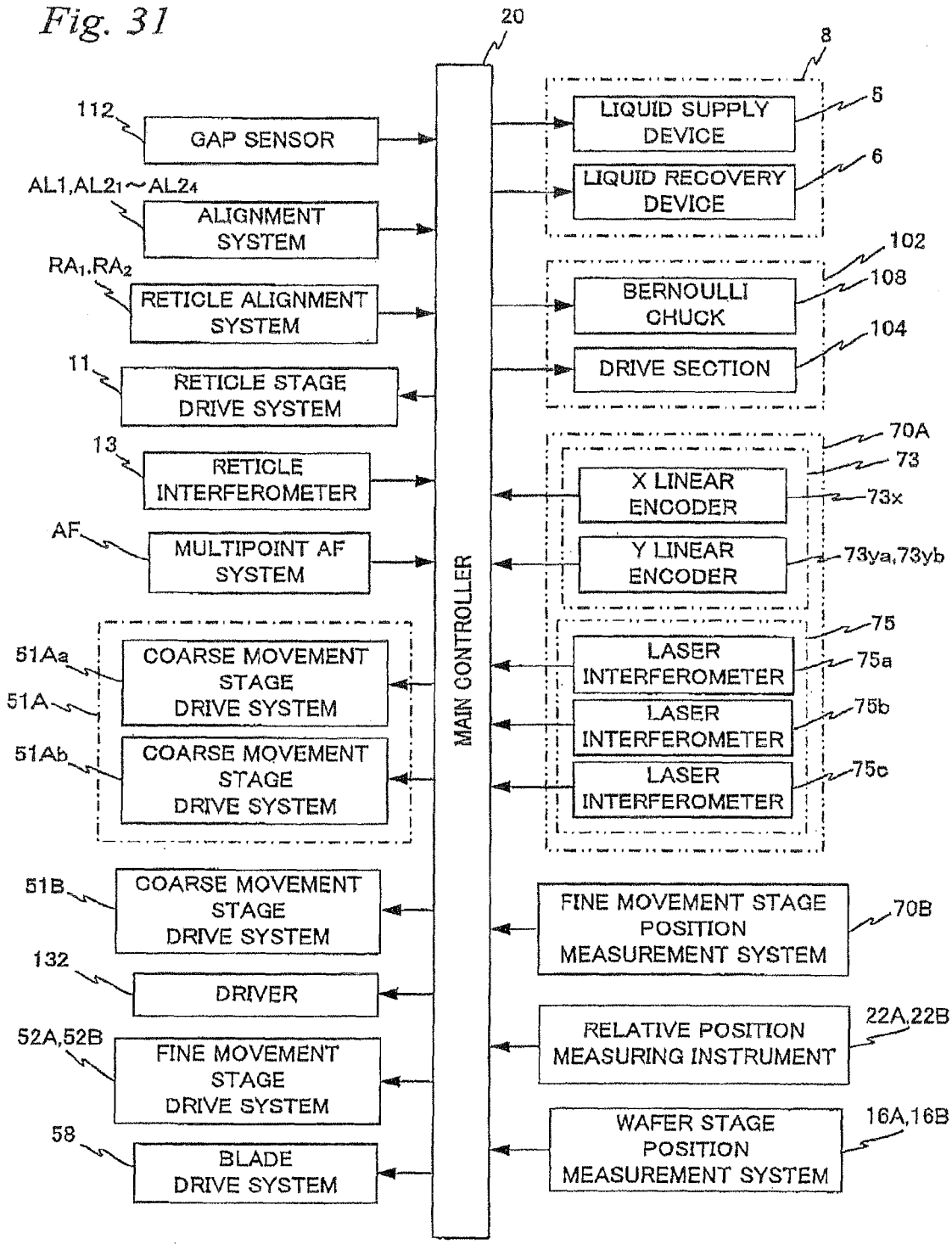
FIG. 31 is a block diagram showing a configuration of a control system of the exposure apparatus in FIG. 25.

FIG. 25 shows a schematic configuration of an exposure apparatus 1000 in the second embodiment when viewed from the +X side, and FIG. 26 shows a partially omitted planar view of exposure apparatus 1000. Further, FIG. 27 shows a center table and the vicinity of a chuck unit which will be described later on. Further, FIG. 28A shows a side view of a wafer stage which exposure apparatus 1000 is equipped with when viewed from the −Y direction, and FIG. 28B shows a planar view of the wafer stage, respectively. FIG. 29A is a planar view of a coarse movement stage, FIG. 29B is a planar view showing a state where the coarse movement stage is separated into two sections, and FIG. 30 shows a front view of the wafer stage in a state where coarse movement stage is separated. Furthermore, FIG. 31 is a block diagram showing an arrangement of a control system in exposure apparatus 1000. The control system is mainly configured of main controller 20 that performs overall control of each section configuring exposure apparatus 1000, as is previously described.

Exposure apparatus 1000 is a projection exposure apparatus by the step-and-scan method, or a so-called scanner. As shown in FIG. 25, exposure apparatus 1000 is equipped with an exposure station 200 placed close to the end on the −Y side of a base board 12, a measurement station 300 placed close to the end on the +Y side of base board 12, a center table 130 and a chuck unit 102 placed in between measurement station 300 and exposure station 200, two wafer stages WST1 and WST2, and a control system and the like for these parts.

As shown in FIG. 26, center table 130 is placed at a position between measurement station 300 and exposure station 200, with the center of the table substantially coinciding on reference axis LV previously described. As shown in FIG. 27, center table 130 is equipped with a driver 132 placed inside of base board 12, a shaft 134 which is vertically driven by driver 132, and a table main body 136 which has a Y-shape (refer to FIG. 26) in a planar view and is fixed to the upper end of shaft 134. Driver 132 of center table 130 is controlled by main controller 20 (refer to FIG. 31).

Chuck unit 102, as shown in FIG. 27, for example, is equipped with a drive section 104, a shaft 106, and a disc-shaped Bernoulli chuck 108 similar to the first embodiment, however, unlike the first embodiment, chuck unit 102 is approximately placed just above center table 130 (a position in between measurement station 300 and exposure station 200). To Bernoulli chuck 108, for example, a gap sensor 112 (not shown in FIG. 27, refer to FIG. 31) consisting of a capacitive sensor is attached.

Furthermore, exposure apparatus 1000 is equipped with a wafer carrier arm 118 (refer to FIG. 26) which is movable within an area including a position of chuck unit 102, and a wafer delivery position (e.g., a wafer delivery position (unloading side and loading side) of a wafer between a coater developer which is connected in-line to exposure apparatus 1000) away from the position of chuck unit 102, for example, in the +X direction.

Besides what is described above, center table 130 described above is provided in exposure apparatus 1000 of the second embodiment, and besides the configuration of the stage system and the control algorithm of main controller 20 being partly different from exposure apparatus of the first embodiment previously described corresponding to the chuck unit placed directly above center table 130, the configuration and the like of other sections is the same as exposure apparatus 100.

In other words, as it can be seen when comparing FIGS. 28A, 28B, 29A, 29B, 30, and 31, and FIGS. 4A, 4B, 6 and 13 previously described, while in the stage system of the second embodiment, a U-shaped notch 95 whose width is larger than the diameter of drive shaft 134 of center table 130 previously described is formed on an edge on one side (the +Y side) in the Y-axis direction in the center in the longitudinal direction (X-axis direction) of coarse movement slider section 91 of coarse movement stage WCS1, as is shown in FIGS. 28B and 29A, other parts are the same as the stage system in the first embodiment previously described. Since notch 95 is formed in coarse movement slider section 91, drive shaft 134 does not interfere with the movement of coarse movement stage WCS1 when the fine movement stage is carried to the area right above center table 130 by coarse movement stage WCS1 as it will be described later on.

In exposure apparatus 1000, as is shown in FIG. 26, for example, coarse movement stage WCS2 is placed on base board 12 in a direction opposite to coarse movement stage WCS1, or more specifically, in a direction where an opening of notch 95 of coarse movement slider section 91 faces the other side (the −Y side) of the Y-axis direction (refer to). This allows drive shaft 134 to keep from interfering with the movement of coarse movement stage WCS2 when the fine movement stage is carried to the area right above center table 130 by coarse movement stage WCS2.

However, in order to directly deliver the fine movement stage between coarse movement stages WCS1 and WCS2 reciprocally, coarse movement stages WCS1 and WCS2 only have to be approachable to each other without being disturbed by drive shaft 134; therefore, a notch or an opening only has to be formed in one of the coarse movement slider sections of coarse movement stages WCS1 and WCS2.

In exposure apparatus 1000 of the embodiment, when manufacturing a device, exposure by the step-and-scan method is performed on wafer W held by one of the fine movement, stages (in this case, WFS1, as an example) held by coarse movement stage WCS1 located in exposure station 200, and a pattern of reticle R is transferred on each of a plurality of shot areas on wafer W. The exposure operation by this step-and scan method is performed by main controller 20, by repeating a movement operation between shots in which wafer stage WST1 is moved to a scanning starting position (an acceleration starting position) for exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks on measurement plate 86 as a reference) that has been performed beforehand, and results of reticle alignment and the like. Incidentally, the exposure operation described above is performed by liquid immersion exposure. Further, exposure is performed in the following order, from the shot area located on the +Y side on wafer W to the shot area located on the −Y side.

In exposure apparatus 1000 of the second embodiment, during the series of exposure operations described above, main controller 20 measures the position of fine movement stage WFS1 (wafer W) using fine movement stage position measurement system 70A, and the position of wafer W is controlled based on the measurement results.

In parallel with exposure to wafer W on fine movement stage WFS1 described above, wafer exchange, wafer alignment, and the like are performed on the other fine movement stage WFS2. Wafer exchange is performed, by unloading wafer W which has been exposed from above fine movement stage WFS2 by chuck unit 102 and wafer carrier arm 118, as well as loading a new wafer W on fine movement stage WFS2 when fine movement stage WFS2 holding wafer W which has been exposed is at a predetermined wafer exchange position, or more specifically, on center table 130 (table main body 136) under chuck unit 102 previously described.

As a premise of beginning the wafer exchange, fine movement stage WFS2 holding wafer W which has been exposed is to be at the wafer exchange position under chuck unit 102, and mounted on table main body 136 of center table 130 (being supported by table main body 136) (refer to FIG. 27).

Figure 32A:
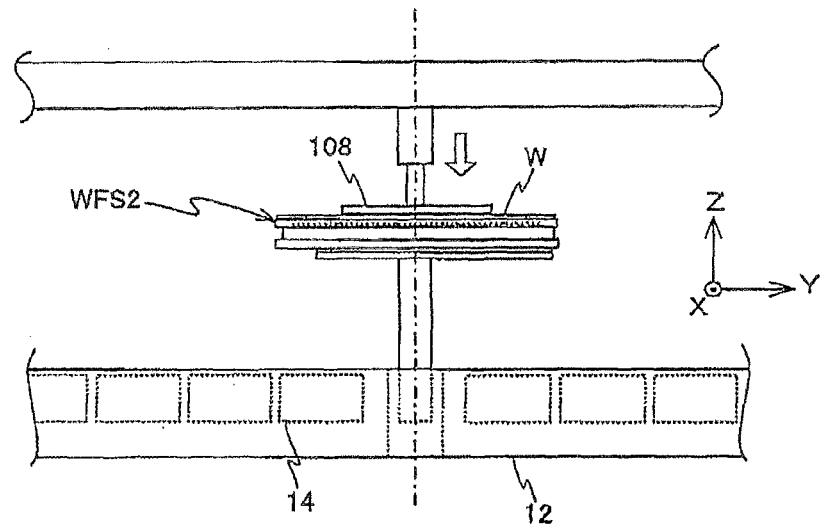
FIGS. 32A to 32C are views used to explain a procedure of unloading a wafer in the exposure apparatus of the second embodiment, and are views showing a state where the vicinity of a chuck unit is viewed from the side.

First of all, drive section 104 of chuck unit 102 is controlled by main controller 20, and Bernoulli chuck 108 is driven downward (refer to FIG. 32A). During this drive, main controller 20 monitors the measurement values of gap sensor 112, and when the measurement value of gap sensor 112 reaches a predetermined value, such as, for example, around several μm, main controller 20 stops driving Bernoulli chuck 108 downward, and adjusts the flow rate of the air the blowing out from Bernoulli chuck 108 so as to maintain the several μm gap. This allows wafer W to be held by suction in a non-contact manner from above by Bernoulli chuck 108, via a clearance of around several μm (refer to FIG. 33A). Now, at the wafer exchange position, fine movement stage WFS1 is connected to a pump, which is connected to a supply source of a pressurized gas, as in the first embodiment previously described, and in a similar manner, assistance is performed, with respect to a suction holding operation of wafer W using the Bernoulli chuck by releasing the suction of wafer W by the wafer holder and blowing out pressurized gas from below. Incidentally, in a state where the pump is in an idle state (non-operating state) including the case where a wafer is suctioned, the gas supply line is closed by an action of a check valve (not shown).

Figure 32B:
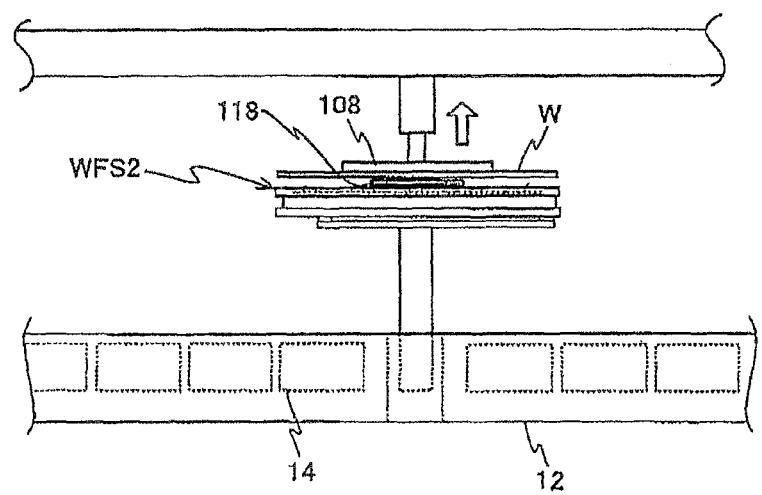

Then, main controller 20 controls drive section 104 and drives Bernoulli chuck 108 upward which holds wafer W by suction in a non-contact manner (refer to FIG. 32B).

And then, main controller 20 inserts wafer carrier arm 118 that has been waiting at a waiting position in the vicinity of the wafer exchange position below wafer W held by Bernoulli chuck 108 (refer to FIGS. 32B and 33B), and drives Bernoulli chuck 108 slightly upward, after having released the suction of Bernoulli chuck 108. This allows wafer W to be held by wafer carrier arm 118 from below.

Figure 32C:
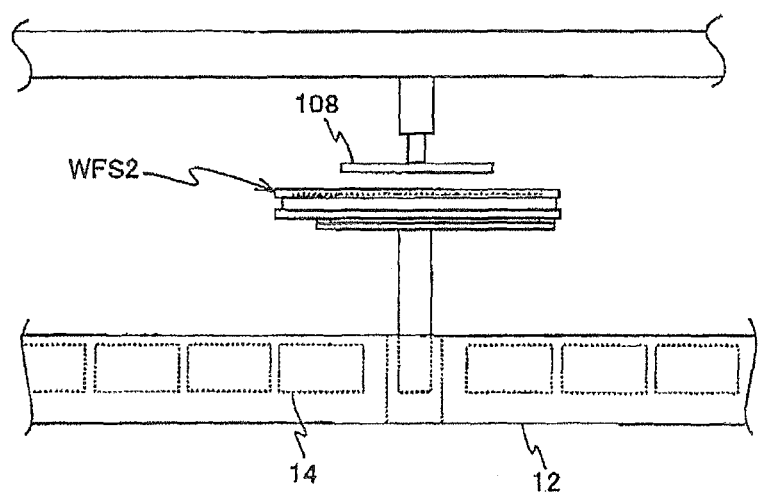
Figure 33A:
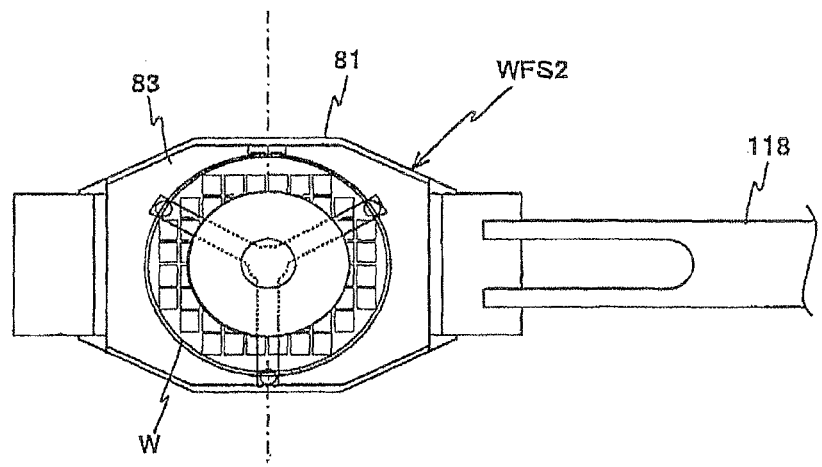
FIGS. 33A to 33C are views used to explain a procedure of unloading a wafer in the exposure apparatus of the second embodiment, and are views showing a state where the vicinity of a chuck unit is viewed from above.
Figure 33B:
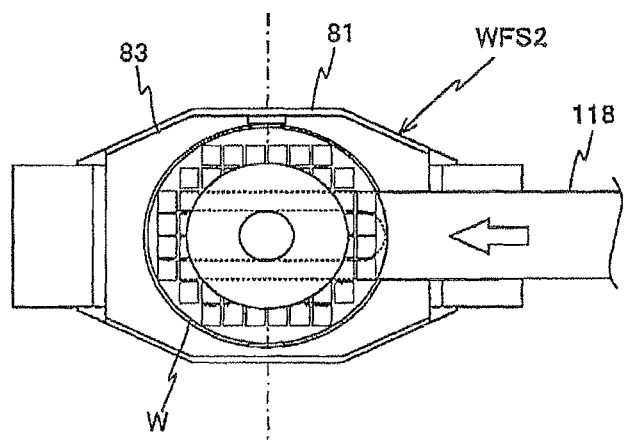
Figure 33C:
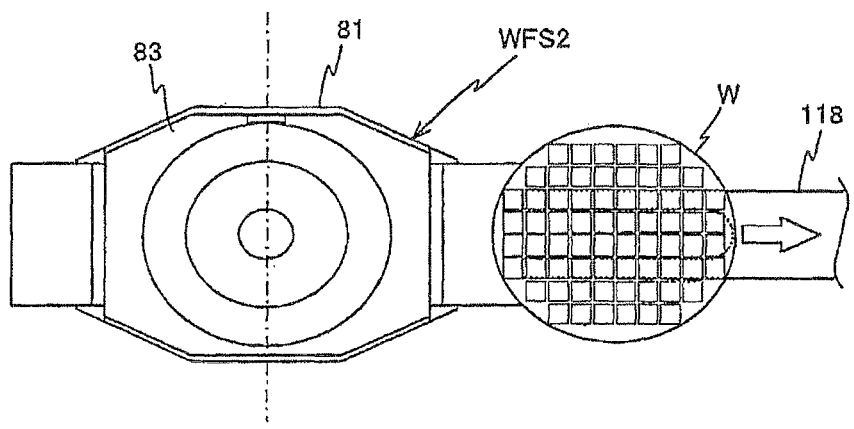

Then, main controller 20 controls wafer carrier arm 118 and carries wafer W to a wafer unload position (for example, a delivery position (unloading side) of the wafer between a coater developer) which is away in the −X direction from the wafer exchange position from below, and mounts wafer W on the wafer unload position. FIG. 33C shows a state where wafer carrier arm 118 moves away from the wafer exchange position, and FIG. 32C shows a state where wafer carrier arm 118 is distanced away from the wafer exchange position.

Then, loading of a new wafer W (which has not yet been exposed) onto fine movement stage WFS2 is performed by main controller 20 roughly in a reversed procedure of the unloading described above.

More specifically, main controller 20 controls wafer carrier arm 118, and makes wafer carrier arm 118 receive wafer W which is at the wafer loading position (for example, a delivery position (unloading side) of the wafer between the coater developer) and carry the wafer to the wafer exchange position under chuck unit 102.

Then, main controller 20 drives Bernoulli chuck 108 slightly downward, and begins the suction of wafer W by Bernoulli chuck 108. And then, main controller 20 drives Bernoulli chuck 108 that has suctioned wafer W slightly upward, and makes wafer carrier arm 118 withdraw to the waiting position previously described.

Then, main controller 20 drives Bernoulli chuck 108 downward to a position until the back surface of wafer W comes in contact with the wafer holder of fine movement stage WFS2. Then, main controller 20 drives Bernoulli chuck 108 upward by a predetermined amount, after having released the suction of wafer W by Bernoulli chuck 108. This allows a new wafer W to be loaded on fine movement stage WFS2 mounted on table main body 136. In this case, at the wafer exchange position, fine movement stage WFS1 is connected to a vacuum pump via an exhaust pipe line and piping (not shown), and by the operation of this vacuum pump, the pressure inside of a decompression chamber formed between the wafer holder and the wafer becomes negative, which starts the suction of wafer W by the wafer holder. And, when the vacuum pump is suspended, the exhaust pipe line is closed by an action of a check valve (not shown), and the negative pressure state of the decompression chamber is maintained. This allows fine movement stage WFS2 to be separated from the coarse movement stage and to be carried without any problems.

And then, after fine movement stage WFS2 is delivered to coarse movement stage WCS2 by main controller 20 in a manner similar to the case of fine movement stage WFS1 which will be described later on, an alignment to a new wafer W is performed by main controller 20 in a procedure similar to the one previously described. As a result of this wafer alignment, information on array coordinates of each shot area on wafer W acquired from the wafer alignment, such as for example, EGA, which is converted into array coordinates which are based on the second fiducial marks can be obtained.

Figure 38A:
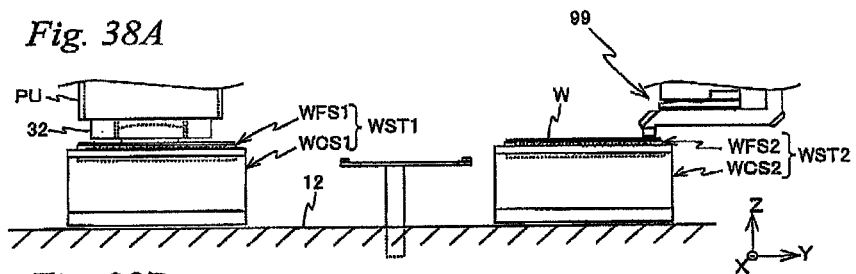
FIGS. 38A to 38D are views used to explain a parallel processing performed using fine movement stages WFS1 and WFS2 (No. 1) in the exposure apparatus of the second embodiment.

While wafer alignment to wafer W held by fine movement stage WFS2 is completed in the manner described above, exposure of wafer W which is held by fine movement stage WFS1 in exposure station 200 is still being continued. FIG. 38A shows a positional relation of coarse movement stages WCS1 and WCS2 at the stage when wafer alignment to wafer W has been completed.

Main controller 20 waits for the exposure to wafer W on fine movement stage WFS1 to be completed, in a state where wafer stage WST2 is waiting at a position shown in FIG. 38A.

Figure 35:
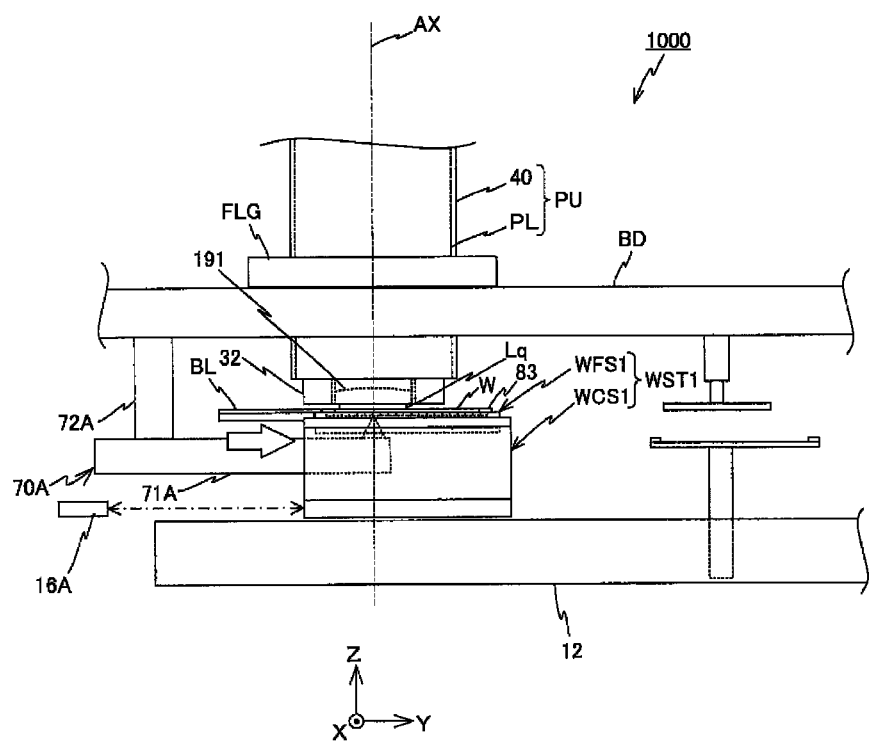
FIG. 35 is a view used to explain a delivery of a liquid immersion space area (liquid Lq) performed between a fine movement stage and a movable blade in the exposure apparatus of the second embodiment (No. 2)

FIG. 35 shows a state of wafer stage WST1 immediately after the exposure is completed.

Figure 34:
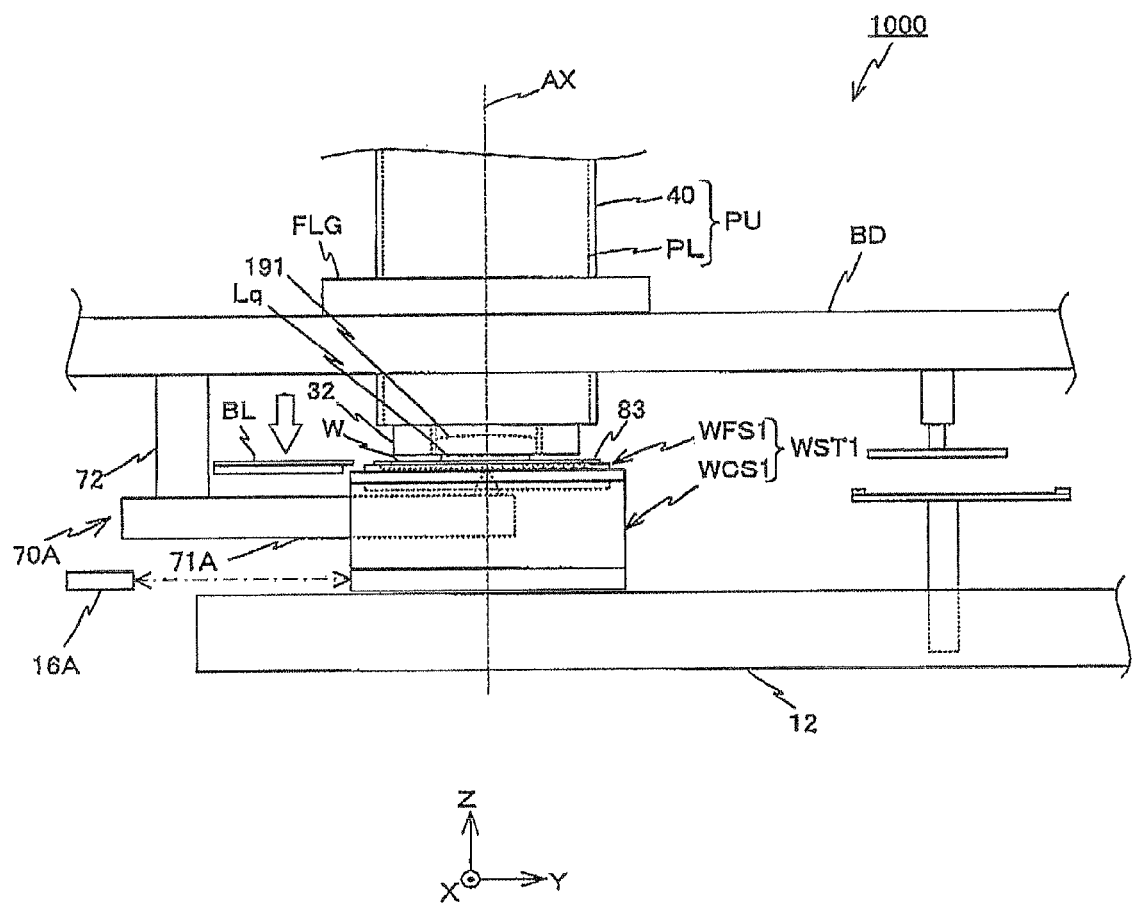
FIG. 34 is a view used to explain a delivery of a liquid immersion space area (liquid Lq) performed between a fine movement stage and a movable blade in the exposure apparatus of the second embodiment (No. 1)

Prior to the completion of exposure, main controller 20 drives movable blade BL which has been waiting on the −Y side of projection unit PU downward by a predetermined amount via blade drive system 58, as is shown by an outlined arrow in FIG. 34. By this drive, the upper surface of movable blade BL is positioned to be flush with the upper surface of fine movement stage WFS1 (and wafer W) located below projection optical system PL, as shown in FIG. 34. Then, main controller 20 waits for the exposure to be completed in this state.

Then, when exposure has been completed, main controller 20 drives movable blade BL in the +Y direction by a predetermined amount (refer to the outlined arrow in FIG. 35) via blade drive system 58, so as to make movable blade BL in contact or in proximity by a clearance of around 300 μm to fine movement stage WFS1. More specifically, main controller 20 sets movable blade BL and fine movement stage WFS1 to a scrum state.

Figure 36:
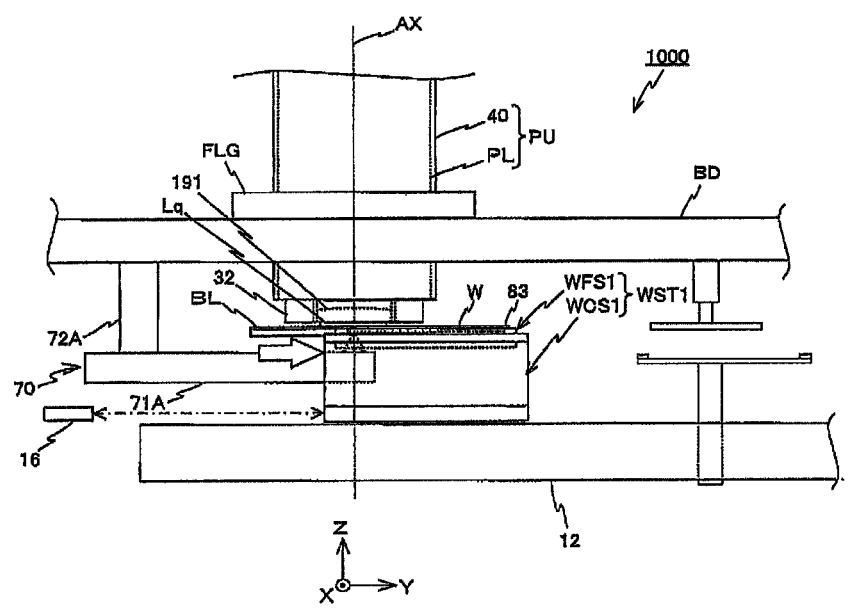
FIG. 36 is a view used to explain a delivery of a liquid immersion space area (liquid Lq) performed between a fine movement stage and a movable blade in the exposure apparatus of the second embodiment (No. 3)

Next, as shown in FIG. 36, main controller 20 drives movable blade BL in the +Y direction (refer to the outlined arrow in FIG. 36) integrally with wafer stage WST1, while maintaining a scrum state between movable blade BL and fine movement stage WFS1. By this operation, the liquid immersion space area formed by liquid Lq held between tip lens 191 and fine movement stage WFS1 is passed from fine movement stage WFS1 to movable blade BL. FIG. 36 shows a state just before the liquid immersion space area formed by liquid Lq is passed from fine movement stage WFS1 to movable blade BL. In the state of this FIG. 36, liquid Lq is held between frontal lens 191 and fine movement stage WFS1 and movable blade BL.

Figure 37:
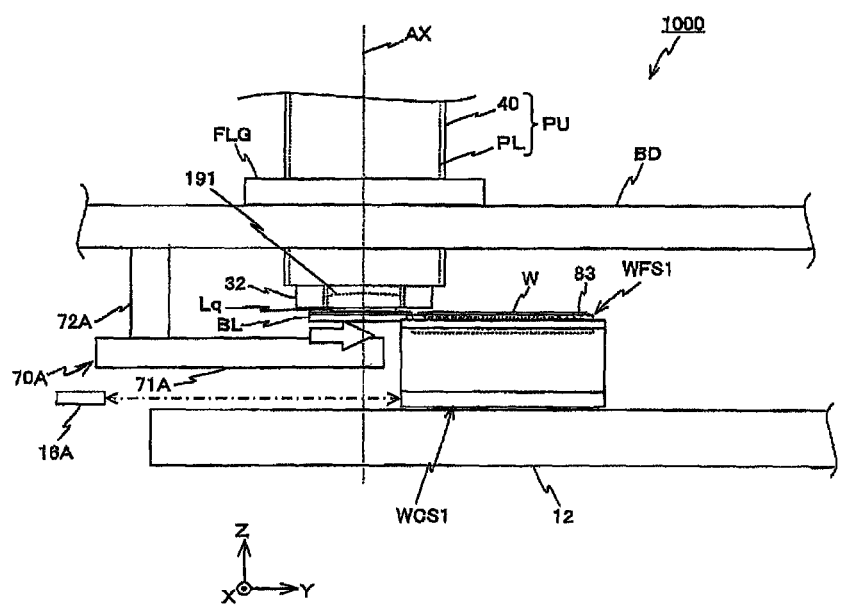
FIG. 37 is a view used to explain a delivery of a liquid immersion space area (liquid Lq) performed between a fine movement stage and a movable blade in the exposure apparatus of the second embodiment (No. 4)
Figure 38B:
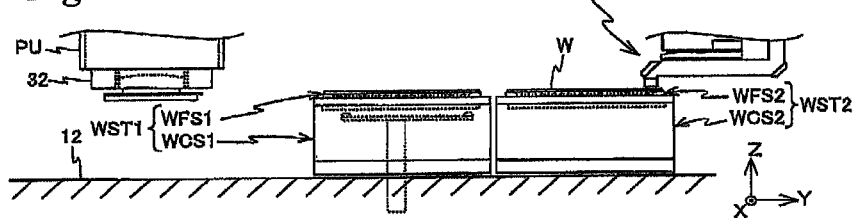
Figure 38C:
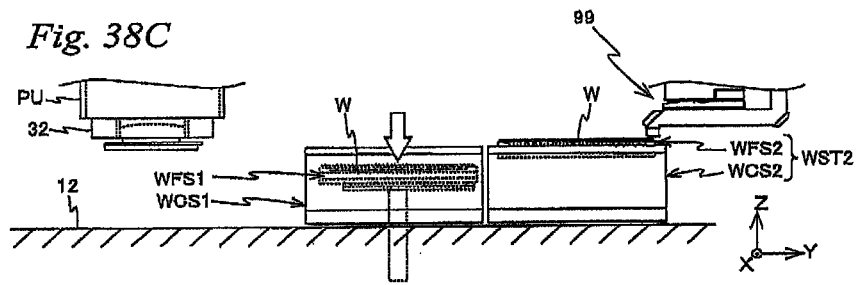
Figure 39:
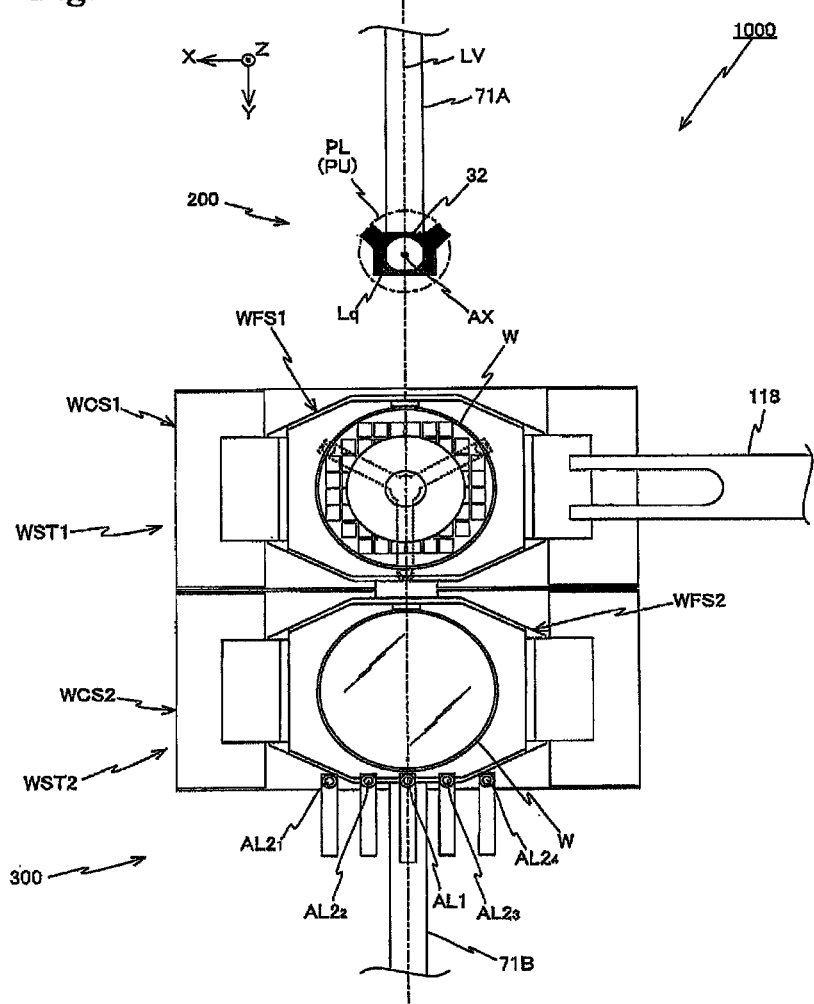
FIG. 39 is a planar view corresponding to the state shown in FIG. 38B.

Then, when the delivery of the liquid immersion space from fine movement stage WFS1 to movable blade BL is completed as shown in FIG. 37, main controller 20 drives coarse movement stage WCS1 holding fine movement stage WFS1 further in the +Y direction, and moves coarse movement stage WCS1 near coarse movement stage WCS2, which is waiting at a waiting position while holding fine movement stage WFS2. By this movement, a state occurs where coarse movement stage WCS1 houses center table 130 in its internal space, and also supports fine movement stage WFS1 right above center table 130, as shown in FIG. 38B. More specifically, fine movement stage WFS1 is carried right above center table 130 by coarse movement stage WCS1. FIG. 39 shows a state of both stages at this point of time in a planar view.

Then, main controller 20 drives table main body 136 upward via driver 132 of center table 130, and supports fine movement stage WFS1 from below.

And, in this state, main controller 20 releases the look mechanism (not shown), and separates coarse movement stage WCS1 into the first section WCS1a and the second section WCS1b. By this operation, fine movement stage WFS1 is detachable from coarse movement stage WCS1. Therefore, main controller 20 drives table main body 136 supporting fine movement stage WFS1 downward, as is shown by the outlined arrow in FIG. 38C.

And then, main controller 20 locks the lock mechanism (not shown) after the first section WCS1a and the second section WCS1b are joined together.

Figure 38D:
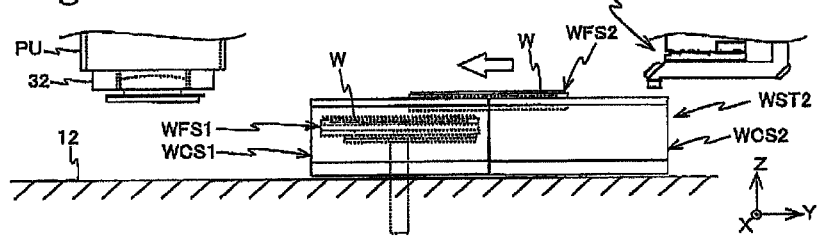

Next, main controller 20 makes wafer stage WST2 almost come into contact with wafer stage WST1, and also drives fine movement stage WFS2 in the −Y direction as is shown by the outlined arrow in FIG. 38D, and moves and mounts (a slide movement) fine movement stage WFS2 from coarse movement stage WCS2 onto coarse movement stage WCS1.

Figure 40A:
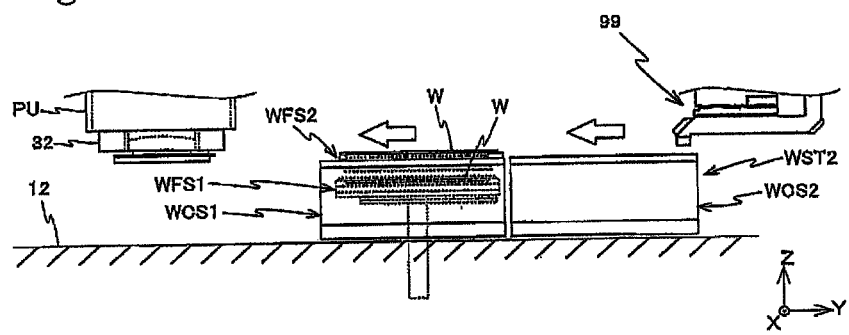
FIGS. 40A and 40B are views used to explain the parallel processing performed using fine movement stages WFS1 and WFS2 (No. 2) in the exposure apparatus of the second embodiment.

Next, main controller 20 makes coarse movement stage WCS1 which supports fine movement stage WFS2 move in the −Y direction as is shown by the outlined arrow in FIG. 40A, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade BL previously described.

Figure 40B:
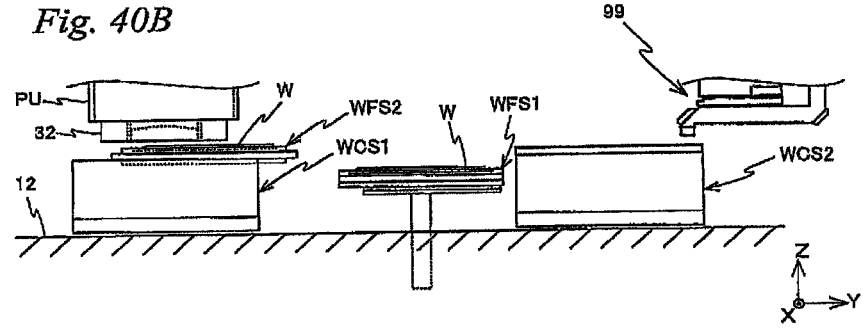

Then, prior to the beginning of exposure, main controller 20 performs reticle alignment in a procedure similar to the one previously described. FIG. 40B shows fine movement stage WFS2 during reticle alignment, along with coarse movement stage WCS1 holding the fine movement stage. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. In this exposure, fine movement stage WFS2 is returned to the −Y side once after the reticle alignment, and then exposure is performed in the order from shot areas on the +Y side on wafer W to the shot areas on the −Y side.

Concurrently with the delivery of the liquid immersion space area, reticle alignment, and exposure described above, the following operations are performed.

More specifically, exchange of a wafer on fine movement stage WFS1 mounted on table main body 136 of center table 130 is performed by main controller 20, using chuck unit 102, wafer carrier arm 118, center table 130 and the like in a similar procedure as before.

Then, table main body 136 supporting fine movement stage WFS1 on which a new wafer W is loaded, is driven upward by a predetermined amount (refer to the outlined arrow in FIG. 41A) by main controller 20, until table main body 136 comes to a position where fine movement stage WFS1 can be fitted to coarse movement stage WCS2.

Figure 41A:
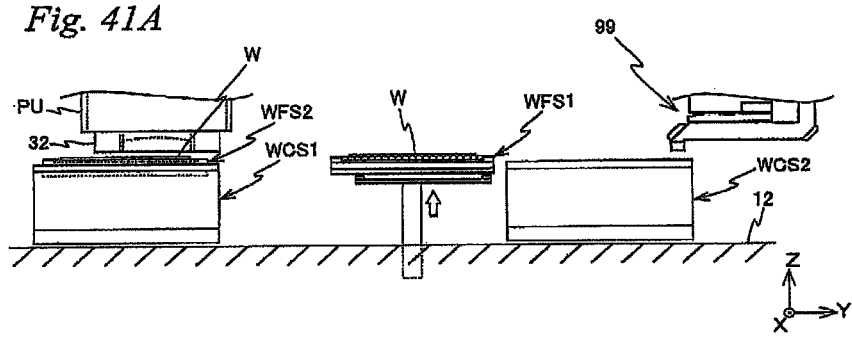
FIGS. 41A to 41C are views used to explain the parallel processing performed using fine movement stages WFS1 and WFS2 (No. 3) in the exposure apparatus of the second embodiment.
Figure 41B:
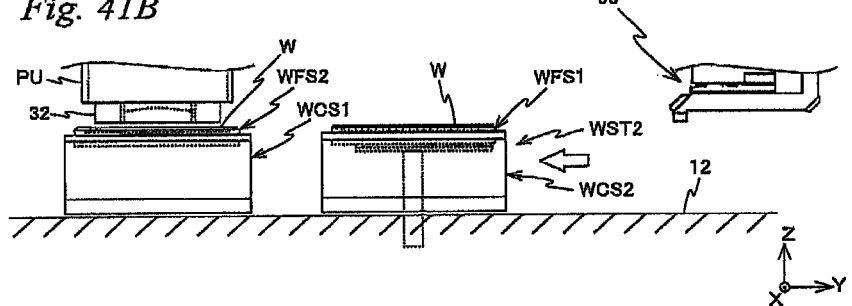

And then, coarse movement stage WCS2 is driven in the −Y direction by main controller 20 as is shown by the outlined arrow in FIG. 41B, so that fine movement stage WFS1 is attached to coarse movement stage WCS2. After this, main controller 20 drives table main body 136 downward. This allows fine movement stage WFS1 holding the new wafer W to be delivered from main table body 136 to coarse movement stage WCS2, and to be movably supported by coarse movement stage WCS2.

Figure 41C:
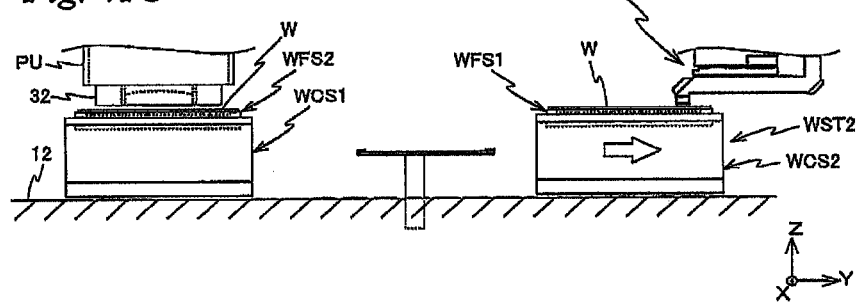

After that, coarse movement stage WCS2 is driven in the +Y direction by main controller 20, and is moved to measurement station 300, as is shown by the outlined arrow in FIG. 41C.

Thereafter, detection of the second fiducial marks on fine movement stage WFS1 supported by coarse movement stage WCS2, alignment of wafer W on fine movement stage WFS1 and the like are performed in procedures similar to the ones previously described. In this case as well, position measurement of fine movement stage WFS1 on alignment is performed, using fine movement stage position measurement system 70B.

While wafer alignment to wafer W held by fine movement stage WFS1 is completed in the manner described above, exposure of wafer W which is held by fine movement stage WFS2 in exposure station 200 is still being continued.

Then, in a manner similar to the one previously described, main controller 20 waits for the exposure to wafer W on fine movement stage WFS2 to be completed, in a state where coarse movement stage WCS2 is waiting at the waiting position previously described.

Hereinafter, a similar processing is repeatedly performed, alternately using fine movement stages WFS1 and WFS2, and an exposure processing to a plurality of wafer Ws is continuously performed.

As is described in detail so far, according to exposure apparatus 1000 of the second embodiment, an equivalent effect can be obtained as in exposure apparatus 100 of the first embodiment previously described, because the configuration is similar to the exposure apparatus of the first embodiment previously described except for some parts. As well as this, according to exposure apparatus 1000 of the second embodiment, the exchange position where exchange of wafer W held by fine movement stages WFS1 and WFS2 is performed is placed on a movement path of fine movement stages WFS1 and WFS2 between measurement station 300 and exposure station 200. Therefore, after the exposure of wafer W held by fine movement stage WFS1 or WFS2 has been performed at exposure station 200, prior to moving the fine movement stage WFS1 or WFS2 to measurement station 300, it becomes possible to perform exchange of a wafer which has been exposed held by fine movement stage WFS1 and WFS2 to a new wafer (that has not yet been exposed) swiftly at the exchange position, which allows a wafer exchange with less loss of time.

Incidentally, in the second embodiment described above, a center table 130 was installed on which fine movement stages WFS1 or WFS2 is mounted temporarily on the movement path of fine movement stages WFS1 and WFS2 between measurement station 300 and exposure station 200, and wafer exchange was to be performed on the table main body of center table 130. However, as well as this, the configuration of the wafer exchange system is not limited in particular, as long as wafer exchange can be performed on the fine movement stage when fine movement stage WFS1 or WFS2 holding wafer W which has been exposed is located at a place besides exposure station 200 and measurement station 300 within the XY plane. In such a case, wafer exchange is performed regardless of the exposure processing and the measurement processing such as alignment. Therefore, in exposure station 200, concurrently with exposure of the wafer held by one of the fine movement stages, wafer exchange of a wafer held by another fine movement stage can be performed, or in measurement station 300, concurrently with measurement such as alignment of the wafer held by one of the fine movement stages, wafer exchange of a wafer held by another fine movement stage can be performed. Further, similar to the second embodiment described above, in the case the wafer exchange position is placed on the movement path of fine movement stages WFS1 and WFS2 between measurement station 300 and exposure station 200, any configuration of an exchange device or a support member which is to be placed at the exchange position described above can be employed, as long as the movement and mount of the fine movement stage holding the wafer on which alignment measurement has been performed and is supported by coarse movement stage WCS2 to coarse movement stage WCS1 is not interfered.

Incidentally, in the second embodiment above, the case has been described where wafer exchange on fine movement stage WFS1 or WFS2 is performed by chuck unit 102, which is equipped with Bernoulli chuck 108 driven vertically by drive section 104, and wafer carrier arm 118, working together. However, as well as this, in the second embodiment above, for example, a Bernoulli chuck can be fixed to the tip of an arm of a horizontal multijoint robot that can move vertically, and such a device can be used as the wafer exchange device. Besides this, a chuck unit having a configuration similar to chuck unit 102 can be structured drivable along a guide.

Further, in exposure apparatus 1000 of the second embodiment described above, when fine movement stages WFS1 or WFS2 holding a newly loaded wafer W is delivered to coarse movement stage WCS2 from center table 130 after the wafer exchange, in order to adjust positional shift and rotational error of the wafer, for example, three imaging devices to pick up an image of three places in the periphery of wafer W including a notch (a V-shaped notch, not shown), or a detection system to detect a mark (or a pattern) on the wafer, such as, for example, a plurality of microscopes equipped with a CCD and the like, can be provided. Further, in the case grating RG is provided on the back surface of fine movement stages WFS1 and WFS2, center table 130 needs to hold fine movement stages WFS1 and WFS2 so that the stages do not come into contact with grating RG.

In the second embodiment above, in the case coarse movement stage WCS1 and coarse movement stage WCS2 are made to be in proximity to deliver fine movement stages WFS1 and WFS2 between the two coarse movement stages WCS1 and WCS2 reciprocally, both of the stages do not have to be extremely close together. Coarse movement stages WCS1 and WCS2 can be distanced within a range where the fine movement stage is not tilted greatly (that is, the stator and the mover of the linear motor do not come into contact) when the fine movement stage is moved between coarse movement stages WCS1 and WCS2.

A Third Embodiment

A third embodiment of the present invention will be described below, with reference to FIGS. 42 to 59. Here, from a viewpoint of avoiding repetition, the same or similar reference numerals will be used for the same or similar sections as in the first and second embodiments previously described, and a detailed description thereabout will be simplified or omitted.

Figure 42:
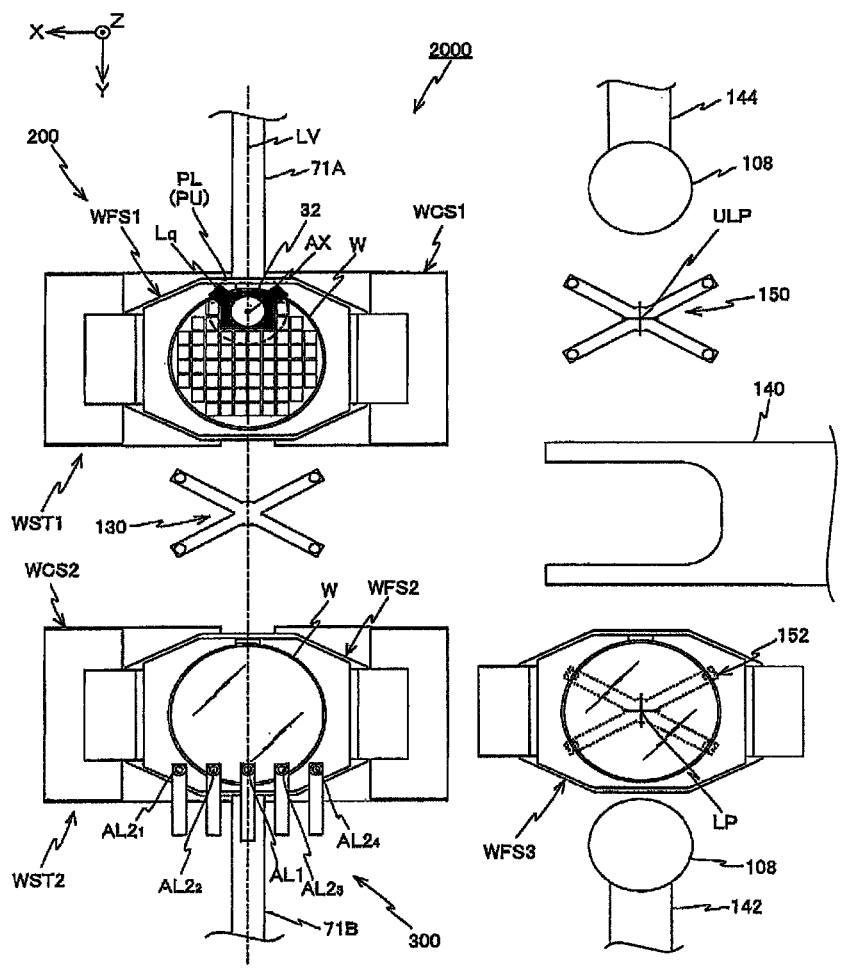
FIG. 42 is a planar view that schematically shows a configuration of an exposure apparatus of a third embodiment.

FIG. 42 shows a schematic configuration of an exposure apparatus 2000 in the third embodiment in a planar view. Exposure apparatus 2000 is a projection exposure apparatus by the step-and-scan method, or a so-called scanner.

As shown in FIG. 42, exposure apparatus 2000 is equipped with an exposure station 200 in which exposure to wafer W is performed, a measurement station 300 placed away by a predetermined distance to the +Y side of exposure station 200, a center table 130 placed between measurement station 300 and exposure station 200, two wafer stages WST1 and WST2, an unload table 150 placed away by a predetermined distance to the −X side of exposure station 200, a load table 152 which is located on the +Y side of unload table 150 and on, the −X side of measurement station 300, a robot arm 140 which is movable within a plane parallel to an XY plane and is also movable (vertically movable) in the Z-axis direction, a load arm 142; and an unload arm 144.

Figure 43:
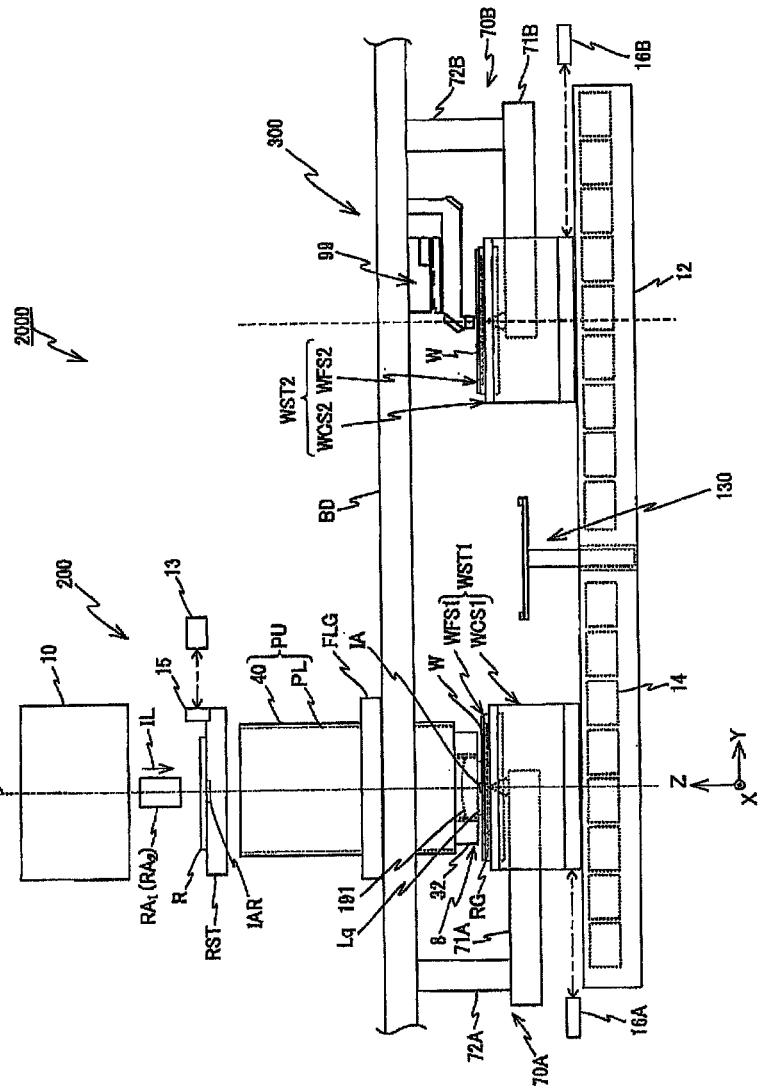
FIG. 43 is a view schematically showing a configuration of an exposure station, a measurement station and the like of the exposure apparatus in FIG. 42.

Exposure station 200 is placed close to an end on the −Y side of a base board 12, and measurement station 300 is placed close to the end on the +Y side of base board 12, as shown in FIG. 43. Further, center table 130 is placed in between measurement station 300 and exposure station 200. Wafer stages WST1 and WST2 are placed on base board 12. Now, as it can also be seen from FIG. 42, in the third embodiment, three fine movement stages WFS1, WFS2, and WFS3 which are configured totally the same, are provided as the fine movement stages.

Figure 44:
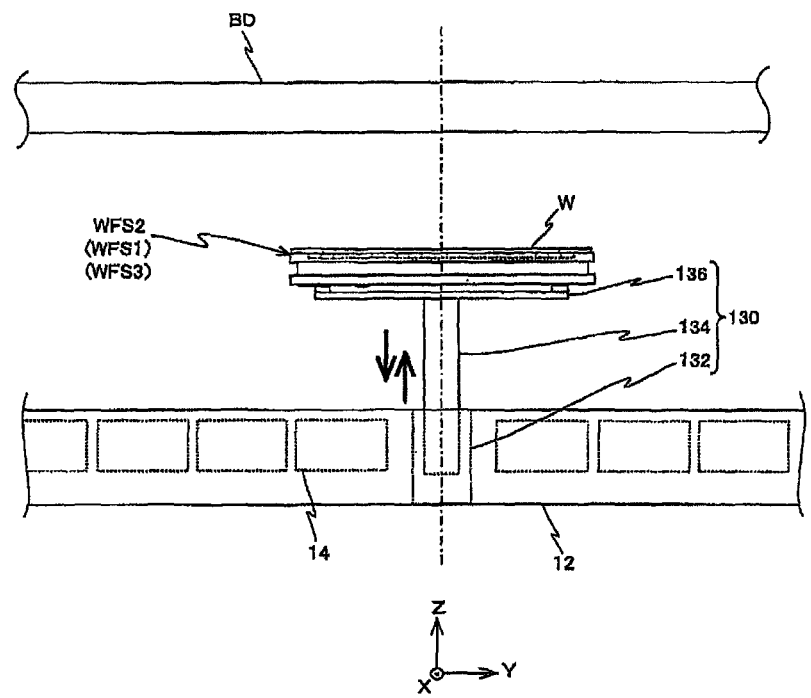
FIG. 44 is an enlarged view showing an area around the center table in FIG. 43.

As shown in FIG. 42, center table 130 is placed at a position between measurement station 300 and exposure station 200, with the center of the table substantially coinciding on reference axis LV previously described. Center table 130, as is shown in FIG. 44, is equipped with a driver 132, a shaft 134, a table main section 136 and the like, similar to the second embodiment previously described. In this case, while the shape of table main body 136 is different from center table 130 in the second embodiment previously described and is an X-shape in a planar view, the function and the like of each part configuring center table 130 is equivalent. Driver 132 is controlled by main controller 20 (refer to FIG. 45).

Referring back to FIG. 42, while unload table 150 and load table 152 are configured similar to center table 130 previously described, with these unload table 150 and load table 152, the table main body does not necessarily have to move vertically.

In the third embodiment, to unload wafer W which has already been exposed, the fine movement stage holding the wafer is mounted on unload table 150. In other words, an unloading position ULP is set on unload table 150. To load wafer W to which exposure has not yet been performed, the fine movement stage is mounted on load table 152. In other words, a loading position LP is set on load table 152.

Robot arm 140 carries the fine movement stage back and forth, between the three tables 130, 150, and 152. Robot arm 140 is controlled by main controller 20 (refer to FIG. 45).

Load arm 142 and unload arm 144 each consist of, for example, an arm of a multijoint robot, and each have a disc-shaped Bernoulli chuck (also called a float chuck) 108 at the tip.

Figure 45:
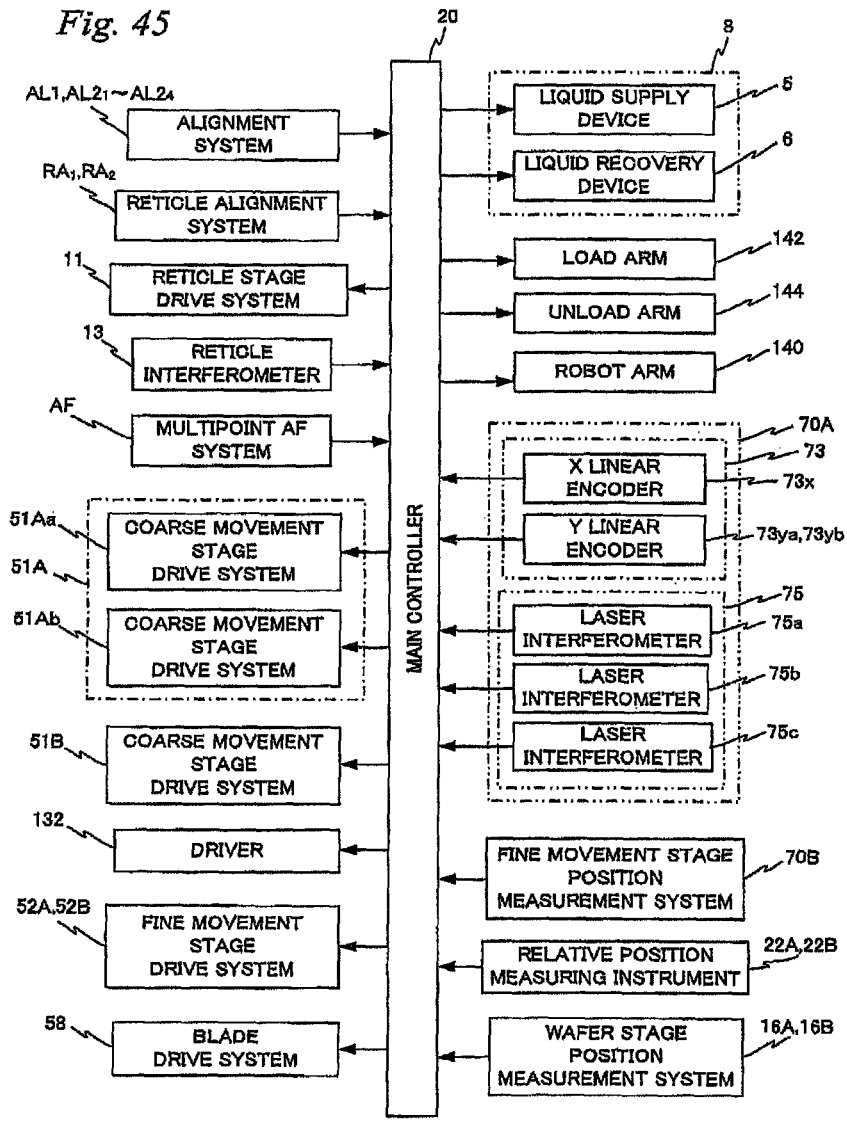
FIG. 45 is a block diagram showing a configuration of a control system of the exposure apparatus in FIG. 42.

Load arm 142 and unload arm 144 include Bernoulli chuck 108, and are controlled by main controller 20 (refer to FIG. 45).

The stage system of exposure apparatus 2000 of the third embodiment is configured similar to the stage system of the second embodiment previously described except for the point that three fine movement stages are provided. Fine movement stage WFS3 is configured similar to fine movement stages WFS1 and WFS2, and can replace fine movement stages WFS1 and WFS2.

FIG. 45 shows a configuration of the control system of exposure apparatus 2000 in a block diagram. The control system is mainly configured of main controller 20 that performs overall control of each section configuring exposure apparatus 2000, as is previously described.

In exposure apparatus 2000 of the third embodiment, when manufacturing a device, exposure by the step-and-scan method is performed on wafer W held by the fine movement stages (one of WFS1 to WFS3, in this case, WFS1) held by coarse movement stage WCS1 located in exposure station 200, and a pattern of reticle R is transferred on each of a plurality of shot areas on wafer W. The exposure operation by this step-and scan method is performed by main controller 20, by repeating a movement operation between shots in which wafer stage WST1 is moved to a scanning starting position (an acceleration starting position) fox exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks on plate 86 as a reference) that has been performed beforehand, and results of reticle alignment and the like. Incidentally, the exposure operation described above is performed by liquid immersion exposure. Further, exposure is performed in the following order, from the shot area located on the +Y side on wafer W to the shot area located on the −Y side.

In exposure apparatus 2000 of the third embodiment, during the series of exposure operations described above, main controller 20 measures the position of fine movement stage WFS1 (wafer W) using fine movement stage position measurement system 70A, and the position of wafer W is controlled based on the measurement results.

In the third embodiment, in parallel with exposure to wafer W being performed on one of the fine movement stages, wafer alignment is performed on another fine movement stage, and further in parallel with these operations, wafer exchange is performed on another fine movement stage.

Hereinafter, a parallel processing operation which is performed using the three fine movement stages WFS1, WFS2, and WFS3 in exposure apparatus 2000 of the third embodiment will be described.

Figure 46:
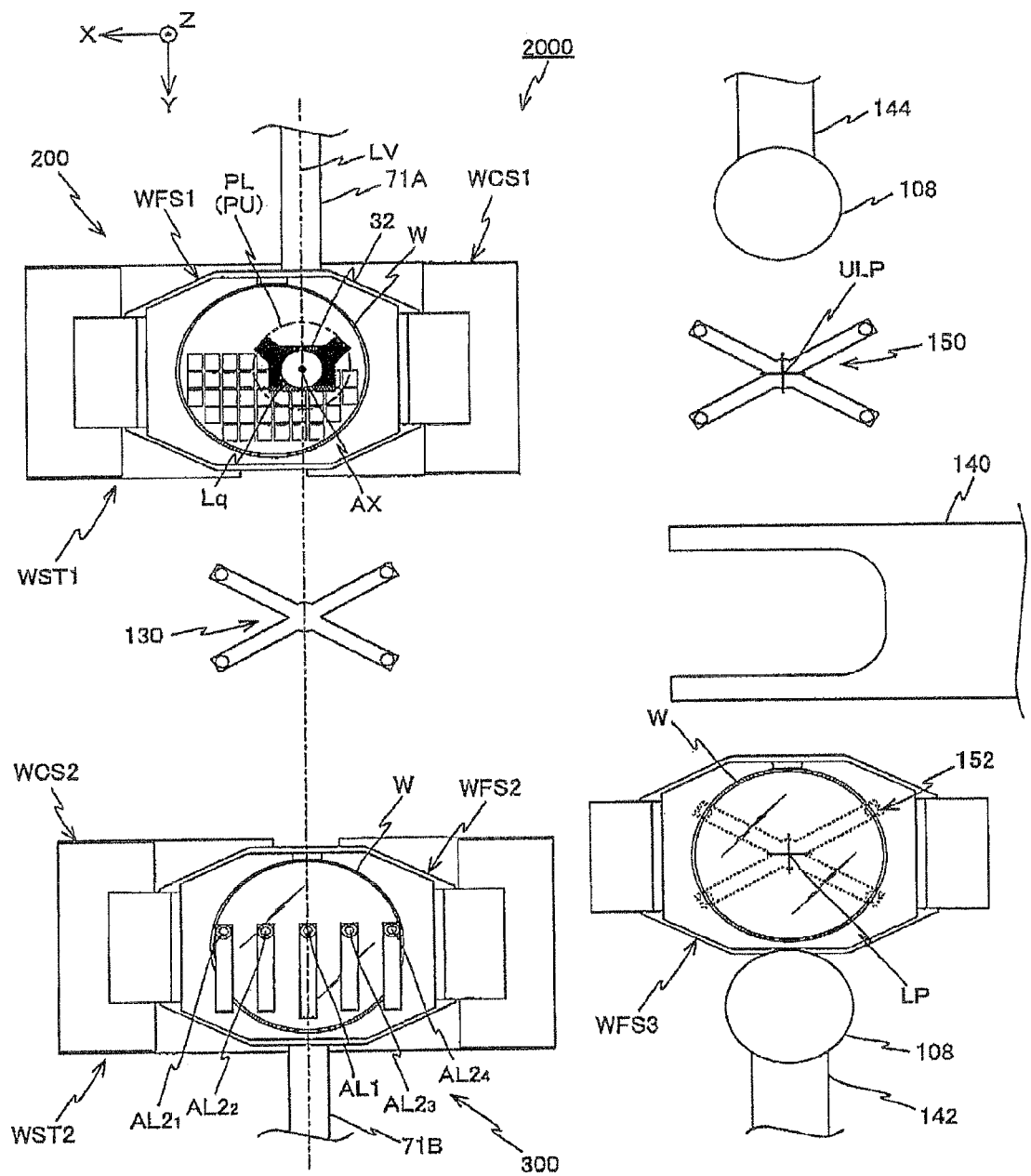
FIG. 46 is a view used to explain a parallel processing performed using the three fine movement stages WFS1, WFS3, and WFS3 (No. 1) in the exposure apparatus of the third embodiment.

FIG. 46 shows a state where fine movement stage WFS1 is at exposure station 200 and the exposure described above is being performed on wafer W held by fine movement stage WFS1, while fine movement stage WFS2 is at measurement station 300 and alignment is being performed on wafer W held by fine movement stage WFS2. At this point, fine movement stage WFS3 is waiting, while holding a new wafer W on load table 152.

Alignment to wafer W held by fine movement stage WFS2 is performed in a procedure similar to the one previously described by main controller 20. As a result of this wafer alignment, information on array coordinates of each shot area on wafer W acquired from the wafer alignment, such as for example, EGA, which is converted into array coordinates which are based on the second fiducial marks can be obtained.

FIG. 42 shows a state of when the wafer alignment has been completed. As it can be seen from FIG. 42, a state is shown where exposure to wafer W held by fine movement stage WFS1 in exposure station 200 is nearly completed.

Figure 48:
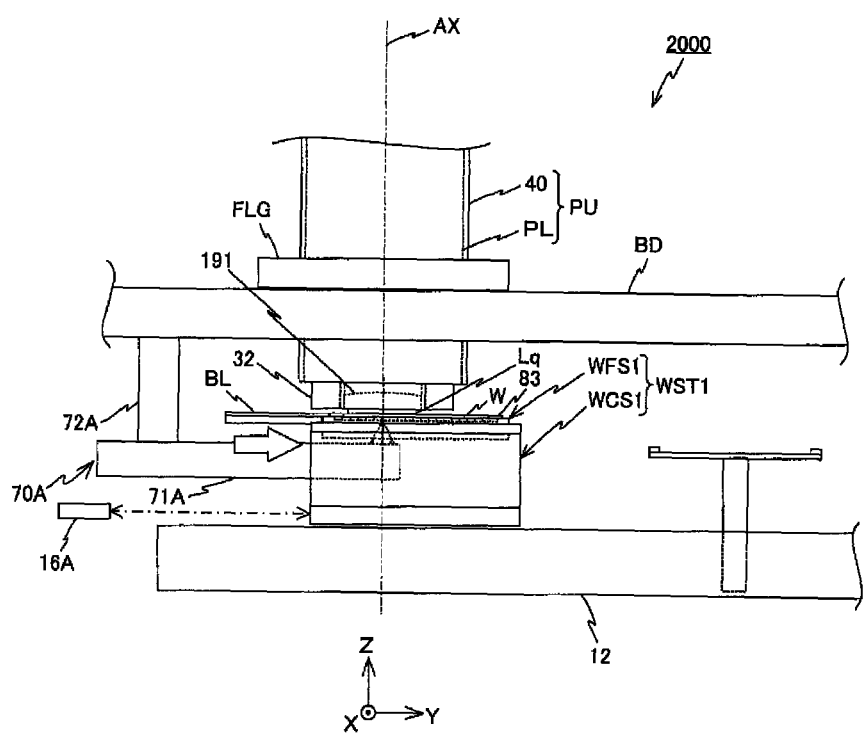
FIG. 48 is a view used to explain a delivery of a liquid immersion space (liquid Lq) performed between a fine movement stage and a movable blade in the exposure apparatus of the third embodiment (No. 2)
Figure 51A:
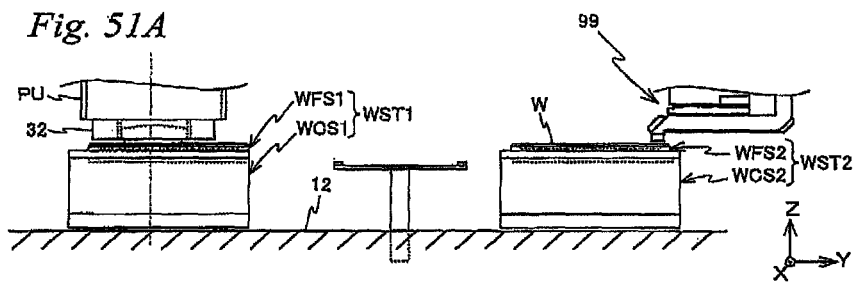
FIGS. 51A to 51D are views used to explain a parallel processing operation performed using the three fine movement stages WFS1, WFS2, and WFS3 (No. 2) in the exposure apparatus of the third embodiment.

FIG. 51A shows a positional relation of coarse movement stages WCS1 and WCS2 at the stage when wafer alignment to wafer W held by fine movement stage WFS2 described above has been completed. Main controller 20 waits for the exposure to wafer W on fine movement stage WFS1 to be completed, in a state where wafer stage WST2 is waiting at a position shown in FIG. 51A. FIG. 48 shows a state of wafer stage WST1 immediately after the exposure is completed.

Figure 47:
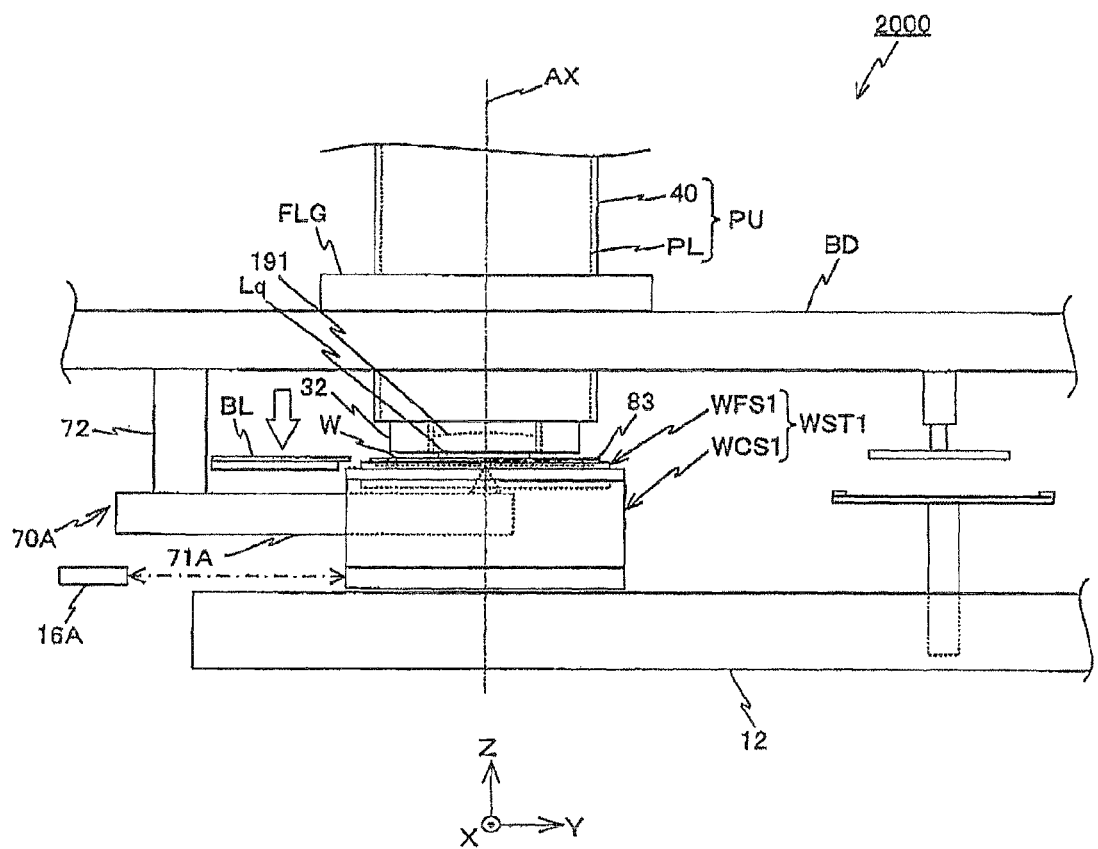
FIG. 47 is a view used to explain a delivery of a liquid immersion space (liquid Lq) performed between a fine movement stage and a movable blade in the exposure apparatus of the third embodiment (No. 1)

Prior to the completion of exposure, main controller 20 drives movable blade BL which has been waiting on the −Y side of projection unit PU downward by a predetermined amount via blade drive system 58, as is shown by an outlined arrow in FIG. 47. By this drive, the upper surface of movable blade BL is positioned to be flush with the upper surface of fine movement stage WFS1 (and wafer W) located below projection optical system PL, as shown in FIG. 47. Then, main controller 20 waits for the exposure to be completed in this state.

Then, when exposure has been completed, main controller 20 drives movable blade BL in the +Y direction by a predetermined amount (refer to the outlined arrow in FIG. 48) via blade drive system 58, so as to make movable blade BL be in contact or in proximity by a clearance of around 300 μm to fine movement stage WFS1. More specifically, main controller 20 sets movable blade BL and fine movement stage WFS1 to a scrum state.

Figure 49:
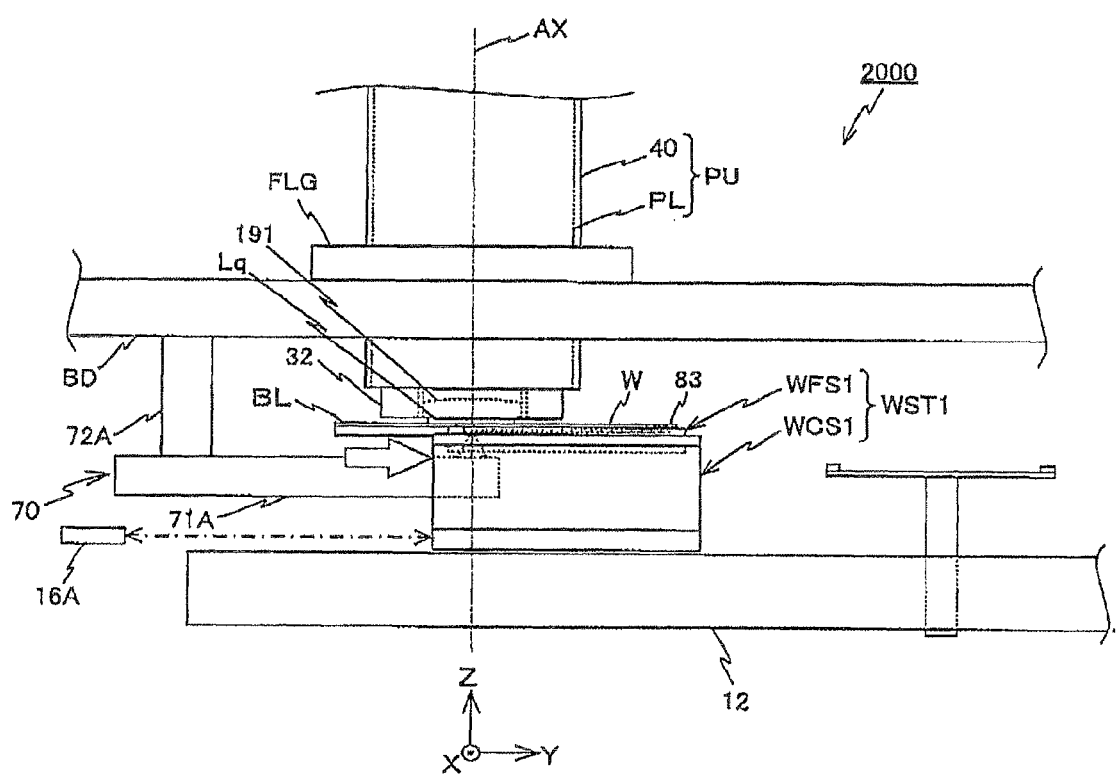
FIG. 49 is a view used to explain a delivery of a liquid immersion space (liquid Lq) performed between a fine movement stage and a movable blade in the exposure apparatus of the third embodiment (No. 3)

Next, as shown in FIG. 49, main controller 20 drives movable blade BL in the +Y direction (refer to the outlined arrow in FIG. 49) integrally with wafer stage WST1, while maintaining a scrum state between movable blade BL and fine movement stage WFS1. By this operation, the liquid immersion space area formed by liquid Lq held between tip lens 191 and fine movement stage WFS1 is passed from fine movement stage WFS1 to movable blade BL. FIG. 49 shows a state just before the liquid immersion space area formed by liquid Lq is passed from fine movement stage WFS1 to movable blade BL. In the state shown in FIG. 49, liquid Lq is held between tip lens 191, and fine movement stage WFS1 and movable blade BL.

Figure 50:
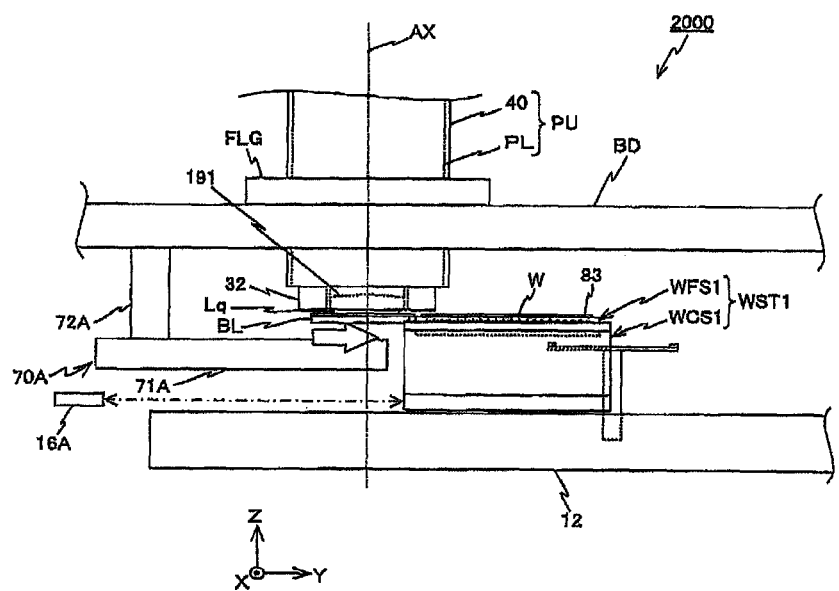
FIG. 50 is a view used to explain a delivery of a liquid immersion space (liquid Lq) performed between a fine movement stage and a movable blade in the exposure apparatus of the third embodiment (No. 4)
Figure 51B:
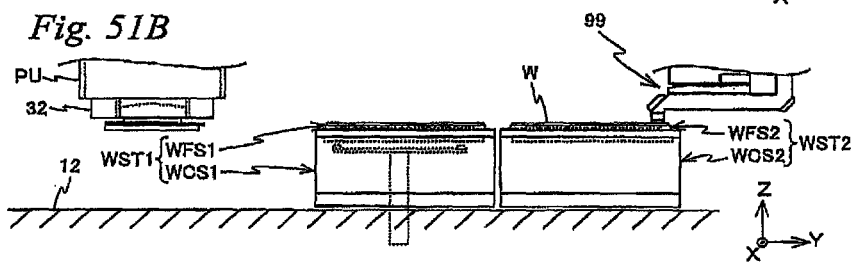
Figure 51C:
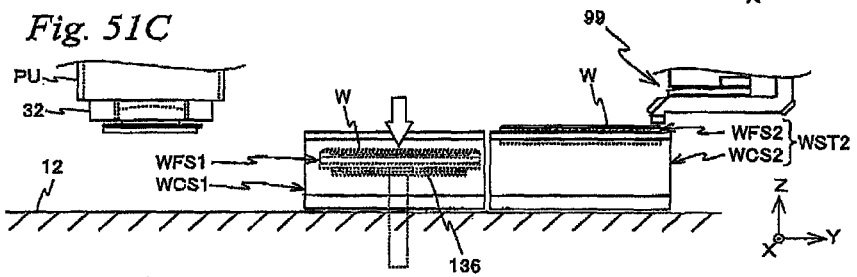
Figure 52:
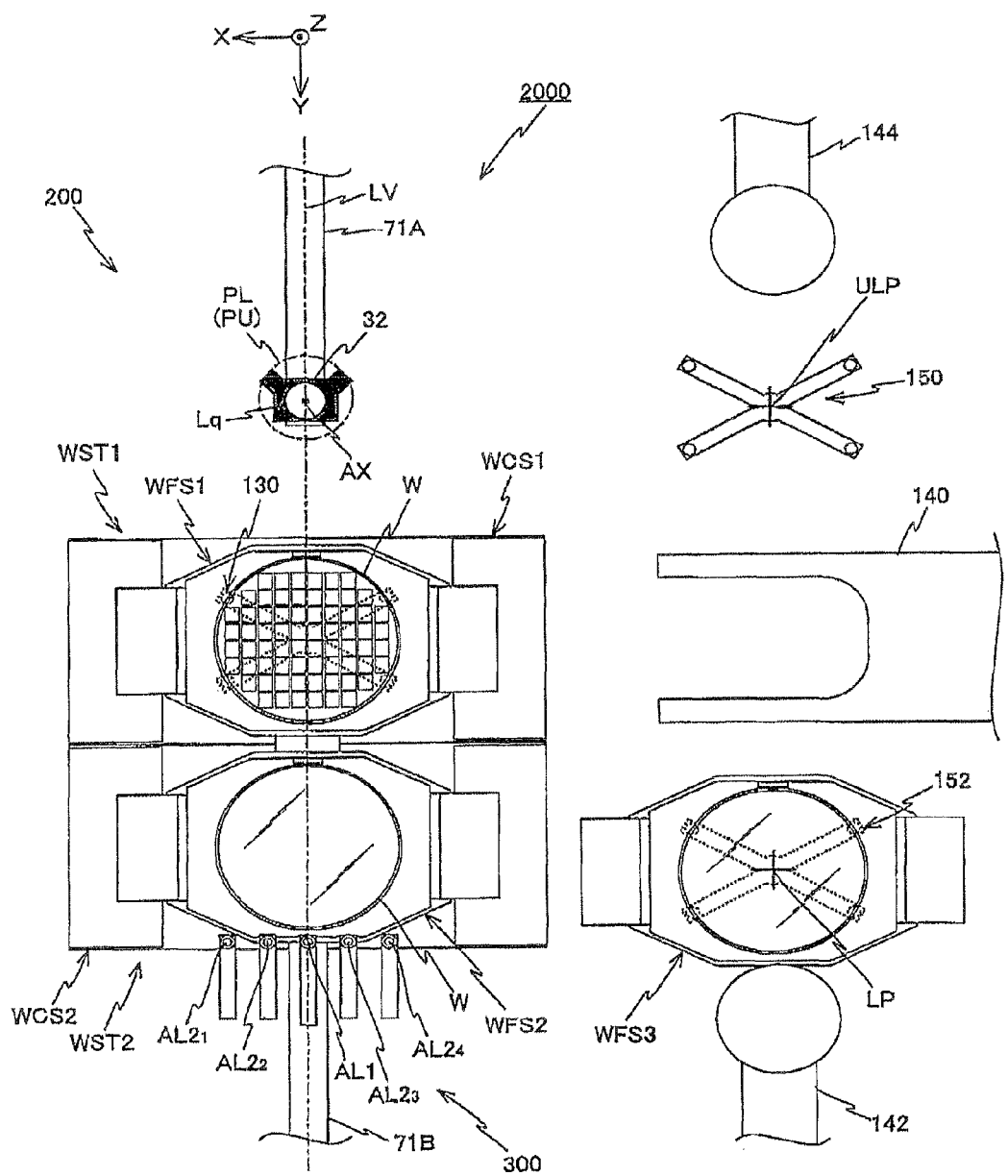
FIG. 52 is a view used to explain a parallel processing performed using the three fine movement stages WFS1, WFS2, and WFS3 (No. 3) in the exposure apparatus of the third embodiment.

Then, when the delivery of the liquid immersion space from fine movement stage WFS1 to movable blade BL is completed as shown in FIG. 50, main controller 20 drives coarse movement stage WCS1 holding fine movement stage WFS1 further in the +Y direction, and moves coarse movement stage WCS1 near coarse movement stage WCS2, which is waiting at a waiting position while holding fine movement stage WFS2. By this movement, a state occurs where coarse movement stage WCS1 houses center table 130 in its internal space, and also supports fine movement stage WFS1 right above center table 130, as shown in FIG. 51B. More specifically, fine movement stage WFS1 is carried right above center table 130 by coarse movement stage WCS1. FIG. 52 shows a state of exposure apparatus 2000 at this point in a planar view.

Then, main controller 20 drives table main body 136 upward via driver 132 of center table 130, and supports fine movement stage WFS1 from below.

And, in this state, main controller 20 releases the lock mechanism (not shown), and separates coarse movement stage WCS1 into the first section WCS1a and the second section WCS1b, By this operation, fine movement stage WFS1 is detachable from coarse movement stage WCS1. Therefore, main controller 20 drives table main body 136 supporting fine movement stage WFS1 downward, as is shown by the outlined arrow in FIG. 51C.

And then, main controller 20 locks the lock mechanism (not shown) after the first section WCS1a and the second section WCS1b are joined together.

Figure 51D:
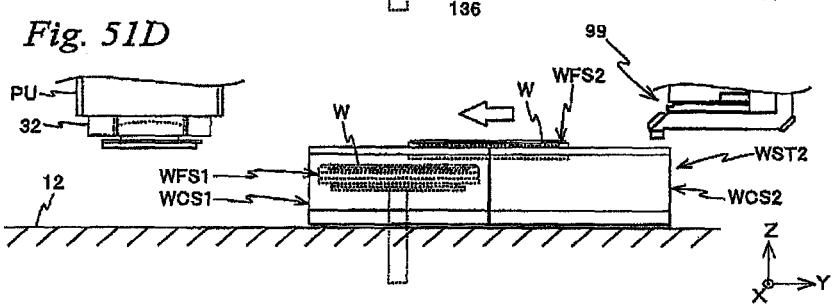

Next, main controller 20 makes coarse movement stage WCS2 almost come into contact with coarse movement stage WCS1, and also drives fine movement stage WFS2 in the −Y direction as is shown by the outlined arrow in FIG. 51D, and moves and mounts (a slide movement) fine movement stage WFS2 from coarse movement stage WCS2 onto coarse movement stage WCS1.

Figure 53A:
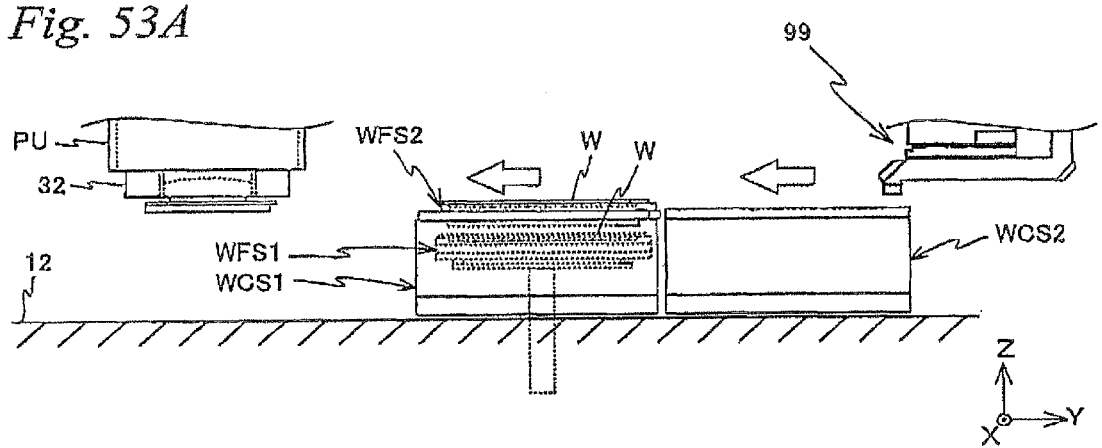
FIG. 53 is a view used to explain a parallel processing operation performed using the three fine movement stages WFS1, WFS2, and WFS3 (No. 4) in the exposure apparatus of the third embodiment.
Figure 53B:
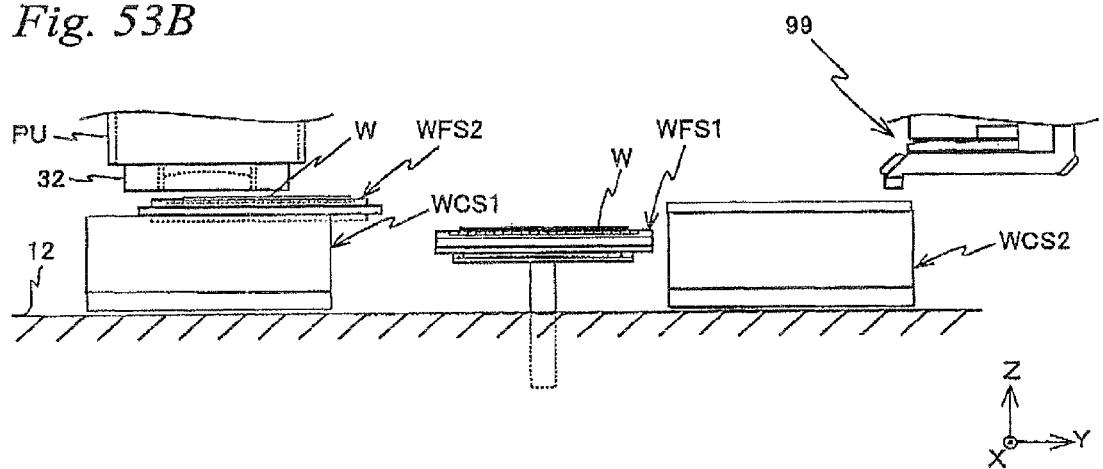
Figure 54:
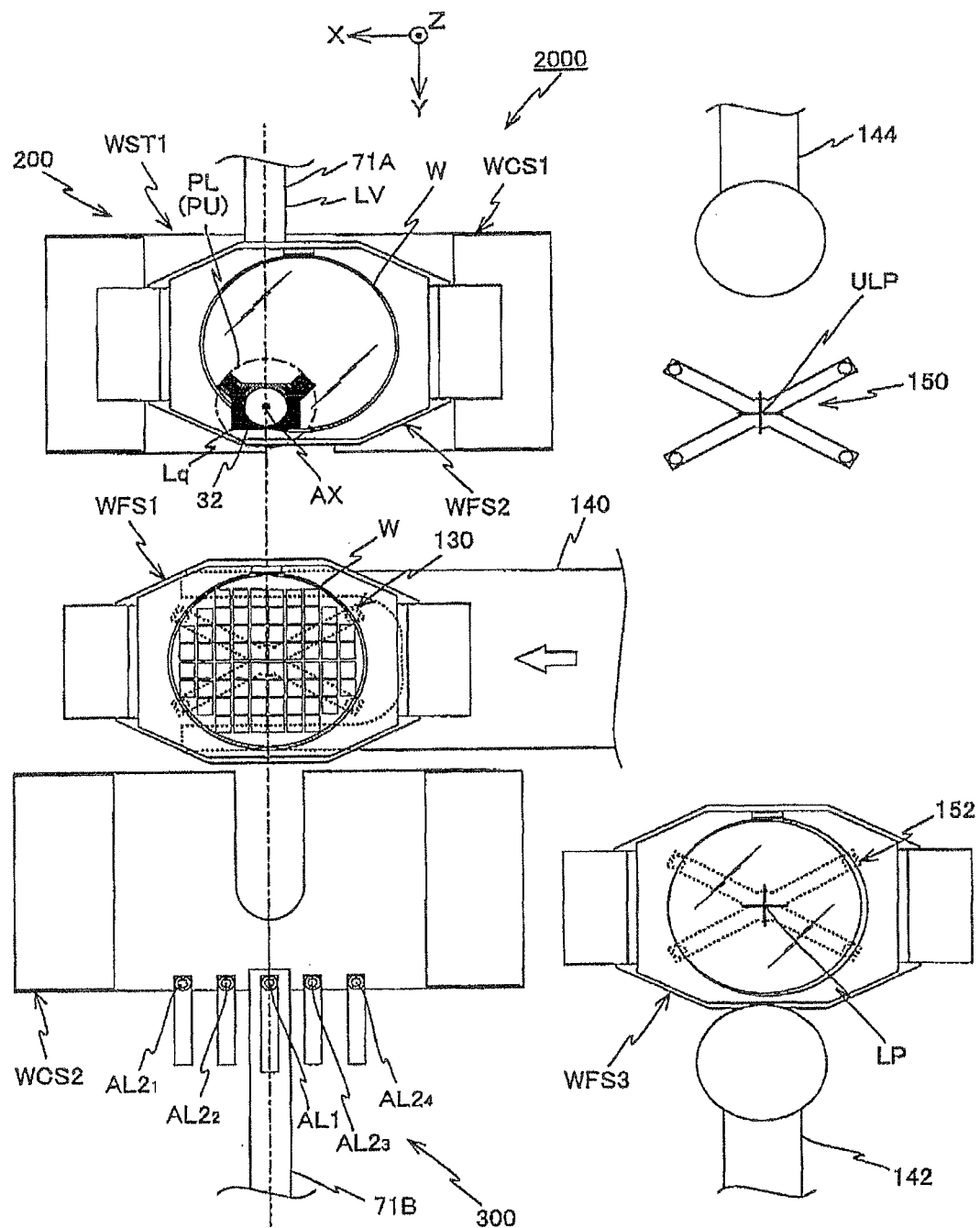
FIG. 54 is a view used to explain a parallel processing operation performed using the three fine movement stages WFS1, WFS2, and WFS3 (No. 5) in the exposure apparatus of the third embodiment.

Next, main controller 20 makes coarse movement stage WCS1 which supports fine movement stage WFS2 move in the −Y direction as is shown by the outlined arrow in FIG. 53A, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade BL previously described.

Then, prior to the beginning of exposure, main controller 20 performs reticle alignment in a procedure similar to the one previously described.

Figure 55:
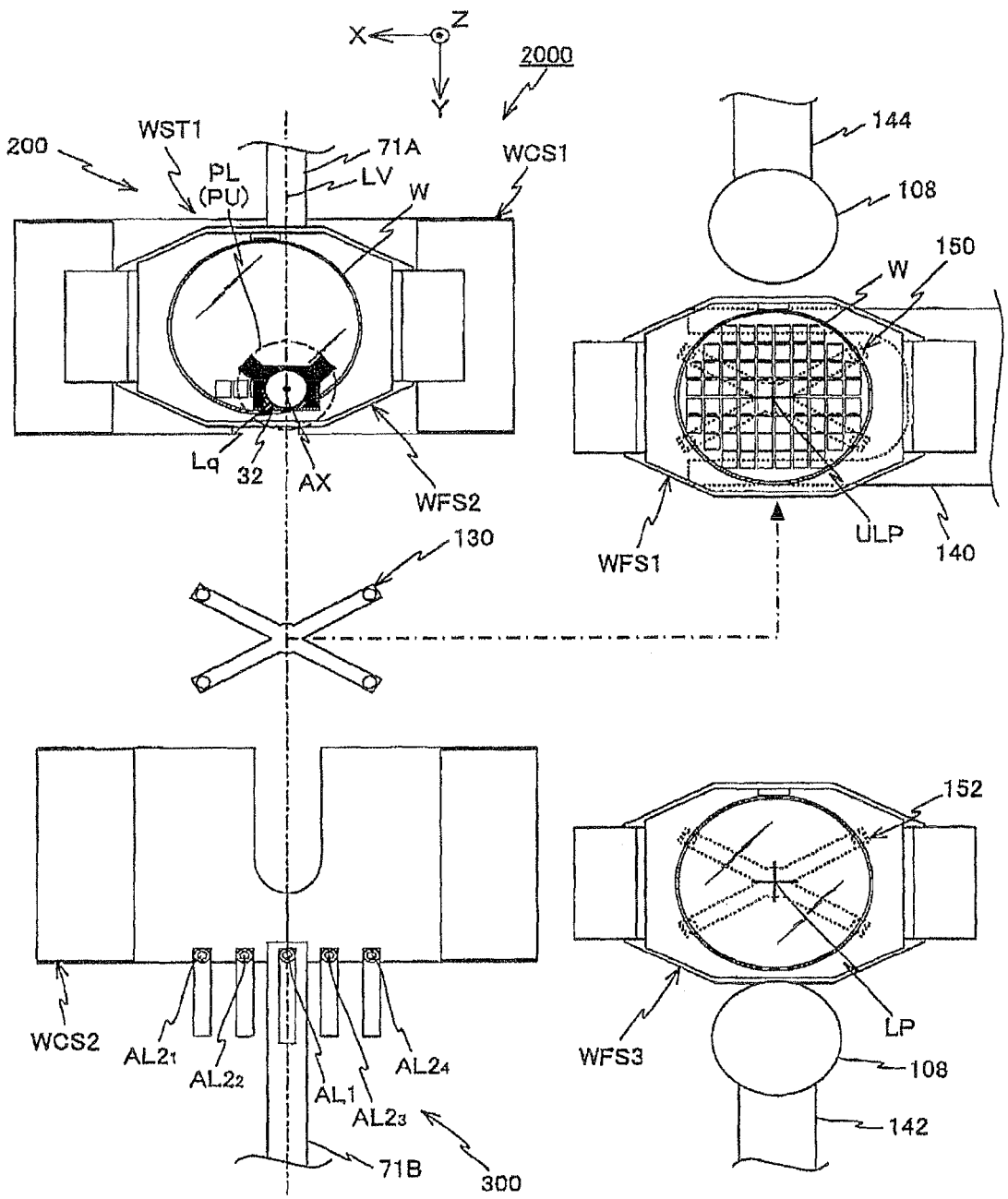
FIG. 55 is a view used to explain a parallel processing operation performed using the three fine movement stages WFS1, WFS2, and WFS3 (No. 6) in the exposure apparatus of the third embodiment.

Concurrently with the delivery of the liquid immersion space area, reticle alignment, and exposure described above, operations such as a. to g. described below are performed.

a. More specifically, robot arms 140 is driven in the X-axis direction, the Y-axis direction, and the Z-axis direction in a predetermined procedure (refer to the outlined arrows in FIG. 54) by main controller 20, and fine movement stage WFS1 holding wafer W on which exposure has been performed mounted on table main body 136 of center table 130 is carried onto unload table 150 by robot arms 140. FIG. 55 shows a state where fine movement stage WFS1 has been carried onto unload table 150. At this point, wafer W on fine movement stage WFS2 is being exposed, and fine movement stage WFS3 is waiting while holding a new wafer W on load table 152.

b. Then, based on instructions from main controller 20, wafer W which has undergone exposure is unloaded from fine movement stage WFS1 on unload table 150 by unload arm 144.

On this unloading, unload arm 144 is driven downward by main controller 20, until Bernoulli chuck 108 at the tip of unload arm 144 approaches wafer W (plate 83 of fine movement stage WFS1) to around several μm. Then, to maintain the gap of around several μm, the flow rate of the air blowing out from Bernoulli chuck 108 is adjusted by main controller 20. This allows wafer W to be held by suction in a non-contact manner from above by Bernoulli chuck 108, via a clearance of around several μm. Now, when fine movement stage WFS1 (or WFS2 or WFS3) is on unload table 150, fine movement stage WFS1 is connected to a pump, which is connected to a supply source of a pressurized gas, as is previously described, and in a similar manner, assistance is performed, with respect to a suction holding operation of wafer W using the Bernoulli chuck by releasing the suction of wafer W by the wafer holder and blowing out pressurized gas from below. Incidentally, in a state where the pump is in an idle state (non-operating state) including the case where a wafer is suctioned, the gas supply line is closed by an action of a check valve (not shown).

Figure 56:
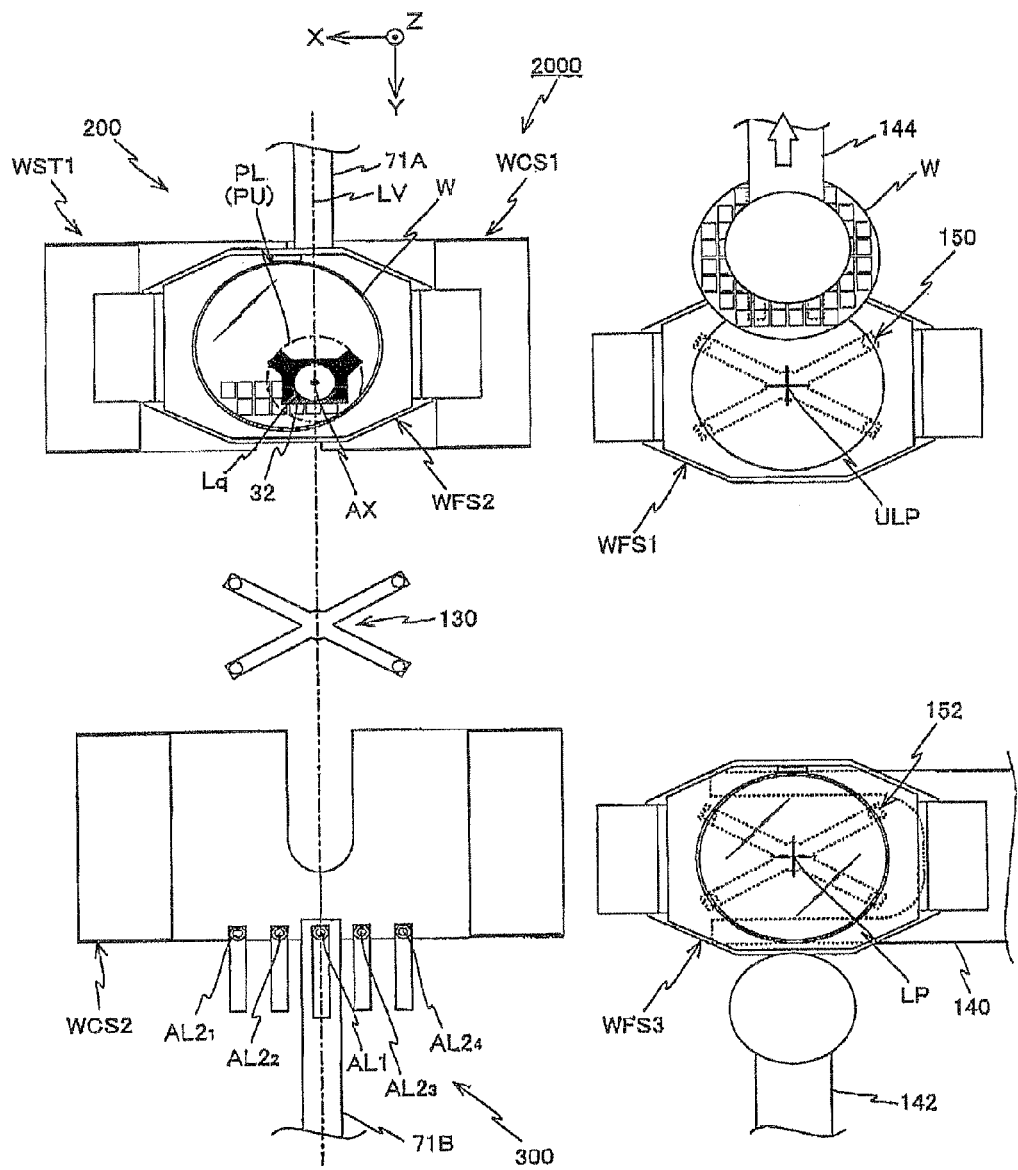
FIG. 56 is a view used to explain a parallel processing operation performed using the three fine movement stages WFS1, WFS2, and WFS3 (No. 7) in the exposure apparatus of the third embodiment.
Figure 57:
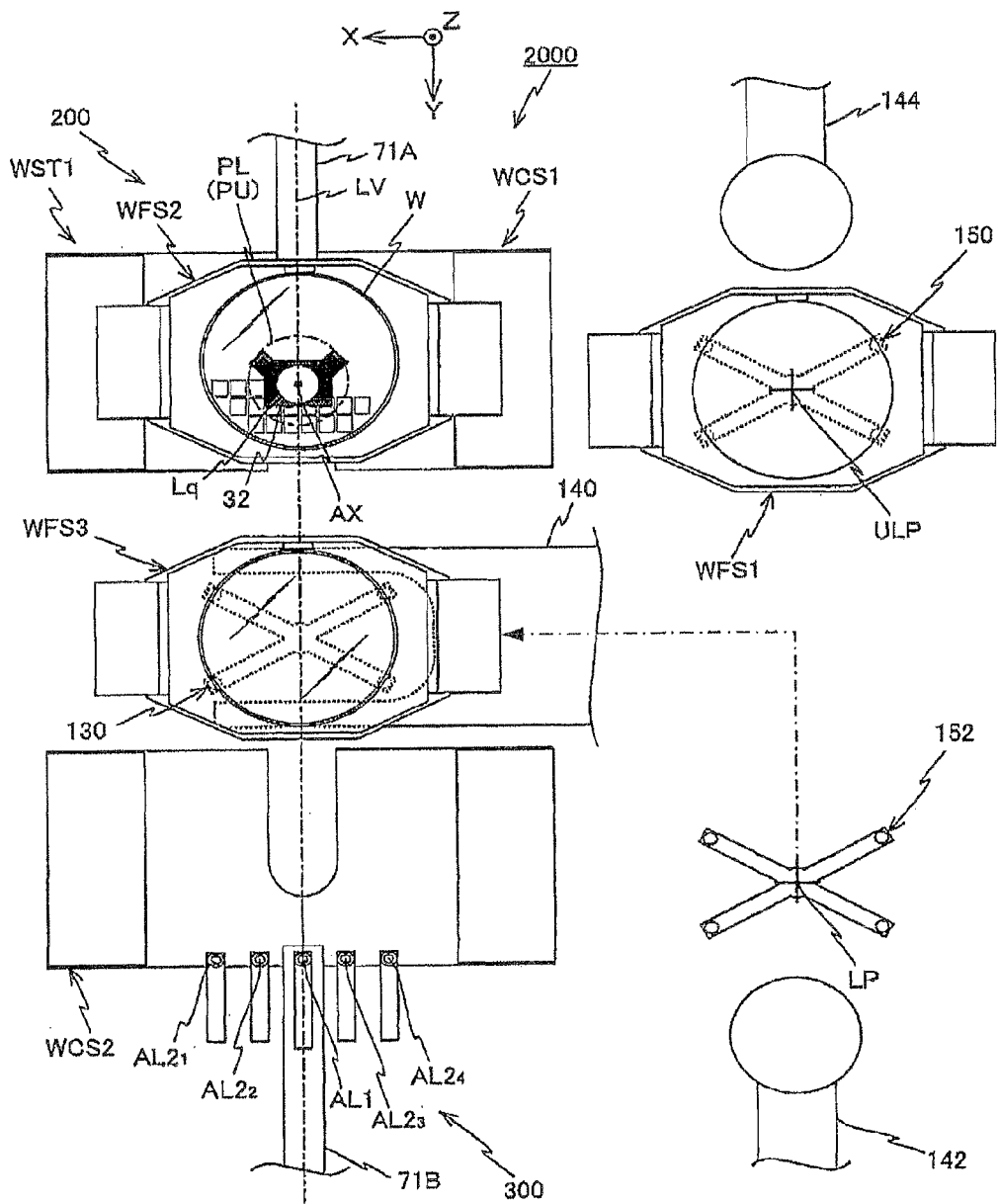
FIG. 57 is a view used to explain a parallel processing operation performed using the three fine movement stages WFS1, WFS2, and WFS3 (No. 8) in the exposure apparatus of the third embodiment.
Figure 58:
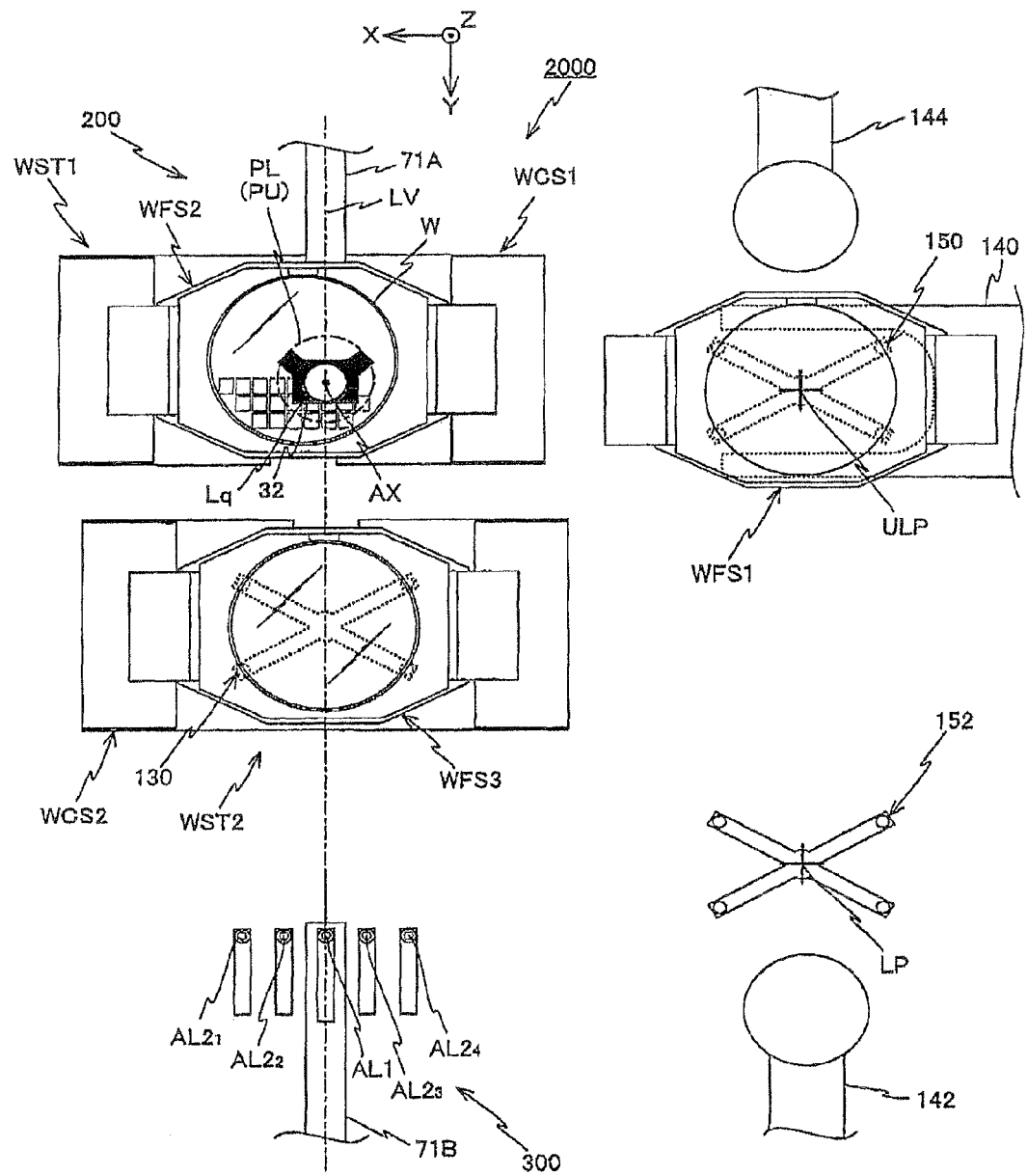
FIG. 58 is a view used to explain a parallel processing operation performed using the three fine movement stages WFS1 WFS2, and WFS3 (No. 9) in the exposure apparatus of the third embodiment.

And then, after unload arm 144 is driven upward, unload arm 144 is driven within the XY plane. This allows unload arm 144 to carry wafer W to a wafer unload position (for example, a delivery position (unloading side) of the wafer between a coater developer which is connected in-line to exposure apparatus 2000), and then is put on the wafer unload position. FIG. 56 shows a state where unload arm 144 moves away from unload table 150.

c. In parallel with unloading wafer W which has been exposed described above, robot arms 140 is driven in the X-axis direction, the Y axis-direction, and the Z-axis direction in a predetermined procedure by main controller 20, and fine movement stage WFS3 holding the new wafer W mounted on load table 152 is carried to center table 130 onto table main body 136, by robot arms 140. FIG. 57 shows a state where carriage of fine movement stage WFS3 onto center table 130 has been completed. After the carriage, table main body 136 of center table 130 is driven upward by a predetermined amount via driver 132 by main controller 20. At this point in time, on fine movement stage WFS2, the exposure of wafer W is being, continued.

d. Subsequently, coarse movement stage WCS2 which has been waiting in the vicinity of an alignment completing position is driven in the −Y direction by main controller 20, and fine movement stage WFS3 supported on table main body 136 is mounted on coarse movement stage WCS2, as shown in FIG. 58. Then, table main body 136 is driven downward by a predetermined amount. By the operation, fine movement stage WFS3 becomes supported by coarse movement stage WCS2.

e. Then, coarse movement stage WCS2 is driven in the +Y direction by main controller 20, and is moved to measurement station 300.

f. Thereafter, detection of the second fiducial marks on fine movement stage WFS3 supported by coarse movement stage WCS2, alignment of wafer W on fine movement stage WFS3 and the like are performed in procedures similar to the ones previously described. Then, by main controller 20, array coordinates of each shot area on wafer W acquired from the wafer alignment are converted into array coordinates which are based on the second fiducial marks. In this case as well, position measurement of fine movement stage WFS3 on alignment is performed, using fine movement stage position measurement system 70B.

g. In parallel with operations such as attaching fine movement stage WFS3 to coarse movement stage WCS2, moving to measurement station 300, and alignment of wafer W on fine movement stage WFS3 described above, robot arm 140 is driven in the Z-axis direction and the Y-axis direction (and the X-axis direction) in a predetermined procedure by main controller 20, so that fine movement stage WFS1 mounted on unload table 150 is carried to load table 152 by robot arm 140, and following this operation, a new (not yet exposed) wafer W is loaded on fine movement stage WFS1 roughly in a reversed procedure of the unloading previously described by main controller 20.

Figure 59:
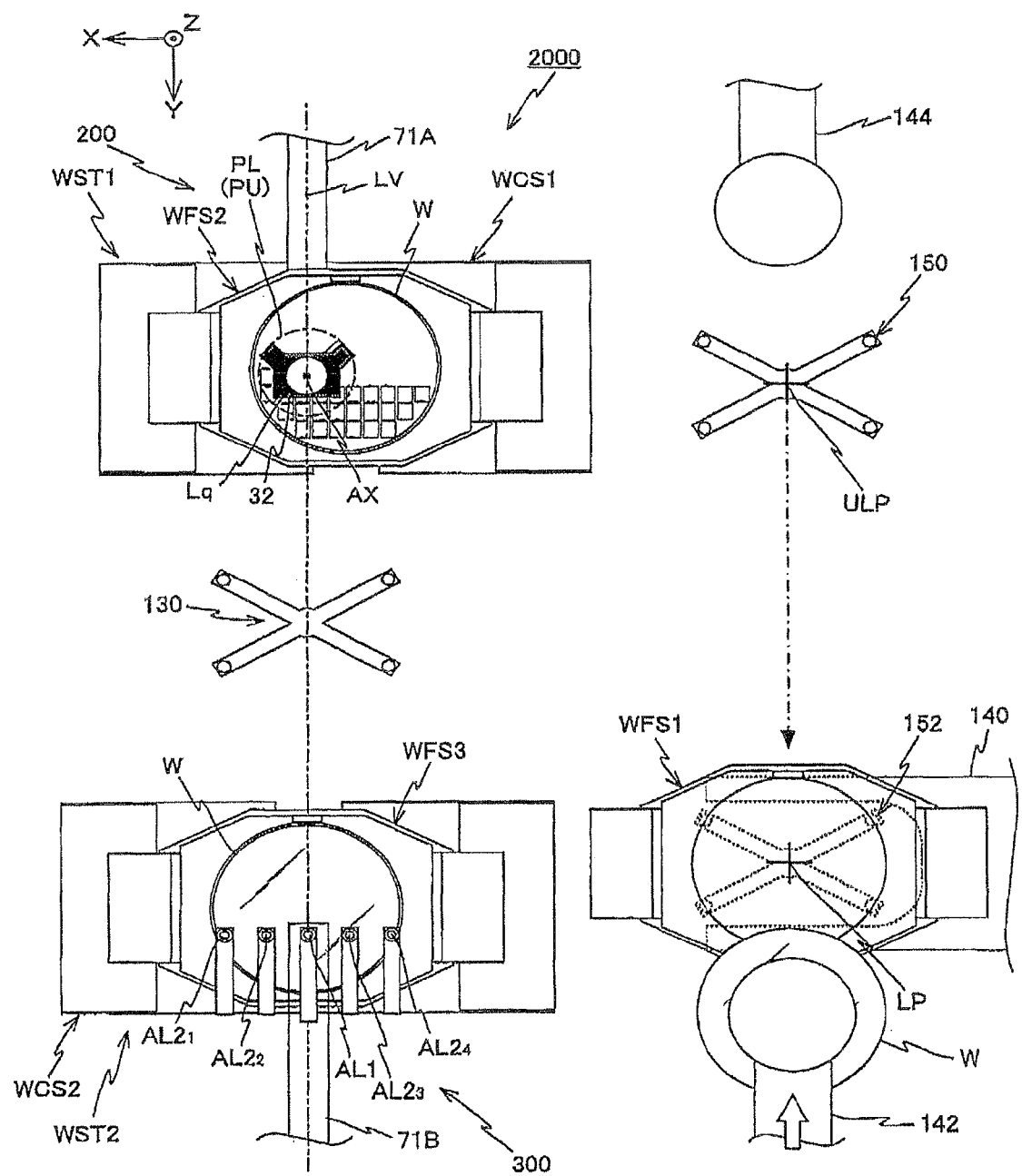
FIG. 59 is a view used to explain a parallel processing operation performed using the three fine movement stages WFS1, WFS2, and WFS3 (No. 10) in the exposure apparatus of the third embodiment.

More specifically, main controller 20 controls load arm 142 and makes load arm 192 receive (makes Bernoulli chuck 108 hold the wafer by suction) wafer W which is at a wafer loading position (for example, a delivery position (loading side) of the wafer between the coater developer), and makes load arm 142 carry wafer W to an area above fine movement stage WFS1 mounted on load table 152. FIG. 59 shows a state in which wafer W is being carried. At this point in time, exposure to wafer W held by fine movement stage WFS1 is being continued, as well as the alignment of wafer W held by fine movement stage WFS3.

Then, main controller 20 drives load arm 142 holding wafer W downward to a position until the back surface of wafer W comes in contact with the wafer holder of fine movement stage WFS2. Then, main controller 20 releases the suction of wafer W by Bernoulli chuck 108, and makes load arm 142 withdraw to a predetermined waiting position. This allows a new wafer W to be loaded on fine movement stage WFS1 mounted on load table 152. In this case, when fine movement stage WFS1 (or WFS2 or WFS3) is on load table 152, fine movement stage WFS1 is connected to a vacuum pump (not shown), and by main controller 20 making the vacuum pump operate, gas inside the decompression chamber (decompression space) formed by the wafer holder (omitted in drawing) and the back surface of wafer W is exhausted outside, which creates a negative pressure within the decompression chamber and starts the suction of wafer W by the wafer holder. And, when the vacuum pump is suspended by main controller 20, the exhaust pipe line is closed by an action of a check valve (not shown). Accordingly, fine movement stage WFS2 can be separated from the coarse movement stage and can be carried without any problems.

After wafer W has been loaded on fine movement stage WFS1, a state similar to the case in FIG. 46, or more specifically, a state occurs in which the exposure described above is performed on wafer W held by fine movement stage WFS2 at exposure station 200, alignment is being performed on wafer W held by fine movement stage WFS3 which is at measurement station 300, and fine movement stage WFS1 is waiting while holding a new wafer W on load table 152.

Hereinafter, a parallel processing as is previously described is repeatedly performed by main controller 20, sequentially using fine movement stages WFS1, WFS2, and WFS3, and an exposure processing to a plurality of wafer Ws is continuously performed.

As is described in detail so far, according to exposure apparatus 2000 of the third embodiment, an equivalent effect can be obtained as in exposure apparatus 100 of the first embodiment previously described, because the configuration is similar to the exposure apparatus of the first embodiment previously described except for some parts. Further, in addition, according to exposure apparatus 2000 of the third embodiment, in the case the fine movement stage (one of WFS1 WFS2, and WFS3) holding wafer W is at a place besides the area above coarse movement stages WCS1 and WCS2, or to be more concrete, on center table 130, unload table 150, or load table 152, exchange of wafer W is performed by an exchange system which includes robot arm 140, unload arm 144, load arm 142, center table 130, and main controller 20 which controls these arms 140, 144, and 142, and center table 130. In other words, the exchange wafer W is performed, regardless of the operation of coarse movement stages WCS1 and WCS2. Therefore, in exposure station 200, concurrently with exposure of the wafer held by one of the fine movement stages (one of WFS1, WFS2, and WFS3), wafer exchange of a wafer held by another fine movement stage can be performed, or in measurement station 300, concurrently with alignment (measurement) to wafer W held by one of the fine movement stages, wafer exchange of a wafer held by another fine movement stage can be performed. In this case, in the third embodiment, because there are three fine movement stages, concurrently with exposure of wafer W held by one fine movement stage (e.g., WFS1) in exposure station 200 and alignment (measurement) of wafer W held by another fine movement stage (e.g., WFS2) in measurement station 300, it becomes possible to perform the exchange of wafer W held by another fine movement stage (e.g., WFS3). That is, because the three operations which are exposure, alignment, and wafer exchange can be performed concurrently, it becomes possible to improve the throughput remarkably. Accordingly, it is possible to achieve wafer processing with a higher throughput than before, for example, even in the case when a 450 mm wafer is subject to processing.

Further, in exposure apparatus 200 of the third embodiment, because the three operations which are exposure, alignment, and wafer exchange can be performed concurrently, there is no risk, especially of the throughput decreasing, even if, for example, the same amount of time as the exposure time is taken for alignment. Accordingly, alignment shot areas which are subject to wafer alignment can be increased, and for example, all the shot areas can become an alignment shot area. This allows wafer alignment to be performed with high precision, which in turn can improve the overlay accuracy.

Incidentally, in the third embodiment above, three fine movement stages WFS1, WFS2, and WFS3 were provided, and when a fine movement stage was put on center table 130 between measurement station 300 and exposure station 200, wafer exchange was performed by moving the fine movement stage from the position on center table 130 to another position. However, the wafer exchange method is not limited to this. For example, the configuration of the wafer exchange system is not limited in particular, as long as wafer exchange can be performed on the fine movement stage when fine movement stage WFS1, WFS2, or WFS3 holding wafer W which has been exposed is located at a place besides exposure station 200 and measurement station 300 within the XY plane. In such a case, wafer exchange is performed regardless of the exposure processing and the measurement processing such as alignment. Therefore, in exposure station 200, concurrently with exposure of the wafer held by one of the fine movement stages, wafer exchange of a wafer held by another fine movement stage can be performed, and furthermore, concurrently with these operations, wafer exchange of a wafer held by another fine movement stage can be performed.

Alternatively, for example, only two fine movement stages WFS1 and WFS2 can be prepared. In this case, for example, when fine movement stage WFS1 (or WFS2) is on center table 130 which is placed on the movement path of fine movement stages WFS1 and WFS2 between measurement station 300 and exposure station 200, exchange of wafer W can be performed on fine movement stage WFS1 (or WFS2). In such a case, after the exposure of wafer W held by fine movement stage WFS1 or WFS2 has been performed at exposure station 200, prior to moving the fine movement stage WFS1 or WFS2 to measurement station 300, it becomes possible to perform exchange of a wafer which has been exposed held by fine movement stage WFS1 and WFS2 to a new wafer (that has not yet been exposed) swiftly at the exchange position, which allows a wafer exchange with less loss of time.

Incidentally, when focusing attention on carriage of the fine movement stage off of, or on center table 130 in the third embodiment above, the fine movement stage holding wafer W which has been exposed is carried off from center table 130 by robot arm 140 under the control of main controller 20, and the fine movement stage holding a new wafer W is carried onto center table 130 by robot arms 140. Accordingly, it can also be said that wafer W is exchanged integrally with the fine movement stage by robot arm 140.

Further, in the third embodiment above, in the case grating RG is provided on the back surface of fine movement stages WFS1 and WFS2, center table 130 needs to hold fine movement stages WFS1 and WFS2 so that the stages do not come into contact with grating RG.

In the third embodiment above, in the case coarse movement stage WCS1 and coarse movement stage WCS2 are made to be in proximity to deliver fine movement stages WFS1, WFS2, or WFS3 between the two coarse movement stages WCS1 and WCS2 reciprocally, both of the stages do not have to be extremely close together. Coarse movement stages WCS1 and WCS2 can be distanced within a range where the fine movement stage is not tilted greatly (that is, the stator and the mover of the linear motor do not come into contact) when the fine movement stage is moved between coarse movement stages WCS1 and WCS2.

Incidentally, in each of the first, second, and third embodiments above, while the case has been described where coarse movement stages WCS1 and WCS2 were separable into the first section and the second section as well as the first section and the second section being engageable, besides this, the first section and the second section may have any type of arrangement, even when the first section and the second section are physically constantly apart, as long as they are reciprocally approachable and dividable, and on separation, a holding member (the fine movement stage in the embodiment above) is detachable, whereas when the distance is closed, the holding member is supportable. Or, on the contrary, the coarse movement stage does not necessarily have to be separated into two sections, as in the fourth embodiment below. In this case, the notch on the bottom surface of coarse movement stages WCS1 and WCS2 where the shaft of the center table can enter, does not necessarily have to be provided. Further, in a coarse movement stage which is separable into a first section and a second section as in coarse movement stages WCS1 and WCS2 in the first to third embodiments above, the lock mechanism to lock both sections does not necessarily have to be provided.

A Fourth Embodiment

Next, a fourth embodiment of the present invention will be described, referring to FIGS. 60 to 71. Here, from a viewpoint of avoiding repetition, the same or similar reference numerals will be used for the same or similar sections as in the first and third embodiments previously described, and a detailed description thereabout will be omitted.

Figure 60:
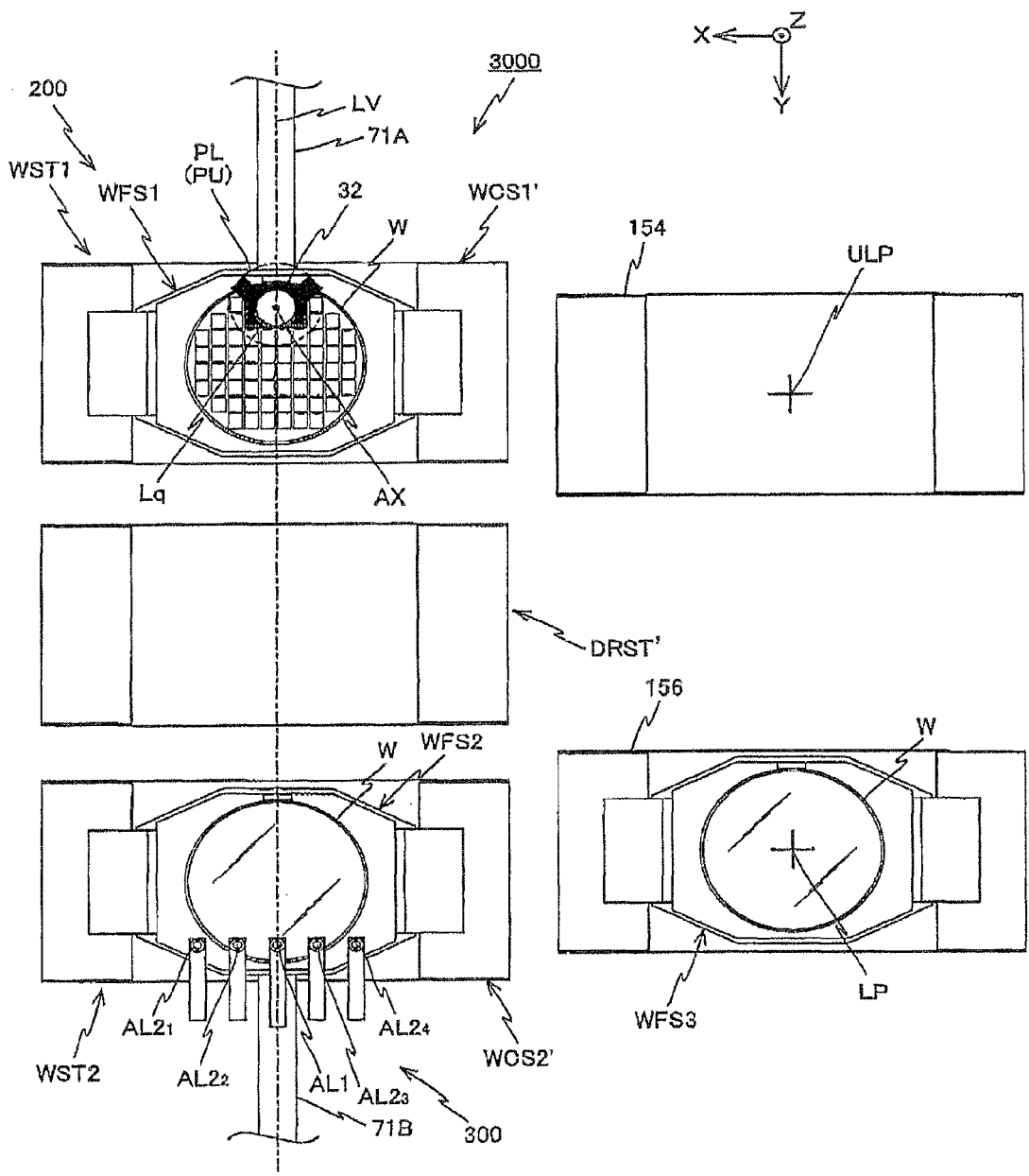
FIG. 60 is a planar view showing a schematic configuration of the exposure apparatus of the fourth embodiment.
Figure 61:
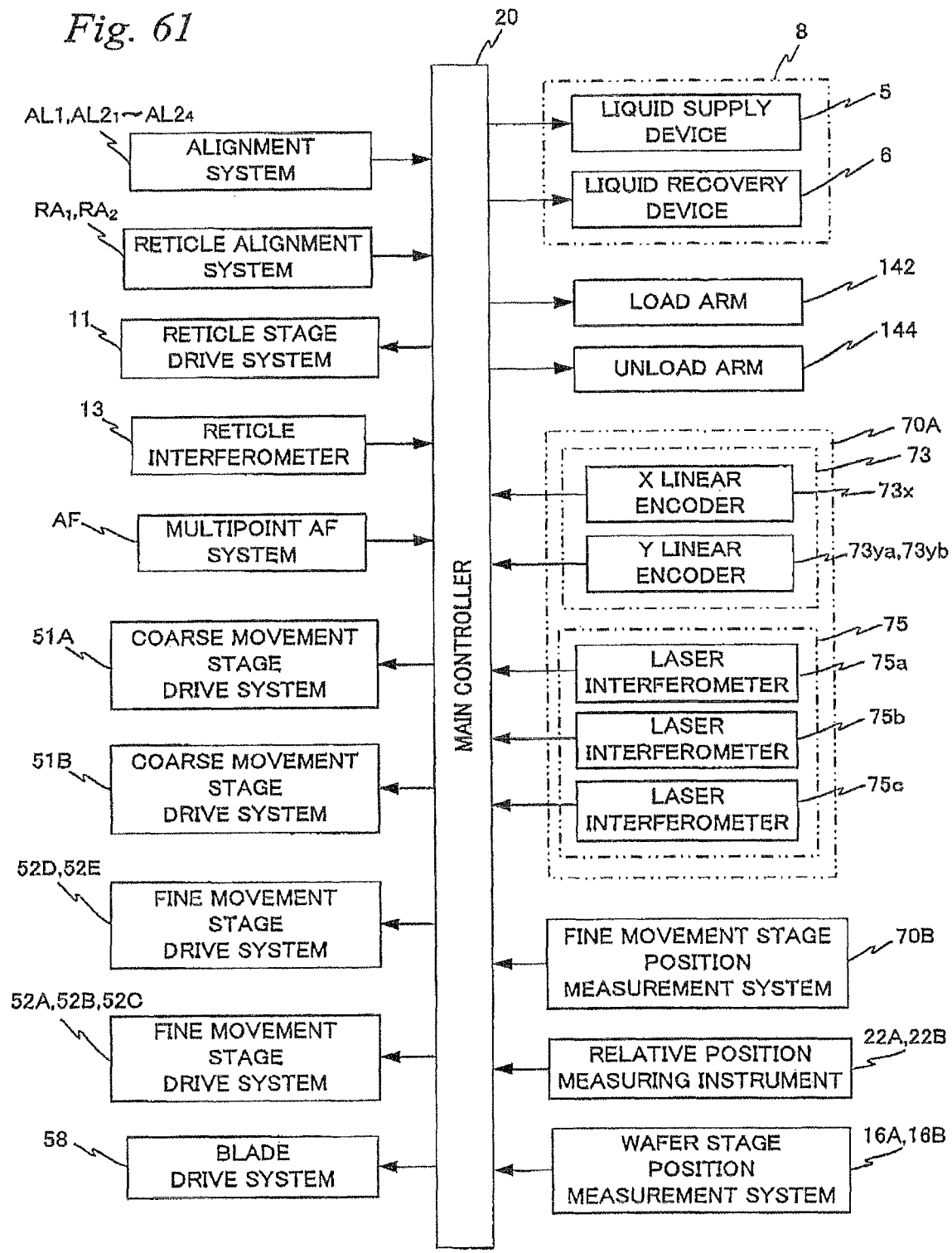
FIG. 61 is a block diagram showing a configuration of a control system of the exposure apparatus in FIG. 60.

FIG. 60 shows a schematic configuration of an exposure apparatus 3000 in the fourth embodiment in a planar view. Further, FIG. 61 is a block diagram showing an arrangement of a control system in exposure apparatus 3000. Exposure apparatus 3000 is a projection exposure apparatus by the step-and-scan method, or a so-called scanner.

As it can be seen when comparing FIG. 60 and FIG. 42, in exposure apparatus 3000 of the fourth embodiment, a relay stage DRST' is placed in between measurement station 300 and exposure station 200, instead of center table 130 previously described. In the fourth embodiment, corresponding to the point that center table 130 is not provided, the notch previously described is not formed in coarse movement slider section 91 of coarse movement stages WCS1' and WCS2'. Further, in the fourth embodiment, because delivery of the fine movement stage is not performed between coarse movement stages WCS1', WCS2' and center table 130, coarse movement stages WCS1' and WCS2' do not have to be separated into two sections. Therefore, coarse movement stages WCS1' and WCS2' employ an inseparable configuration. More specifically, coarse movement stages WCS1' and WCS2' are configured in a similar manner as in coarse movement stages WCS1 and WCS2 of the third embodiment previously described, except for the presence of the notch and whether or not the stages are separable.

In exposure apparatus 3000 of the fourth embodiment, a load stage 156 and an unload stage 154 are installed at unloading position ULP and loading position LP, instead of unload table 150 and load table 152 in the third embodiment previously described. Load stage 156 and unload stage 154 are basically configured in a similar manner as in coarse movement stages WCS1' and WCS2', however, in the bottom plate section corresponding to coarse movement slider section 91 previously described, a magnet unit (permanent magnet 18) and an air bearing 94 are not provided. Incidentally, instead of load stage 156 and unload stage 154, a member in which a pair of stator sections 93a and 93b is integrated in a positional relation similar to the one previously described can be used.

Relay stage DRST' is configured similar to coarse movement stages WCS1' and WCS2'. In other words, unlike relay stage DRST in the first embodiment previously described, relay stage DRST' is not equipped with a carrier apparatus 46 which was installed inside the stage main body. Further, in the fourth embodiment, although it is not shown, base board 12 is provided extending in an area between load stage 156 and unload stage 154, and relay stage DRST' is driven along base board 12 by a drive system consisting of a planar motor so that the stage moves in between a position shown in FIG. 60 and a position between load stage 156 and unload stage 154. In the fourth embodiment, robot arm 140 is not provided.

Relay stage DRST' can support (hold) fine movement stages WFS1, WFS2, or WFS3 in a non-contact manner as in coarse movement stages WCS1' and WCS2', and the fine movement stage supported by relay stage DRST' can be driven in directions of six degrees of freedom (X, Y, Z, θx, θy, and θz) by fine movement stage drive system 52C (refer to FIG. 61) with respect to relay stage DRST'. However, the fine movement stage should be slidable at least in the Y-axis direction with respect to relay stage DRST'.

Similarly, load stage 156 and unload stage 154 previously described can also support (hold) fine movement stages WFS1, WFS2, or WFS3 in a non-contact manner, and the fine movement stage supported by load stage 156 and unload stage 154 can be driven at least in the Y-axis direction by fine movement stage drive systems 52D and 52E (refer to FIG. 61).

Positional information (also including rotation information in the θz direction) in the XY plane of relay stage DRST' is measured by a position measurement system (not shown) including, for example, an interferometer and/or an encoder and the like. The measurement results of the position measurement system is supplied to main controller 20 (refer to FIG. 61) for position control of relay stage DRST'.

Further, in exposure apparatus 3000, the control content of main controller 20 differs from the third embodiment to some extent, according to the difference described above. However, except for such differences, exposure apparatus 3000 is configured similar to exposure apparatus 2000.

Next, a parallel processing operation which is performed using the three fine movement stages WFS1, WFS2, and WFS3 in exposure apparatus 3000 of the fourth embodiment will be described.

Figure 62:
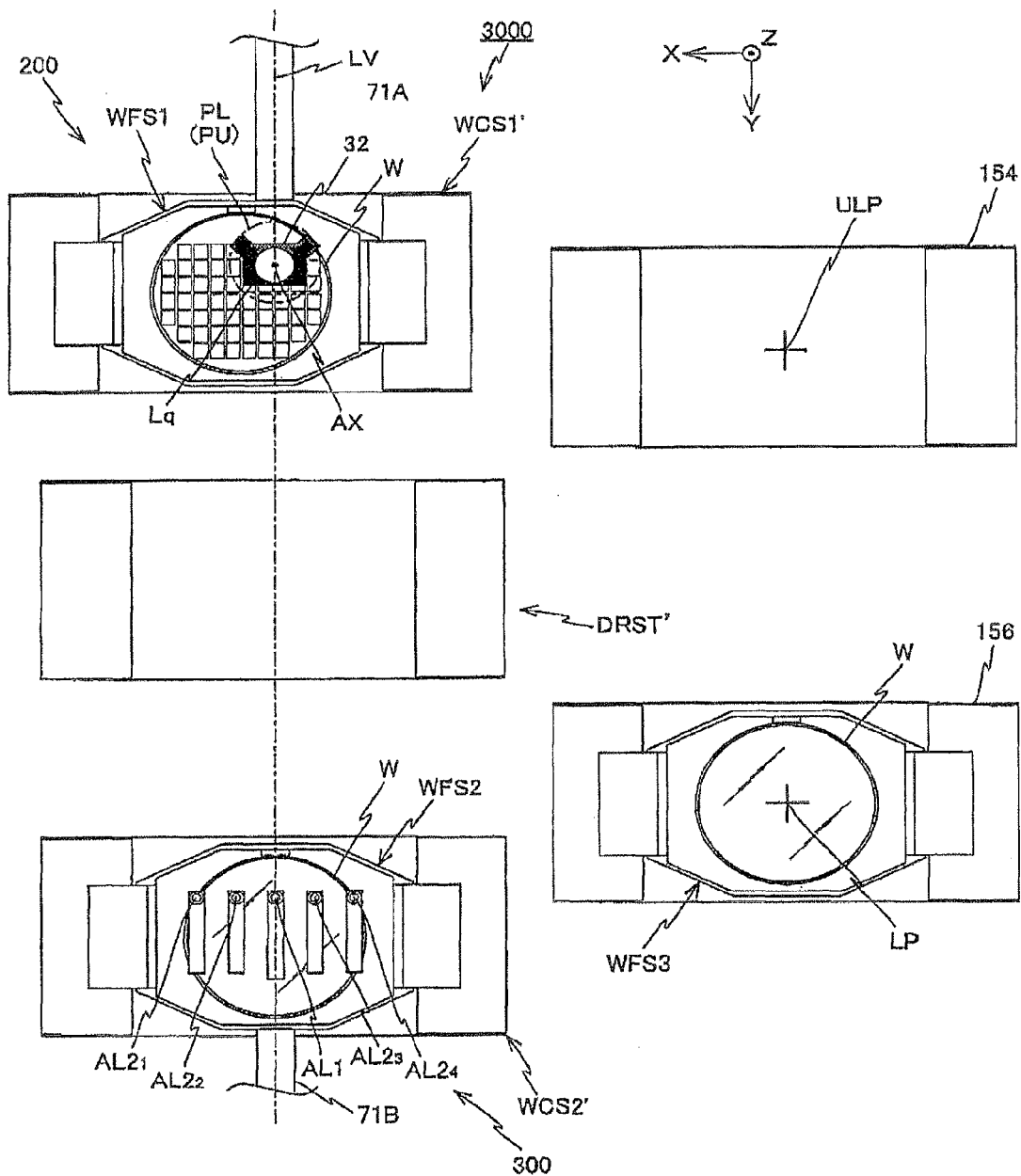
FIG. 62 is a view used to explain a parallel processing operation performed using the three fine movement stages WFS1, WFS2, and WFS3 (No. 1) in the exposure apparatus of the fourth embodiment.

FIG. 62 shows a state where fine movement stage WFS1 is at exposure station 200 and the exposure previously described is being performed on wafer W held by fine movement stage WFS1, while fine movement stage WFS2 is at measurement station 300 and an alignment similar to the previously description is being performed on wafer W held by fine movement stage WFS2. At this point, fine movement stage WFS3 is waiting, while holding a new wafer W on load table 156.

Then, wafer alignment to wafer W held by fine movement stage WFS2 is completed. FIG. 60 shows a state of when the wafer alignment has been completed. As it can be seen from FIG. 60, a state is shown where exposure to wafer W held by fine movement stage WFS1 in exposure station 200 is nearly completed.

Main controller 20 waits for the exposure to wafer W on fine movement stage WFS1 to be completed, in a state where wafer stage WST2 and relay stage DRST' are waiting at a position shown in FIG. 60.

Figure 63:
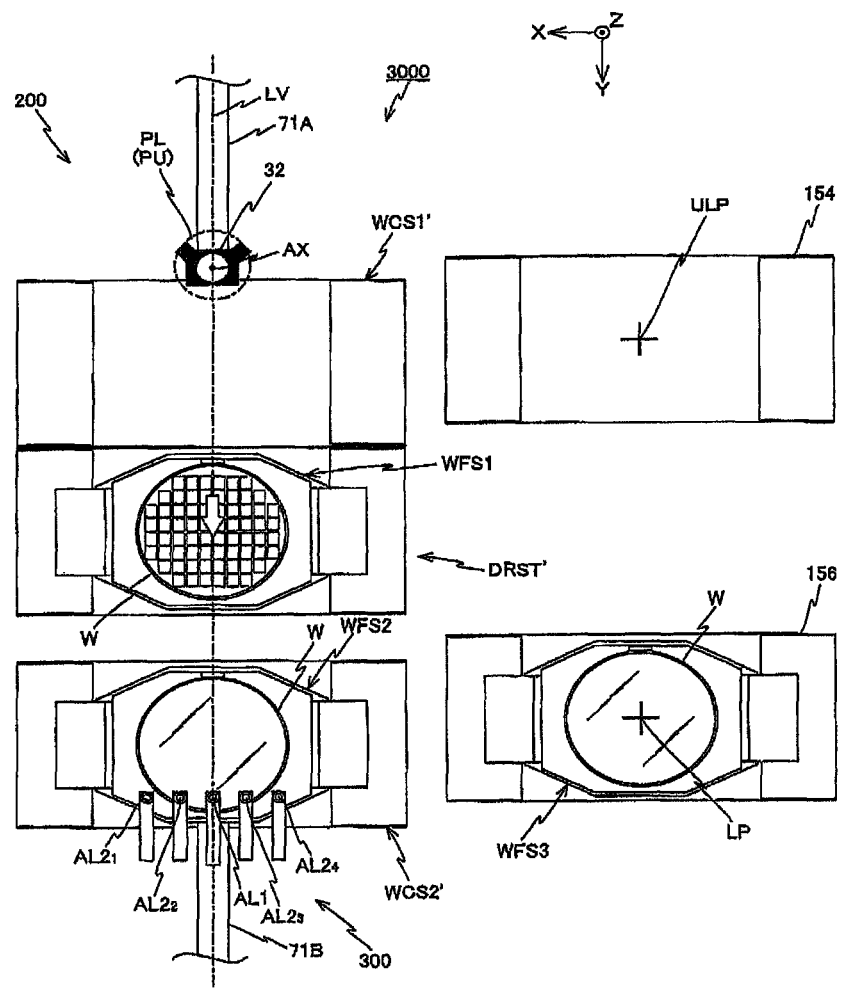
FIG. 63 is a view used to explain a parallel processing operation performed using the three fine movement stages WFS1, WFS2, and WFS3 (No. 2) in the exposure apparatus of the fourth embodiment.

And, when exposure has been completed, main controller 20 performs the delivery of the liquid immersion space area from fine movement stage WFS1 to movable blade BL and drives coarse movement stage WCS1' holding fine movement stage WFS1 further in the +Y direction so that coarse movement stage WCS1' comes almost into contact with relay stage DRST' waiting at a waiting position, as well as drive fine movement stage WFS1 in the +Y direction via fine movement stage drive systems 52B and 52C as is shown in by the outlined arrow in FIG. 63, and moves and mounts (a slide movement) fine movement stage WFS1 from coarse movement stage WCS1' to relay stage DRST'.

Figure 64:
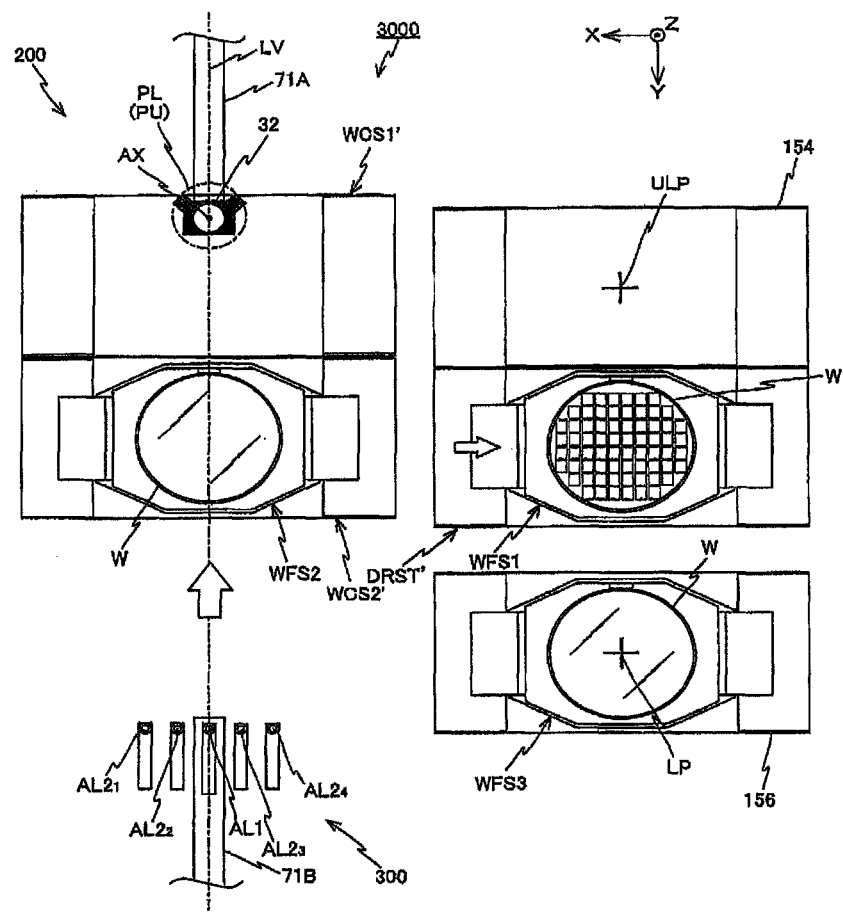
FIG. 64 is a view used to explain a parallel processing operation performed using the three fine movement stages WFS1, WFS2, and WFS3 (No. 3) in the exposure apparatus of the fourth embodiment.

Next, main controller 20 drives relay stage DST' which supports fine movement stage WFS1 in the −X direction as is shown by the outlined arrow in FIG. 64, and makes relay stage DST' face unload stage 154 in a state almost in contact. Further, immediately after this, main controller 20 drives coarse movement stage WCS2' supporting fine movement stage WFS2 in the −Y direction as is shown by the outlined arrow in FIG. 64, and makes coarse movement stage WCS2' come almost into contact with coarse movement stage WCS1'.

Figure 65:
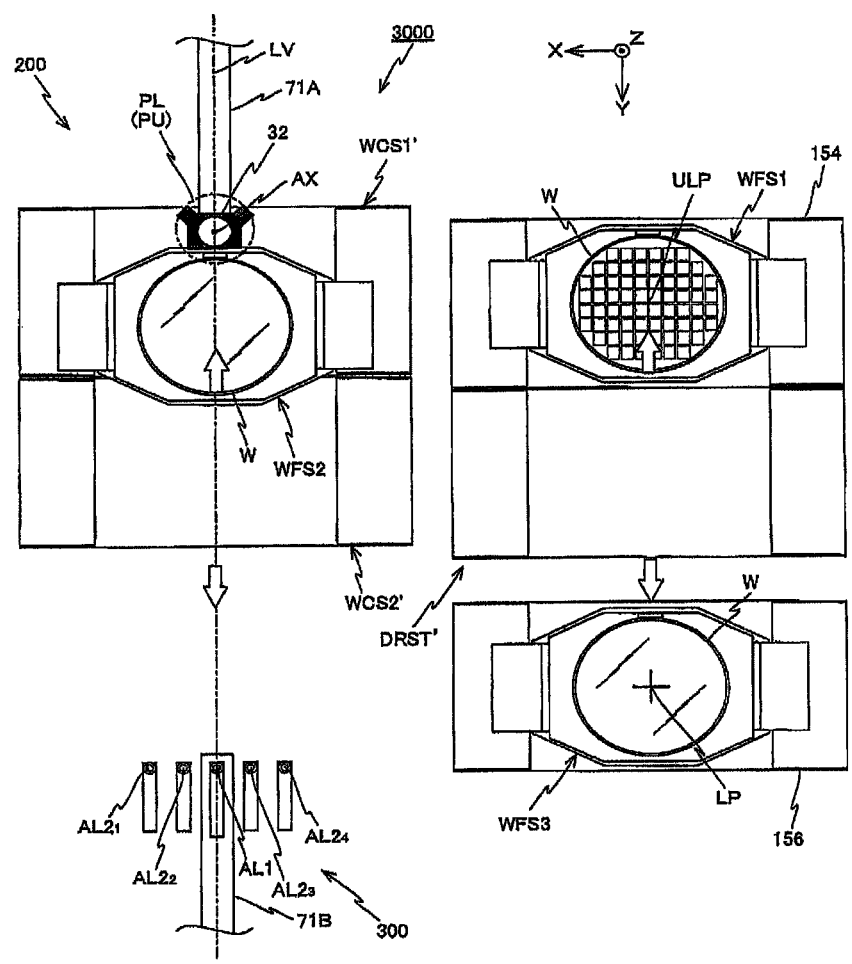
FIG. 65 is a view used to explain a parallel processing operation performed using the three fine movement stages WFS1, WFS2, and WFS3 (No. 4) in the exposure apparatus of the fourth embodiment.

Next, main controller 20 drives fine movement stage WFS2 in the −Y direction via fine movement stage drive systems 52A and 52B, as is shown by the outlined arrow in FIG. 65, and moves and mounts (a slide movement) fine movement stage WFS2 from coarse movement stage WCS2' onto coarse movement stage WCS1'. In parallel with this, main controller 20 drives fine movement stage WFS1 holding wafer W on which exposure has been performed in the −Y direction as is shown by the outlined arrow in FIG. 65 via fine movement stage drive systems 52C and 52D, and moves and mounts (a slide movement) fine movement stage WFS1 from relay stage DRST' onto unload stage 154.

Figure 66:
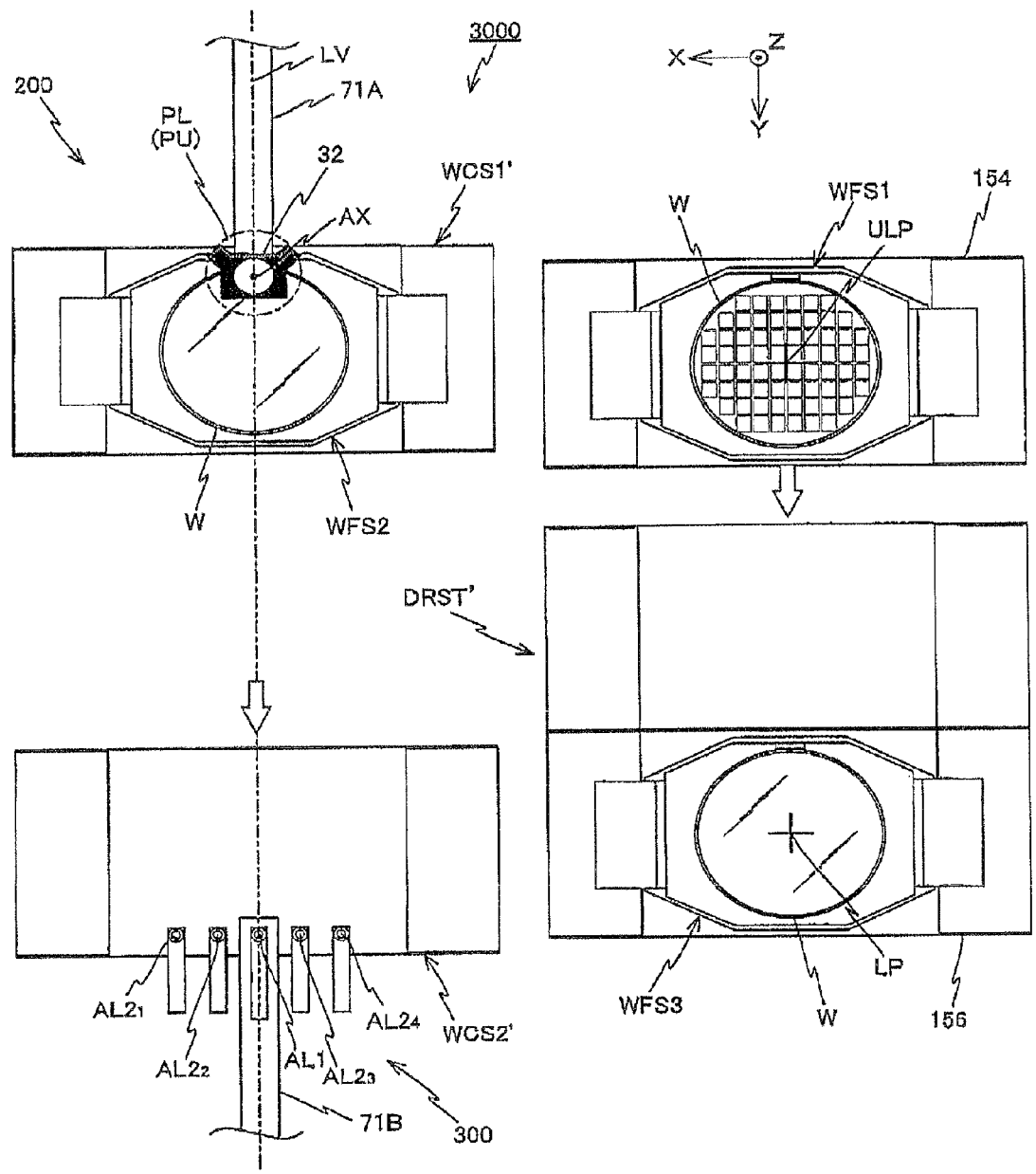
FIG. 66 is a view used to explain a parallel processing operation performed using the three fine movement stages WFS1, WFS2, and WFS3 (No. 5) in the exposure apparatus of the fourth embodiment.

Following the moving and mounting of fine movement stage WFS2 from coarse movement stage WCS2' to coarse movement stage WCS1', main controller 20 moves coarse movement stage WCS1' supporting fine movement stage WFS2 in the −Y direction, and delivers the liquid immersion space area held with tip lens 191 from movable blade BL to fine movement stage WFS2. The delivery of this liquid immersion space area (liquid Lq) is performed by reversing the procedure of the delivery of the liquid immersion space area from fine movement stage WFS1 to movable blade BL previously described. FIG. 66 shows a state immediately after this delivery of the liquid immersion area.

Then, as is shown by the outlined arrow in FIG. 66, main controller 20 drives relay stage DRST' in the +Y direction and makes relay stage DRST' face load stage 156, almost in a contact state. In parallel with this, main controller 20 drives coarse movement stage WCS2' in the +Y direction as is shown by the outlined arrow in FIG. 66, and moves coarse movement stage WCS2' to measurement station 300. At this point, fine movement stage WFS3 is still waiting, while holding a new wafer W on load table 156 (refer to FIG. 66).

Then, prior to the beginning of exposure, main controller 20 positions fine movement stage WFS2 at the position shown in FIG. 66, and then performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS2 and the like. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. In this exposure, fine movement stage WFS2 is returned to the −Y side once after the reticle alignment, and then exposure is performed in the order from shot areas on the +Y side on wafer W to the shot areas on the −Y side.

Figure 67:
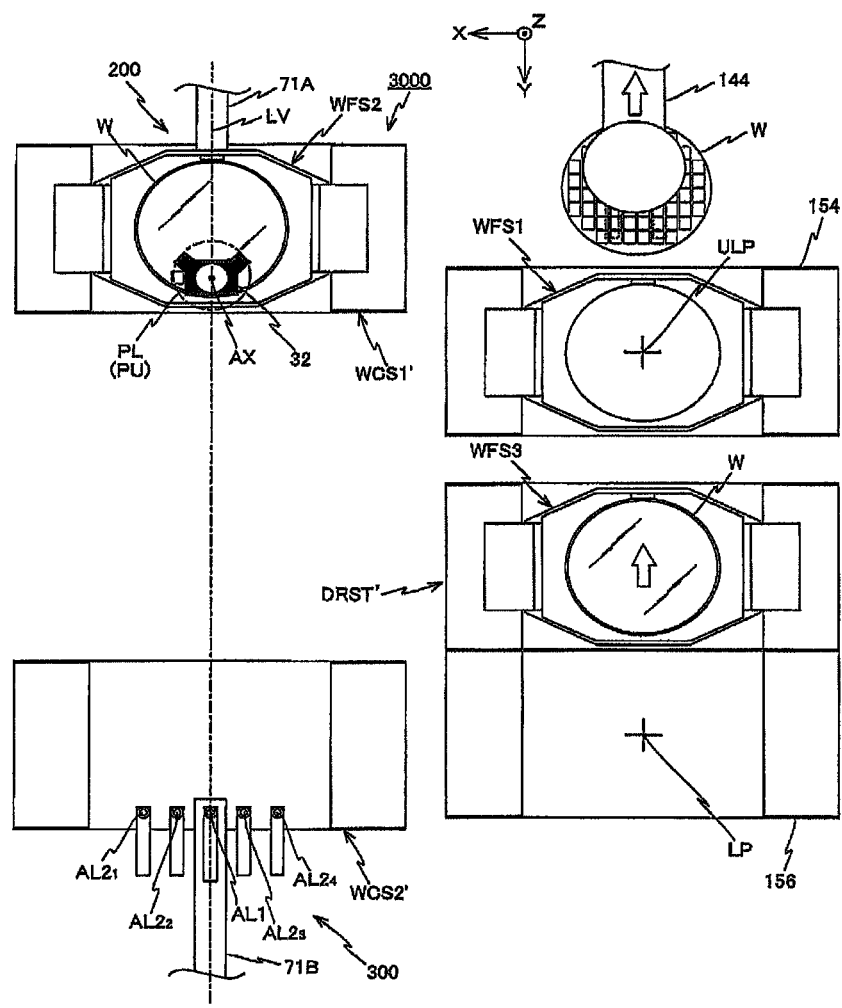
FIG. 67 is a view used to explain a parallel processing operation performed using the three fine movement stages WFS1, WFS2, and WFS3 (No. 6) in the exposure apparatus of the fourth embodiment.
Figure 68:
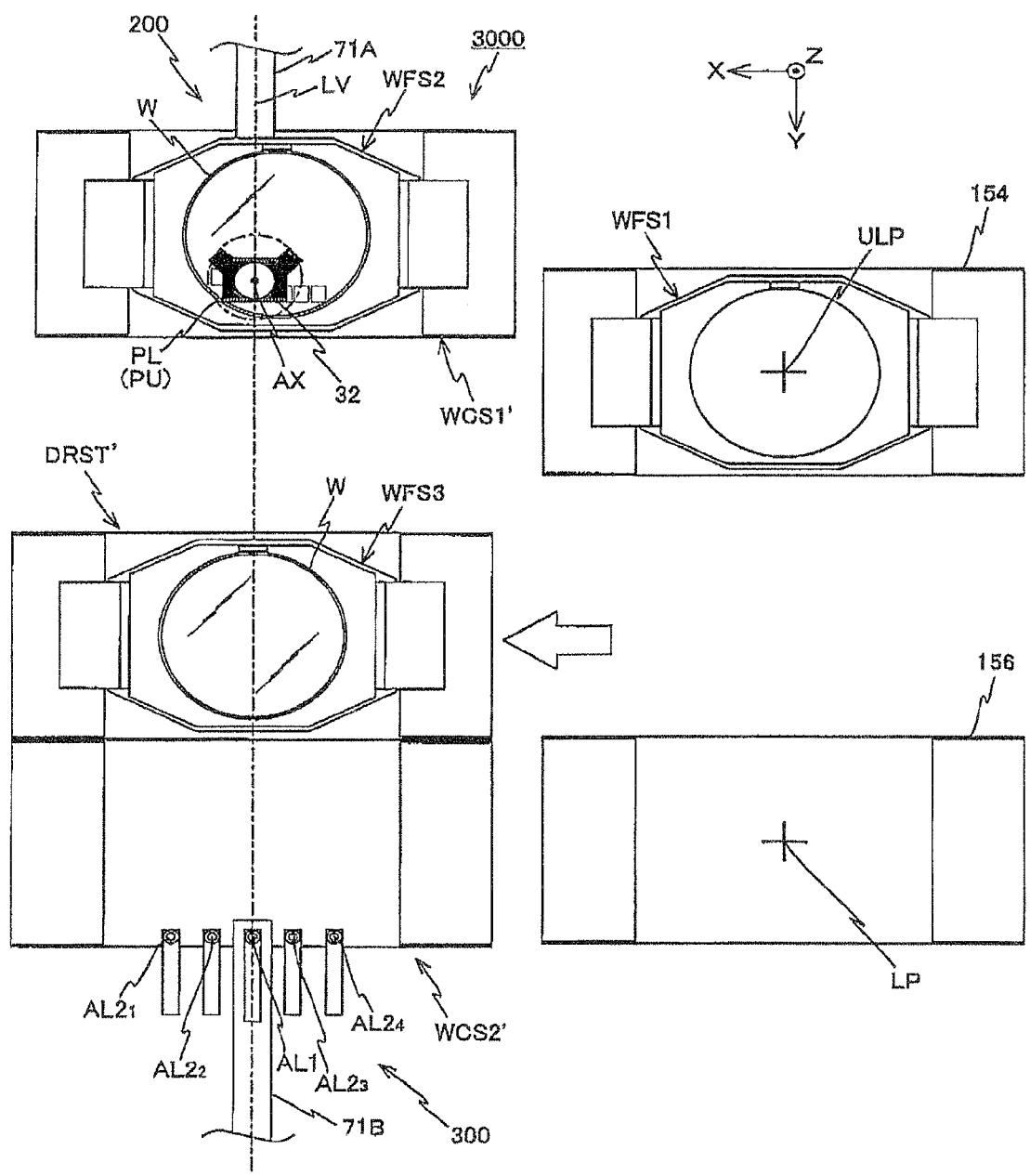
FIG. 68 is a view used to explain a parallel processing operation performed using the three fine movement stages WFS1, WFS2, and WFS3 (No. 7) in the exposure apparatus of the fourth embodiment.
Figure 69:
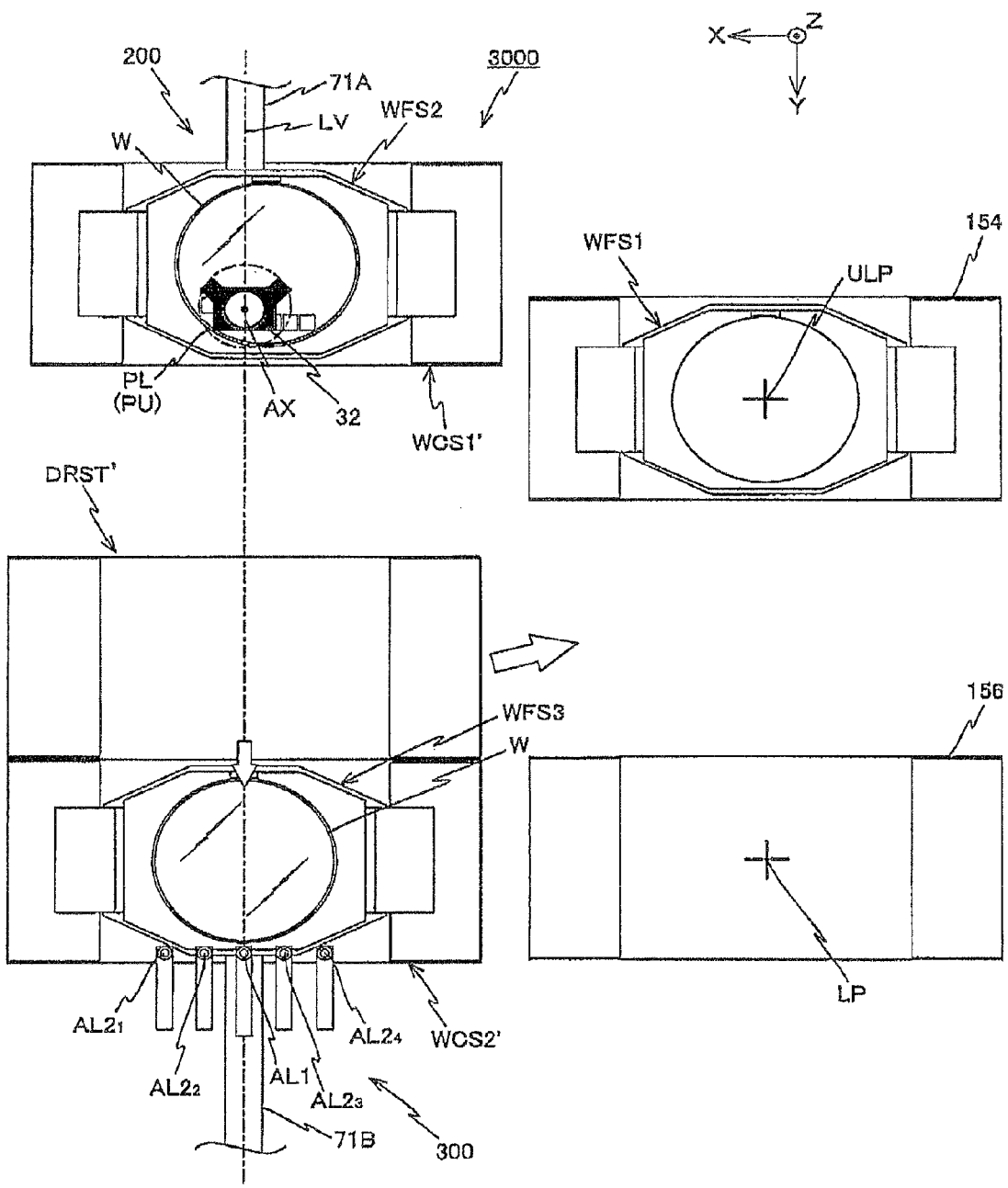
FIG. 69 is a view used to explain a parallel processing operation performed using the three fine movement stages WFS1, WFS2, and WFS3 (No. 8) in the exposure apparatus of the fourth embodiment.
Figure 70:
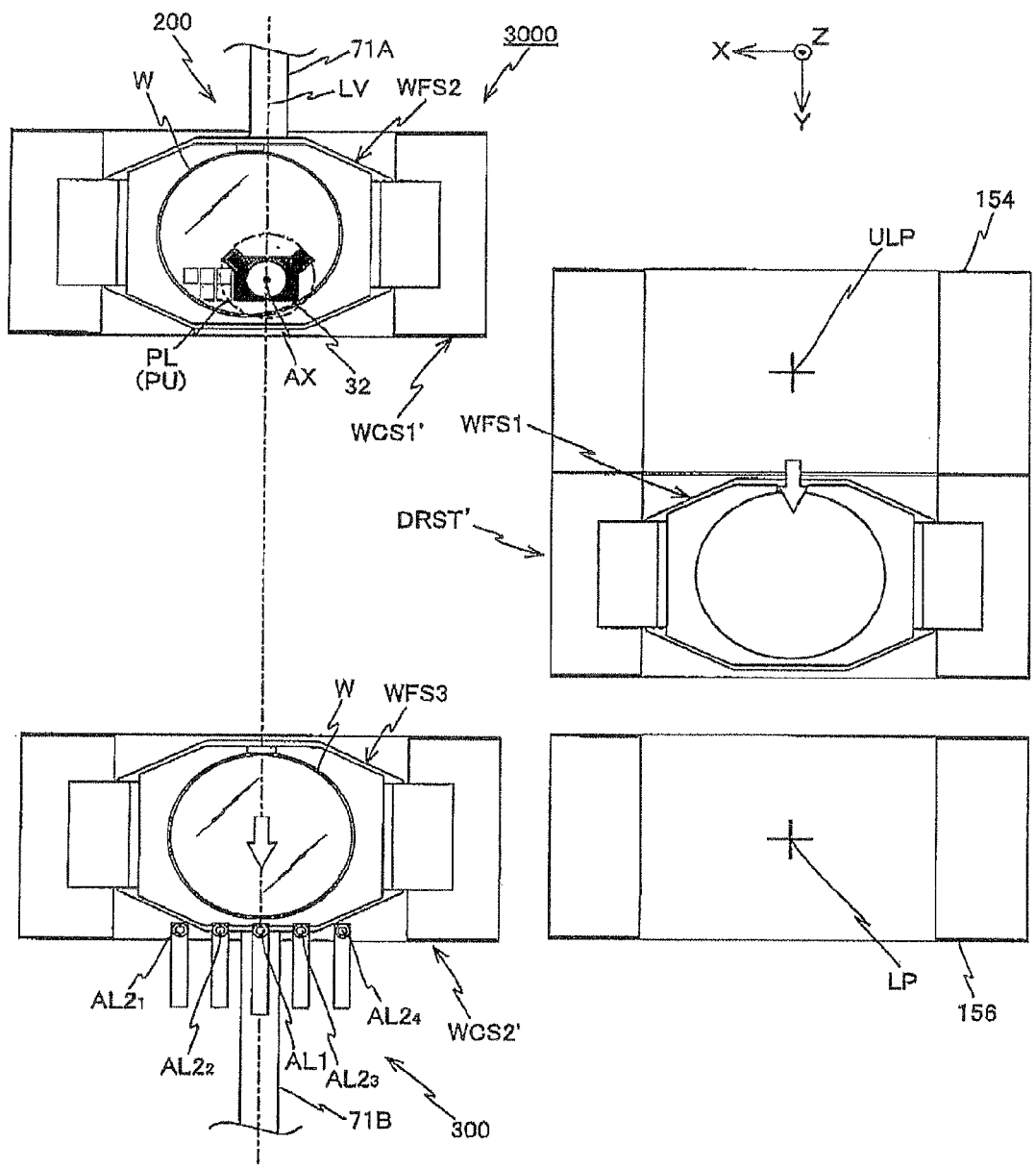
FIG. 70 is a view used to explain a parallel processing operation performed using the three fine movement stages WFS1, WFS2, and WFS3 (No. 9) in the exposure apparatus of the fourth embodiment.
Figure 71:
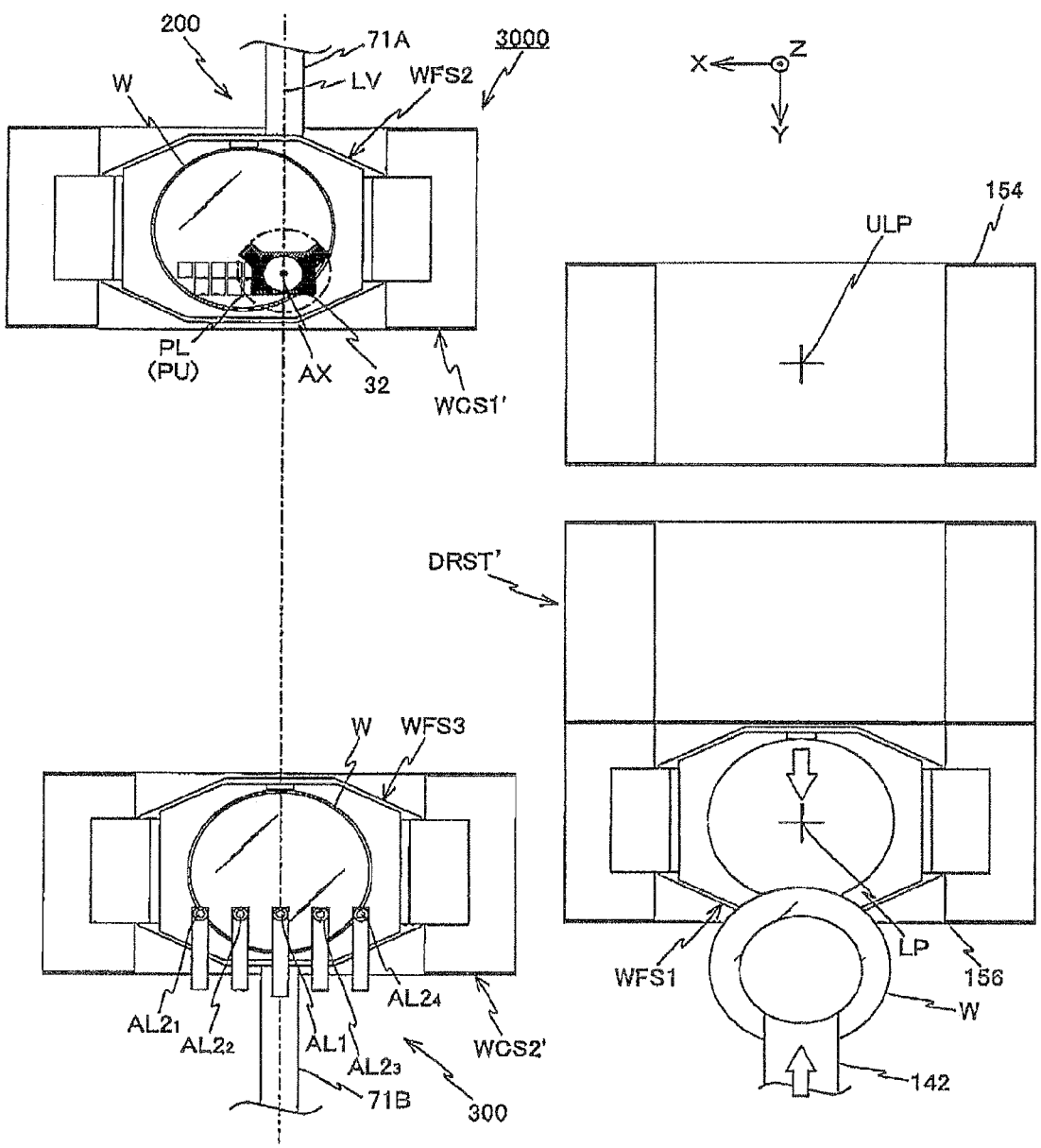
FIG. 71 is a view used to explain a parallel processing operation performed using the three fine movement stages WFS1, WFS2, and WFS3 (No. 10) in the exposure apparatus of the fourth embodiment.

Concurrently with the reticle alignment, and exposure described above, operations such as h. to m. described below are performed.

h. That is, based on instructions from main controller 20, wafer W which has undergone exposure is unloaded from fine movement stage WFS1 on unload stage 154 by unload arm 144 in the procedure previously described. FIG. 67 shows a state where unload arm 144 moves away from unload stage 154.

i. In parallel with unloading wafer W which has been exposed described above, main controller 20 moves and mounts fine movement stage WFS3 holding the new wafer W from load stage 156 onto relay stage DRST', as is shown in FIG. 67. Then, main controller 20 drives relay stage DRST' supporting fine movement stage WFS3 in the +X direction, as is shown by the outlined arrow in FIG. 68. This allows relay stage DRST to face coarse movement stage WCS2' in a state almost in contact, as is shown in FIG. 68. At this point in time, on fine movement stage WFS2, the exposure of wafer W is being continued.

j. Fine movement stage WFS3 holding a new wafer W is then driven and slid in the +Y direction by main controller 20, as is shown by the outlined arrow in FIG. 69, and then is moved and mounted from relay stage DRST' to coarse movement stage WCS2'. Then, main controller 20 drives relay stage DRST' in the direction of unload stage 154, as is shown by the outlined arrow in FIG. 69. This allows relay stage DRST' to face unload stage 154 in a state almost in contact, as is shown in FIG. 70.

k. Thereafter, detection of the second fiducial marks on fine movement stage WFS3 supported by coarse movement stage WCS2', alignment of wafer W on fine movement stage WFS3 and the like are performed in procedures similar to the ones previously described. Then, by main controller 20, array coordinates of each shot area on wafer W acquired from the wafer alignment are converted into array coordinates which are based on the second fiducial marks. In this case as well, position measurement of fine movement stage WFS3 on alignment is performed, using fine movement stage position measurement system 70B.

l. In parallel with operations such as the detection of the second fiducial marks on fine movement stage WFS3, alignment of wafer W on fine movement stage WFS3 and the like described above, main controller 20 moves and mounts fine movement stage WFS1 from unload stage 154 onto relay stage DRST' as is shown in FIG. 70, and then from relay stage DRST' to load stage 156, as is shown in FIG. 71.

m. Following this operation, a new (not yet exposed) wafer W is loaded onto fine movement stage WFS1 in the procedure previously described by main controller 20. At this point in time, exposure to wafer W held by fine movement stage WFS2 is being continued, as well as the alignment of wafer W held by fine movement stage WFS3.

After wafer W has been loaded on fine movement stage WFS1, a state similar to the case in FIG. 62, or more specifically, a state occurs in which the exposure described above is performed on wafer W held by fine movement stage WFS2 at exposure station 200, alignment is being performed on wafer W held by fine movement stage WFS3 which is at measurement station 300, and fine movement stage WFS1 is waiting while holding a new wafer W on load stage 156.

Hereinafter, a parallel processing as is previously described is repeatedly performed by main controller 20, sequentially using fine movement stages WFS1, WFS2, and WFS3, and an exposure processing to a plurality of wafer Ws is continuously performed.

As is described so far, according to exposure apparatus 3000 of the fourth embodiment, an equivalent effect can be obtained as in the third embodiment previously described. In this case, the delivery (moving and mounting) of the fine movement stage between coarse movement stage WCS1', coarse movement stage WCS2', and relay stage DRST' can be performed only by a slide movement of the fine movement stage in the Y-axis direction. Therefore, according to exposure apparatus 3000, the moving and mounting operation of the fine movement stage between the three stages described above is performed within a short time, which allows the next operation to be started swiftly, which as a consequence, allows the throughput to be improved.

Incidentally, in the fourth embodiment, the fine movement stage holding wafer W which has undergone exposure is delivered to unload stage 154 by relay stage DRST' which operates under the control of main controller 20, and another fine movement stage holding a new wafer W is received by relay stage DRST' from load stage 156. Accordingly, when focusing attention on the in and out of the fine movement stage with respect to relay stage DRST', it can also be said that wafer W is exchanged integrally with the fine movement stage.

In the fourth embodiment above, between two stages of coarse movement stages WCS1, WCS2, relay stage DRST', unload stage 154, and load stage 156, in the case the two stages are made to be in proximity so that fine movement stages WFS1, WFS2, or WFS3 can be delivered, both of the stages do not have to be extremely close together. The two stages can be distanced within a range where the fine movement stage is not tilted greatly (that is, the stator and the mover of the linear motor do not come into contact) when the fine movement stage is moved between the two stages.

Incidentally, in each of the first to fourth embodiments (hereinafter shortly referred to as each of the embodiments), instead of the Bernoulli chuck, for example, a chuck member and the like using a differential evacuation as in a vacuum preload type static gas bearing can be used, which can hold wafer W from above in a non-contact manner.

Further, in each of the embodiments above, in the case of using a Bernoulli chuck, a sensor measuring the gap between the wafer and the Bernoulli chuck does not necessarily have to be provided. Instead of measuring the gap, the gap can also be measured indirectly by measuring the pressure between the Bernoulli chuck and the object subject to holding (or the flow rate of the fluid blowing out from the Bernoulli chuck). Further, in order to cancel the shift and/or rotation of the wafer held by the Bernoulli chuck when the wafer is loaded, instead of moving the fine movement stage (wafer holder), or along with moving the fine movement stage, the Bernoulli chuck can also be moved.

Further, in each of the embodiments and the like described above, the wafer does not have to be held only by the Bernoulli chuck after the wafer has been detached from the wafer holder using the Bernoulli chuck, and together with the Bernoulli chuck, or instead of the Bernoulli chuck, the wafer can be held by a mechanical mechanism and the like. The point is, holding the wafer using the Bernoulli chuck only has to be just before delivering the wafer to the to the wafer holder, and immediately after the delivery from the wafer holder. Further, while the carrier apparatus which has the Bernoulli chuck was to have a robot arm, as well as this, a slider is also preferable.

Further, in each of the embodiments above, while the Bernoulli chuck assisted the suction holding operation of the wafer by blowing out pressurized gas from below when unloading the wafer from the wafer holder using the Bernoulli chuck, it is a matter of course that such an assistance is not a mandatory.

Further, the exposure apparatus in each of the embodiments above, especially the stage device, is not limited to the configuration described above, and other configurations can also be employed. The point is, any configuration can be employed as long as the position of the wafer holder can be measured by the so-called back surface measurement.

Incidentally, in each of the embodiments above, in the case of making the Bernoulli chuck and wafer W approach or move away from each other, at least one of a member in which the Bernoulli chuck is provided and a fine movement stage holding wafer W should be driven in a vertical direction. Further, also in the case of making the Bernoulli chuck and wafer W approach or move away from each other in a horizontal direction, at least one of the Bernoulli chuck and the fine movement stage should be driven.

Incidentally, in each of the embodiments described above, the case has been described where fine movement stage position measurement systems 70A and 70B are made entirely of, for example, glass, and are equipped with measurement arms 71A and 71B in which light can proceed inside. However, besides this, for example, at least only the part where each of the laser beams previously described proceed in the measurement arm has to be made of a solid member which can pass through light, and the other sections, for example, can be a member that does not transmit light, and can have a hollow structure. Further, as a measurement arm, for example, a light source or a photodetector can be built in the tip of the measurement arm, as long as a measurement beam can be irradiated from the section facing the grating. In this case, the measurement beam of the encoder does not have to proceed inside the measurement arm. Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path). Furthermore, the measurement arm need not have any particular shape.

Incidentally, in each of the embodiments described above, because measurement arms 71A and 71B are fixed to main frame BD integrally, torsion and the like may occur due to internal stress (including thermal stress) in measurement arms 71A and 71B, which may change the relative position between measurement arms 71A, and 71B, and main frame BD. Therefore, as countermeasures against such cases, the position of measurement arms 71A and 71B (a change in a relative position with respect to main frame BD, or a change of position with respect to a reference position) can be measured, and the position of measurement arms 71A and 71B can be finely adjusted, or the measurement results corrected, with actuators and the like.

Further, in each of the embodiments described above, while the case has been described where measurement arms 71A and 71B are integral with main frame BD, as well as this, measurement arms 71A and 71B and mainframe BD may be separated. In this case, a measurement device (for example, an encoder and/or an interferometer) which measures a position (or displacement) of measurement arms 71A and 71B with respect to main frame BD (or a reference position), and an actuator and the like to adjust a position of measurement arms 71A and 71B can be provided, and main controller 20 as well as other controllers can maintain a positional relation between main frame BD (and projection optical system PL) and measurement arms 71A and 71B at a predetermined relation (for example, constant), based on measurement results of the measurement device.

Further, a measurement system (sensor) to measure a variation in measurement arms 71A and 71B by an optical technique, a temperature sensor, a pressure sensor, an acceleration sensor for vibration measurement and the like can be provided in measurement arms 71A and 71B. Or, a distortion sensor (strain gauge) or a displacement sensor can be provided, so as to measure a variation in measurement arms 71A and 71B. And, by using the values obtained by these sensors, positional information obtained by fine movement stage position measurement system 70A and/or wafer stage position measurement system 68A, or fine movement stage position measurement system 70B and/or wafer stage position measurement system 68B can be corrected.

Further, in each of the embodiments described above, while the case has been described where measurement arm 71A (or 71B) is supported in a cantilevered state via one support member 72A (or 72B) from mainframe BD, as well as this, for example, measurement arm 71A (or 71B) can be supported by suspension from main frame BD via a U-shaped suspension section, including two suspension members which are arranged apart in the X-axis direction. In this case, it is desirable to set the distance between the two suspension members so that the fine movement stage can move in between the two suspension members.

Further, fine movement stage position measurement systems 70A and 703 do not always have to be equipped with a measurement arm, and will suffice as long as the systems have a head which is placed facing grating RG inside the space of coarse movement stages WCS1 and WCS2 and receives a diffraction light from grating RG of at least one measurement beam irradiated on grating RG, and can measure the positional information of fine movement stage WFS1 (or WFS2) at least within the KY plane, based on the output of the head.

Further, in each of the embodiments described above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. In the case two 2D heads are provided, detection points of the two heads can be arranged to be two points which are spaced equally apart in the X-axis direction on the grating, with the exposure position serving as the center.

Incidentally, fine movement stage position measurement systems 70A and 70B can measure positional information in directions of six degrees of freedom of the fine movement stage only by using encoder system 73, without being equipped with laser interferometer system 75. In this case, for example, an encoder which can measure positional information in at least one of the X-axis direction and the Y-axis direction, and the Z-axis direction can be used. As the encoder used in this case, a sensor head system for measuring variation disclosed in, for example, U.S. Pat. No. 7,561,280, can be used. And, for example, by irradiating measurement beams from a total of three encoders including an encoder (such as the sensor head system for measuring variation described above) which can measure positional information in the X-axis direction and the Z-axis direction and an encoder (such as the sensor head system for measuring variation described above) which can measure positional information in the Y-axis direction and the Z-axis direction, on three measurement points that are noncollinear, and receiving each of the return lights from grating RG, positional information of the movable body on which grating RG is provided can be measured in directions of six degrees of freedom. Further, the configuration of encoder system 73 is not limited to each of the embodiments described above, and is arbitrary. For example, a 3D head which can measure positional information in each of the X-axis, the Y-axis, and the Z-axis directions can be used.

Incidentally, in each of the embodiments described above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in such a case, grating RG can be fixed to or formed on an opaque member such as ceramics. Further, in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced. In this case, a protective member (a cover glass) can be provided on the surface of grating RG. Or, the hold wafer holder and grating RG can simply be held by a conventional fine movement stage. Further, the wafer holder can be made of a solid glass member, and grating RG can be placed on the upper surface (a wafer mounting surface) of the glass member.

Further, the drive mechanism of driving the fine movement stage with respect to the coarse movement stage is not limited to the mechanism described in the embodiment above. For example, in the embodiment, while the coil which drives the fine movement stage in the Y-axis direction also functioned as a coil which drives fine movement stage in the Z-axis direction, besides this, an actuator (linear motor) which drives the fine movement stage in the Y-axis direction and an actuator which drives the fine movement stage in the Z-axis direction, or more specifically, levitates the fine movement stage, can each be provided independently. In this case, because it is possible to make a constant levitation force act on the fine movement stage, the position of the fine movement stage in the Z-axis direction becomes stable.

Incidentally, in each of the embodiments described above, while fine movement stages WFS1 and WFS2 are supported in a noncontact manner by coarse movement stage WCS1 or WCS2 by the action of an electromagnetic force (the Lorentz force), besides this, for example, a vacuum preload type hydrostatic air bearings and the like can be arranged on fine movement stages WFS1 and WFS2 so that the stages are supported by levitation with respect to coarse movement stage WCS1 or WCS2. Further, in the embodiment above, while fine movement stages WFS1 and WFS2 could be driven in directions of all 6 degrees of freedom, the present invention is not limited to this, and fine movement stages WFS1 and WFS2 only needs to be able to move within a two-dimensional plane which is parallel to the XY plane. Further, fine movement stage drive systems 52A and 52B are not limited to the magnet moving type described above, and can also be a moving coil type as well. Furthermore, fine movement stages WFS1 and WFS2 can also be supported in contact with coarse movement stage WCS1 or WCS2. Accordingly, as the fine movement stage drive system which drives fine movement stages WFS1 and WFS2 with respect to coarse movement stage WCS1 or WCS2, for example, a rotary motor and, a ball screw (or a feed screw) can also be combined for use.

Incidentally, in each of the embodiments described above, while the case has been described where an alignment mark measurement (wafer alignment) was performed as an example of measurement to wafer W in measurement station 300, as well as this (or instead of this), a surface position measurement to measure a position the wafer W surface in an optical axis direction AX of projection optical system PL can be performed. In this case, a surface position measurement of the upper surface of fine movement stage holding a wafer can be performed simultaneously with the surface position measurement as is disclosed in, for example, U.S. Patent Application Publication No. 2008/0088843 specification, and focus leveling control of wafer W at the time of exposure can be performed, using the results.

Incidentally, in the exposure apparatus in each of the embodiments described above, when fine movement stages WFS1, WFS2, or WFS3 holding a newly loaded wafer W is delivered to coarse movement stage WCS2 (WCS2') from center table 130 or relay stage DRST' after the wafer exchange, in order to adjust positional shift and rotational error of the wafer, for example, three imaging devices to pick up an image of three places in the periphery of wafer W including a notch (a V-shaped notch, not shown), or a detection system to detect a mark (or a pattern) on the wafer, such as, for example, a plurality of microscopes equipped with a CCD and the like, can be provided.

Incidentally, the wafer used in the exposure apparatus of each of the embodiments above is not limited to the 450 mm wafer, and can be a wafer of a smaller size (such as a 300 mm wafer).

Further, in each of the embodiments described above, while the case has been described where the exposure apparatus is a liquid immersion type exposure apparatus, the present invention is not limited to this, and can also be employed in a dry type exposure apparatus that performs exposure of wafer W without liquid (water).

Incidentally, in each of the embodiments described above, while the case has been described where the exposure apparatus is a scanning stepper, the present invention is not limited to this, and can also be a static exposure apparatus such as a stepper. Further, the exposure apparatus can also be a reduction projection exposure apparatus by a step-and-stitch method that synthesizes a shot area and a shot area.

Further, the magnification of the projection optical system in the exposure apparatus in each of the embodiments described above is not only a reduction system, but also may be either an equal magnifying or a magnifying system, and projection optical system PL is not only a dioptric system, but also may be either a catoptric system or a catadioptric system, and in addition, the projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal, can also be used as vacuum ultraviolet.

Further, in each of the embodiments described above, illumination light IL of the exposure apparatus is not limited to the light having a wavelength equal to or more than 100 nm, and it is needless to say that the light having a wavelength less than 100 nm can be used. For example, the embodiments above can be applied to an EUV exposure apparatus that uses an EUV (Extreme Ultraviolet) light in a soft X-ray region (e.g., a wavelength range from 5 to 15 nm), or to an exposure apparatus that uses charged particle beams such as an electron beam or an ion beam.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as each of the embodiments above can be obtained by measuring the position of this stage using an encoder system and a laser interferometer system.

Further, as is disclosed in, for example, PCT International Publication No. 2001/035168, each of the embodiments above can also be applied to an exposure apparatus (lithography system) that forms line-and-space patterns on a wafer W by forming interference fringes on wafer W.

Moreover, as disclosed in, for example, U.S. Pat. No. 6,611,316, each of the embodiments above can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in each of the embodiments described above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, each of the embodiments above can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each of the embodiments described above, a highly integrated device can be produced with good productivity.

Incidentally, the disclosures of all publications, the PCT International Publications, the U.S. patent applications and the U.S. patents that are cited in the description so far related to exposure apparatuses and the like are each incorporated herein by reference.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An object exchange method in which a thin plate-shaped object is exchanged on a holding member, the method comprising:

positioning an unload member above the object which is mounted on the holding member, the unload member having a holding surface configured to hold the object from above in a non-contact manner;

relatively moving the unload member and the holding member in a vertical direction, and making the holding surface of the unload member approach a position which is a predetermined distance away from an upper surface of the object, the object being lifted toward the unload member by a lift member at the movement in the vertical direction; and making the unload member hold the object from above in a non-contact manner, and making the unload member holding the object and the holding member move apart.

2. The object exchange method according to claim 1 wherein when relatively moving the unload member and the holding member, a distance between the unload member and the upper surface of the object is detected using a sensor.

3. The object exchange method according to claim 1 wherein after the unload member holding the object and the holding member have moved apart, at least one of the unload member holding the object and the holding member moves within a horizontal plane, and the unload member holding the object and the holding member move apart from each other in the horizontal plane.

4. The object exchange method according to claim 1, wherein the unload member holding the object is moved apart from the holding member in an upward direction, and the method further comprises:

positioning another unload member which carries the object under the unload member and above the holding member, and delivering the object using the unload member to the another unload member, after the unload member and the holding member are moved apart.

5. The object exchange method according to claim 4 wherein the unload member makes the holding member release the holding of the object, and then the another unload member holds in a contact manner the object which has been held by the unload member in a non-contact manner.

6. The object exchange method according to claim 4, further comprising:

holding the object in a non-contact manner from above by a first carrier member, above the holding member;

driving the first carrier member holding the object downward until a lower surface of the object comes in contact with the holding member, and releasing a holding of the object by the first carrier member at a stage where the lower surface of the object comes in contact with the holding member; and moving the first carrier member apart from the holding member after the first carrier member releases the holding of the object.

7. The object exchange method according to claim 6, further comprising:

carrying the object to be positioned under the first carrier member and above the holding member, by a second carrier member, prior to the object being held by the first carrier member.

8. The object exchange method according to claim 7 wherein
the second carrier member is an identical member to the another unload member.

9. The object exchange method according to claim 6 wherein
the object is held by the first carrier member at a position away from above the holding member within a horizontal plane.

10. The object exchange method according to claim 6, the method further comprising:
measuring positional information of the object while the first carrier member is moving downward, before the lower surface of the object comes in contact with the holding member; and
adjusting a position of the holding member based on a measurement result of the positional information, prior to the lower surface of the object coming in contact with the holding member.

11. The object exchange method according to claim 6 wherein
the unload member is an identical member to the first carrier member.

12. An exposure method, comprising:
exchanging a thin plate-shaped object on the holding member by the object exchange method according to claim 6; and
exposing the object held by the holding member with an energy beam after the object has been exchanged, and forming a pattern on the object.

13. An exposure method in which an object is exposed with an energy beam, and a pattern is formed on the object, the method comprising:
positioning an unload member above the object which is mounted on a holding member, the unload member having a holding surface configured to hold the object from above in a non-contact manner;
relatively moving the unload member and the holding member in a vertical direction, and making the holding surface of the unload member approach a position which is a predetermined distance away from an upper surface of the object, the object being lifted toward the unload member by a lift member at the movement in the vertical direction; and
making the unload member hold the object from above in a non-contact manner, and making the unload member holding the object and the holding member move apart.

14. The exposure method according to claim 13 wherein
positional information of the holding member is measured by irradiating a measurement beam on a measurement plane of the holding member from a back surface side of the holding member at a time of exposure of the object, and receiving a return light of the measurement beam.

15. A device manufacturing method, including
exposing an object by the exposure method according to claim 13; and
developing the object which has been exposed.

16. A carrier system which carries a thin plate-shaped object, the system comprising:
a controller; and
a carrier apparatus comprising:
an unloading section having a holding surface configured to hold an object from above in a non-contact manner;
a holding member configured to hold the object; and
a lift member configured to lift the object toward the unloading section,
the controller being configured to (i) relatively drive the holding member and the unloading section within a predetermined plane parallel to a horizontal plane, (ii) position the unloading section above the object when the object is mounted on the holding member, (iii) relatively move the unloading section and the holding member in a vertical direction, and move the lift member in the vertical direction to lift the object toward the unloading section at the movement in the vertical direction, (iv) cause the holding surface of the unloading section to relatively approach a position which is a predetermined distance away from an upper surface of the object, (v) cause the unloading section to hold the object from above in a non-contact manner, and (vi) move the unloading section and the holding member move apart.

17. The carrier system according to claim 16 wherein
the unloading section includes a Bernoulli chuck which holds the object in a non-contact manner using a Bernoulli effect.

18. The carrier system according to claim 16 wherein
the carrier apparatus further comprises a first member and a second member, the first member being provided with the unloading section and relatively moving in a vertical direction with respect to the holding member, and the second member delivering and receiving the object to/from the first member and being relatively movable with respect to the holding member in a direction parallel to the predetermined plane.

19. The carrier system according to claim 16 wherein
the carrier apparatus further comprises a carrier member, the carrier member being provided with the unloading section and being relatively movable with respect to the holding member in the vertical direction and a direction parallel to the predetermined plane.

20. The carrier system according to claim 16 wherein
the carrier apparatus further includes a sensor which is provided in the unloading section, the sensor detecting a distance between the unloading section and the upper surface of the object when the unloading section and the holding member are relatively moved in a vertical direction, and the controller further causes the unloading section to approach a position of a predetermined distance from the upper surface of the object while detecting the distance with the sensor.

21. The carrier system according to claim 16 wherein
the controller relatively moves the unloading section holding the object and the holding member in a vertical direction and mounts the object on the holding member when the holding member is positioned at a first position within a predetermined plane.

22. The carrier system according to claim 21 wherein
the controller stops the carrier apparatus once a movement of at least one of the unloading section and the holding member which are moving during the relative movement before a lower surface of the object comes in contact with the holding member while a movement of the unloading section and the holding member in a vertical direction is performed,
the carrier apparatus further comprising:
a measurement system which is provided in the unloading section and measures positional information of the object, the measurement system measuring the positional information of the object; and an adjustment device which adjusts a position of at least one of the unloading section and the holding member based on measurement results of the positional information, before the lower surface of the object comes in contact with the holding member.

23. An exposure apparatus that exposes a thin plate-shaped object with an energy beam and forms a pattern on the object, the apparatus comprising:
- a carrier system according to claim 16;
- a movable body which is movable along the predetermined plane and holds a holding member relatively movable with respect to the movable body along the predetermined plane, the holding member having a measurement plane provided on a plane substantially parallel to the predetermined plane;
- a first measurement system which irradiates at least one first measurement beam on the measurement plane from below, and receives light of the first measurement beam from the measurement plane and measures positional information at least within the predetermined plane of the holding member; and
- a drive system which drives the holding member in one of an individual and integral manner with the movable body, based on the positional information measured by the first measurement system.

24. An exposure apparatus that exposes a thin plate-shaped object with an energy beam and forms a pattern on the object, the apparatus comprising:
- a carrier system comprising:
    - a controller; and
    - a carrier device comprising:
        - an unloading section having a holding surface configured to can hold an object from above in a non-contact manner;
        - a holding member configured to hold the object; and
        - a lift member configured to lift the object toward the unloading section,
    - the controller being configured to (i) relatively drive the holding member and the unloading section within a predetermined plane parallel to a horizontal plane, (ii) position the unloading section above the object when the object is mounted on the holding member, (iii) relatively move the unloading section and the holding member in a vertical direction, and move the lift member in the vertical direction to lift the object toward the unloading section at the movement in the vertical direction, (iv) cause the holding surface of the unloading section to relatively approach a position which is a predetermined distance away from an upper surface of the object, (v) cause the unloading section to hold the object from above in a non-contact manner, and (vi) move the unloading section and the holding member apart.

25. The exposure apparatus according to claim 24, further comprising:
- a first measurement system which measures positional information of the holding member by a back surface measurement at a time of exposure of the object.

26. The exposure apparatus according to claim 25 wherein the movable body has a space inside, and
the first measurement system has a head section which is placed inside the space of the movable body facing the measurement plane, irradiates at least one first measurement beam on the measurement plane from below, and receives light from the measurement plane of the first measurement beam.

27. A device manufacturing method, including
exposing an object using the exposure apparatus according to claim 24; and
developing the object which has been exposed.

* * * * *